(12) United States Patent
Chong et al.

(10) Patent No.: US 7,772,860 B2
(45) Date of Patent: *Aug. 10, 2010

(54) MASSIVELY PARALLEL INTERFACE FOR ELECTRONIC CIRCUIT

(75) Inventors: Fu Chiung Chong, Saratoga, CA (US); Sammy Mok, Cupertino, CA (US)

(73) Assignee: Nanonexus, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/175,393

(22) Filed: Jul. 17, 2008

(65) Prior Publication Data

US 2008/0297186 A1 Dec. 4, 2008

Related U.S. Application Data

(60) Division of application No. 11/555,603, filed on Nov. 1, 2006, now Pat. No. 7,403,029, which is a continuation of application No. 11/327,728, filed on Jan. 5, 2006, now Pat. No. 7,138,818, which is a continuation of application No. 10/918,511, filed on Aug. 12, 2004, now Pat. No. 7,009,412, which is a division of application No. 09/979,551, filed as application No. PCT/US00/14768 on May 26, 2000, now Pat. No. 6,812,718.

(60) Provisional application No. 60/136,637, filed on May 27, 1999.

(51) Int. Cl.
*G01R 31/02* (2006.01)

(52) U.S. Cl. ..................................... 324/754

(58) Field of Classification Search ........................ None
See application file for complete search history.

(56) References Cited

U.S. PATENT DOCUMENTS 3,806,800 A 4/1974 Bove et al.

(Continued)

FOREIGN PATENT DOCUMENTS

AU 5964196 A 12/1996

(Continued)

OTHER PUBLICATIONS

Advanced Technology Program, Project Brief-98-06-0025, "Membrane Probes for Wafer, Package and Substrate Testing," Microelectronics Manufacturing Infrastructure, 2 pages, Oct. 1998.

(Continued)

*Primary Examiner*—Jermele M Hollington
(74) *Attorney, Agent, or Firm*—Michael A. Glenn; Glenn Patent Group

(57) ABSTRACT

Several embodiments of massively parallel interface structures are disclosed, which may be used in a wide variety of permanent or temporary applications, such as for interconnecting integrated circuits (ICs) to test and burn-in equipment, for interconnecting modules within electronic devices, for interconnecting computers and other peripheral devices within a network, or for interconnecting other electronic circuitry. Preferred embodiments of the massively parallel interface structures provide massively parallel integrated circuit test assemblies. The massively parallel interface structures preferably use one or more substrates to establish connections between one or more integrated circuits on a semiconductor wafer, and one or more test modules. One or more layers on the intermediate substrates preferably include MEMS and/or thin-film fabricated spring probes. The parallel interface assemblies provide tight signal pad pitch and compliance, and preferably enable the parallel testing or burn-in of multiple ICs, using commercial wafer probing equipment. In some preferred embodiments, the parallel interface assembly structures include separable standard electrical connector components, which reduces assembly manufacturing cost and manufacturing time. These structures and assemblies enable high speed testing in wafer form.

16 Claims, 24 Drawing Sheets

U.S. PATENT DOCUMENTS

| | | |
|---|---|---|
| 3,806,801 A | 4/1974 | Bove |
| 3,810,017 A | 5/1974 | Wiesler et al. |
| 3,835,381 A | 9/1974 | Garretson et al. |
| 3,842,189 A | 10/1974 | Southgate |
| 3,856,647 A | 12/1974 | Blachman |
| 3,939,414 A | 2/1976 | Roch |
| 4,000,045 A | 12/1976 | Rotzow |
| 4,035,046 A | 7/1977 | Kloth |
| 4,038,599 A | 7/1977 | Bove et al. |
| 4,177,425 A | 12/1979 | Lenz |
| 4,195,259 A | 3/1980 | Reid et al. |
| 4,201,393 A | 5/1980 | Kawashima et al. |
| 4,214,201 A | 7/1980 | Kern |
| 4,320,438 A | 3/1982 | Ibrahim et al. |
| 4,362,991 A | 12/1982 | Carbine |
| 4,416,759 A | 11/1983 | Harra |
| 4,423,376 A | 12/1983 | Byrnes et al. |
| 4,423,401 A | 12/1983 | Mueller |
| 4,436,602 A | 3/1984 | Harra |
| 4,480,223 A | 10/1984 | Aigo |
| 4,508,612 A | 4/1985 | Blackwell et al. |
| 4,518,910 A | 5/1985 | Hottenrott et al. |
| 4,522,893 A | 6/1985 | Bohlen et al. |
| 4,548,451 A | 10/1985 | Benarr et al. |
| 4,567,432 A | 1/1986 | Boul et al. |
| 4,599,559 A | 7/1986 | Evans |
| 4,622,514 A | 11/1986 | Lewis |
| 4,636,722 A | 1/1987 | Ardezzone |
| 4,647,852 A | 3/1987 | Smith et al. |
| 4,661,233 A | 4/1987 | Glasser |
| 4,667,154 A | 5/1987 | Allerton et al. |
| 4,686,464 A | 8/1987 | Elsasser et al. |
| 4,716,500 A | 12/1987 | Payne |
| 4,719,417 A | 1/1988 | Evans |
| 4,724,377 A | 2/1988 | Maelzer et al. |
| 4,758,927 A | 7/1988 | Berg |
| 4,764,723 A | 8/1988 | Strid |
| 4,816,754 A | 3/1989 | Buechele et al. |
| 4,834,855 A | 5/1989 | Bloomquist et al. |
| 4,837,622 A | 6/1989 | Whann et al. |
| 4,908,571 A | 3/1990 | Stoehr |
| 4,924,589 A | 5/1990 | Leedy |
| 4,933,045 A | 6/1990 | DiStefano et al. |
| 4,942,076 A | 7/1990 | Panicker et al. |
| 4,956,923 A | 9/1990 | Pettingell et al. |
| 4,965,865 A | 10/1990 | Trenary |
| 4,970,106 A | 11/1990 | DiStefano et al. |
| 4,973,903 A | 11/1990 | Schemmel |
| 4,975,638 A | 12/1990 | Evans et al. |
| 5,032,896 A | 7/1991 | Little et al. |
| 5,055,778 A | 10/1991 | Okubo et al. |
| 5,070,297 A | 12/1991 | Kwon et al. |
| 5,084,672 A | 1/1992 | Ikeuchi et al. |
| 5,103,557 A | 4/1992 | Leedy |
| 5,109,596 A | 5/1992 | Driller et al. |
| 5,121,298 A | 6/1992 | Sarma et al. |
| 5,144,228 A | 9/1992 | Sorna et al. |
| 5,148,103 A | 9/1992 | Pasiecznik, Jr. |
| 5,148,265 A | 9/1992 | Khandros et al. |
| 5,148,266 A | 9/1992 | Khandros et al. |
| 5,152,695 A | 10/1992 | Grabbe et al. |
| 5,154,810 A | 10/1992 | Kamerling et al. |
| 5,166,774 A | 11/1992 | Benerji et al. |
| 5,189,363 A | 2/1993 | Bregman et al. |
| 5,191,708 A | 3/1993 | Kasukabe et al. |
| 5,208,531 A | 5/1993 | Aton |
| 5,210,485 A | 5/1993 | Kreiger et al. |
| 5,214,375 A | 5/1993 | Ikeuchi et al. |
| 5,225,037 A | 7/1993 | Elder et al. |
| 5,227,718 A | 7/1993 | Stowers et al. |
| 5,240,583 A | 8/1993 | Ahonen |
| 5,255,079 A | 10/1993 | Kageyama |
| 5,258,648 A | 11/1993 | Lin |
| 5,278,442 A | 1/1994 | Prinz et al. |
| 5,280,139 A | 1/1994 | Suppelsa et al. |
| 5,313,157 A | 5/1994 | Pasiecznik, Jr. |
| 5,326,428 A | 7/1994 | Farnworth et al. |
| 5,347,159 A | 9/1994 | Khandros et al. |
| 5,352,266 A | 10/1994 | Erb et al. |
| 5,354,205 A | 10/1994 | Feigenbaum |
| 5,367,764 A | 11/1994 | DiStefano et al. |
| 5,373,627 A | 12/1994 | Grebe |
| 5,385,477 A | 1/1995 | Vaynkof et al. |
| 5,395,253 A | 3/1995 | Crumly |
| 5,412,866 A | 5/1995 | Woith et al. |
| 5,416,429 A | 5/1995 | McQuade et al. |
| 5,433,797 A | 7/1995 | Erb et al. |
| 5,440,241 A | 8/1995 | King et al. |
| 5,473,254 A | 12/1995 | Asar |
| 5,476,211 A | 12/1995 | Khandros |
| 5,489,852 A | 2/1996 | Gomez |
| 5,521,518 A | 5/1996 | Higgins |
| 5,521,523 A | 5/1996 | Kimura et al. |
| 5,523,697 A | 6/1996 | Farnworth et al. |
| 5,530,371 A | 6/1996 | Perry et al. |
| 5,532,612 A | 7/1996 | Liang |
| 5,534,784 A * | 7/1996 | Lum et al. .................. 324/757 |
| 5,546,012 A | 8/1996 | Perry et al. |
| 5,555,422 A | 9/1996 | Nakano |
| 5,558,928 A | 9/1996 | DiStefano et al. |
| 5,563,521 A | 10/1996 | Crumbly |
| 5,568,054 A | 10/1996 | Iino et al. |
| 5,570,032 A | 10/1996 | Atkins et al. |
| 5,600,257 A | 2/1997 | Leas et al. |
| 5,613,861 A | 3/1997 | Smith et al. |
| 5,621,333 A | 4/1997 | Long et al. |
| 5,621,373 A | 4/1997 | McCormick |
| 5,629,631 A | 5/1997 | Perry et al. |
| 5,631,571 A | 5/1997 | Spaziani et al. |
| 5,635,846 A | 6/1997 | Beaman et al. |
| 5,656,138 A | 8/1997 | Scobey et al. |
| 5,657,394 A | 8/1997 | Schwartz et al. |
| 5,663,596 A | 9/1997 | Little |
| 5,665,648 A | 9/1997 | Little |
| 5,694,050 A | 12/1997 | Noguchi |
| 5,703,494 A | 12/1997 | Sano |
| 5,707,575 A | 1/1998 | Litt et al. |
| 5,744,283 A | 4/1998 | Spierings et al. |
| 5,756,021 A | 5/1998 | Hedrick et al. |
| 5,763,941 A | 6/1998 | Flejstad |
| 5,764,070 A | 6/1998 | Pedder |
| 5,772,451 A | 6/1998 | Dozier, II et al. |
| 5,786,701 A | 7/1998 | Pedder |
| 5,798,027 A | 8/1998 | Lefebvre et al. |
| 5,800,184 A | 9/1998 | Lopergolo et al. |
| 5,801,441 A | 9/1998 | Smith et al. |
| 5,806,181 A | 9/1998 | Khandros et al. |
| 5,820,014 A | 10/1998 | Dozier, II et al. |
| 5,821,763 A | 10/1998 | Beaman et al. |
| 5,821,764 A | 10/1998 | Slocum et al. |
| 5,828,226 A * | 10/1998 | Higgins et al. .............. 324/762 |
| D401,250 S | 11/1998 | Tudhope |
| D401,251 S | 11/1998 | Tudhope |
| D401,252 S | 11/1998 | Tudhope |
| 5,829,128 A | 11/1998 | Eldridge et al. |
| 5,830,327 A | 11/1998 | Kolenkow |
| 5,832,598 A | 11/1998 | Greenman et al. |
| 5,832,601 A | 11/1998 | Eldridge et al. |
| D403,002 S | 12/1998 | Tudhope |
| D403,334 S | 12/1998 | Tudhope |
| 5,844,421 A | 12/1998 | Lee et al. |
| 5,847,572 A | 12/1998 | Iwasaki et al. |
| 5,848,685 A | 12/1998 | Smith et al. |
| 5,852,871 A | 12/1998 | Khandros |

| | | | | | | |
|---|---|---|---|---|---|---|
| 5,864,946 | A | 2/1999 | Eldridge et al. | 6,184,699 B1 | 2/2001 | Smith et al. |
| 5,869,974 | A | 2/1999 | Akram et al. | 6,190,513 B1 | 2/2001 | Forster |
| 5,878,486 | A | 3/1999 | Eldridge et al. | 6,192,982 B1 | 2/2001 | Divis et al. |
| 5,884,395 | A | 3/1999 | Dabrowiecki et al. | 6,203,331 B1 | 3/2001 | McHugh et al. |
| 5,884,398 | A | 3/1999 | Eldridge et al. | 6,204,674 B1 | 3/2001 | Dabrowiecki et al. |
| 5,886,535 | A | 3/1999 | Budnaitis et al. | 6,213,789 B1 | 4/2001 | Chua et al. |
| 5,896,038 | A | 4/1999 | Budnaitis et al. | 6,215,320 B1 | 4/2001 | Parrish |
| 5,897,326 | A | 4/1999 | Eldridge et al. | 6,215,321 B1 | 4/2001 | Nakata |
| 5,900,738 | A | 5/1999 | Khandros et al. | 6,218,033 B1 | 4/2001 | Cao et al. |
| 5,905,305 | A | 5/1999 | Fogal et al. | 6,218,910 B1 | 4/2001 | Miller |
| 5,912,046 | A | 6/1999 | Eldridge et al. | 6,232,143 B1 | 5/2001 | Maddix et al. |
| 5,914,218 | A | 6/1999 | Smith et al. | 6,245,444 B1 | 6/2001 | Marcus et al. |
| 5,917,707 | A | 6/1999 | Khandros et al. | 6,246,247 B1 | 6/2001 | Eldridge et al. |
| 5,926,951 | A | 7/1999 | Khandros et al. | 6,255,126 B1 | 7/2001 | Mathieu et al. |
| 5,944,537 | A | 8/1999 | Smith et al. | 6,264,477 B1 | 7/2001 | Smith et al. |
| 5,968,327 | A | 10/1999 | Kobayashi | 6,265,888 B1 | 7/2001 | Hsu |
| 5,973,504 | A | 10/1999 | Chong et al. | 6,274,823 B1 | 8/2001 | Khandros et al. |
| 5,974,662 | A | 11/1999 | Eldridge et al. | 6,277,249 B1 | 8/2001 | Gopalraja et al. |
| 5,977,787 | A | 11/1999 | Das et al. | 6,281,592 B1 | 8/2001 | Murayama |
| 5,979,892 | A | 11/1999 | Smith | 6,285,563 B1 | 9/2001 | Nelson et al. |
| 5,983,493 | A | 11/1999 | Eldridge et al. | 6,288,560 B1 | 9/2001 | Wohlfarth |
| 5,993,616 | A | 11/1999 | Suwabe et al. | 6,290,510 B1 | 9/2001 | Fork et al. |
| 5,994,152 | A | 11/1999 | Khandros et al. | 6,292,003 B1 | 9/2001 | Fredrickson et al. |
| 5,994,222 | A | 11/1999 | Smith et al. | 6,292,007 B1 | 9/2001 | Potter |
| 5,994,781 | A | 11/1999 | Smith | 6,300,783 B1 | 10/2001 | Okubo et al. |
| 5,998,228 | A | 12/1999 | Eldridge et al. | 6,306,265 B1 | 10/2001 | Fu et al. |
| 5,998,864 | A | 12/1999 | Khandros et al. | 6,329,713 B1 | 12/2001 | Farquhar et al. |
| 6,001,671 | A | 12/1999 | Fjelstad | 6,336,269 B1 | 1/2002 | Eldridge et al. |
| 6,002,168 | A | 12/1999 | Bellaar et al. | 6,340,320 B1 | 1/2002 | Ogawa |
| 6,007,349 | A | 12/1999 | Distefano et al. | 6,347,947 B1 | 2/2002 | Ong |
| 6,012,224 | A | 1/2000 | DiStefano et al. | 6,351,133 B1 | 2/2002 | Jones et al. |
| 6,014,032 | A | 1/2000 | Maddix et al. | 6,352,454 B1 | 3/2002 | Kim et al. |
| 6,020,220 | A | 2/2000 | Gilleo et al. | 6,356,098 B1 | 3/2002 | Akram et al. |
| 6,023,103 | A | 2/2000 | Chang et al. | 6,358,376 B1 | 3/2002 | Wang et al. |
| 6,028,437 | A | 2/2000 | Potter | 6,361,331 B2 | 3/2002 | Fork et al. |
| 6,029,344 | A | 2/2000 | Khandros et al. | 6,396,677 B1 | 5/2002 | Chua et al. |
| 6,030,856 | A | 2/2000 | DiStefano et al. | 6,398,929 B1 | 6/2002 | Chiang et al. |
| 6,032,356 | A | 3/2000 | Eldridge et al. | 6,419,500 B1 | 7/2002 | Kister |
| 6,033,935 | A | 3/2000 | Dozier, II et al. | 6,424,166 B1 | 7/2002 | Henry et al. |
| 6,042,712 | A | 3/2000 | Mathieu | 6,425,988 B1 | 7/2002 | Montcalm et al. |
| 6,043,563 | A | 3/2000 | Eldridge et al. | 6,426,686 B1 | 7/2002 | Douriet et al. |
| 6,044,548 | A | 4/2000 | Distefano et al. | 6,428,673 B1 | 8/2002 | Ritzdorf et al. |
| 6,045,395 | A | 4/2000 | Saito | 6,429,671 B1 | 8/2002 | Duckworth et al. |
| 6,045,396 | A | 4/2000 | Tighe | 6,439,898 B2 | 8/2002 | Chua et al. |
| 6,045,655 | A | 4/2000 | DiStefano et al. | 6,476,626 B2 | 11/2002 | Aldaz et al. |
| 6,046,076 | A | 4/2000 | Mitchell et al. | 6,483,328 B1 | 11/2002 | Eldridge et al. |
| 6,049,972 | A | 4/2000 | Link et al. | 6,489,795 B1 | 12/2002 | Klele et al. |
| 6,049,976 | A | 4/2000 | Khandros | 6,497,799 B1 | 12/2002 | McLeod |
| 6,050,829 | A | 4/2000 | Eldridge et al. | 6,501,343 B2 | 12/2002 | Miller |
| 6,054,337 | A | 4/2000 | Solberg | 6,509,751 B1 | 1/2003 | Mathieu et al. |
| 6,054,756 | A | 4/2000 | DiStefano et al. | 6,520,778 B1 | 2/2003 | Eldridge et al. |
| 6,060,891 | A | 5/2000 | Hembree et al. | 6,525,555 B1 | 2/2003 | Khandros et al. |
| 6,063,648 | A | 5/2000 | Beroz et al. | 6,528,350 B2 | 3/2003 | Fork |
| 6,064,213 | A | 5/2000 | Khandros et al. | 6,528,984 B2 | 3/2003 | Beaman et al. |
| 6,075,289 | A | 6/2000 | Distefano | 6,534,856 B1 | 3/2003 | Dozier, II et al. |
| 6,078,186 | A | 6/2000 | Hembree et al. | 6,544,814 B1 | 4/2003 | Yasunaga et al. |
| 6,080,603 | A | 6/2000 | Distefano et al. | 6,586,956 B2 | 7/2003 | Aldaz et al. |
| 6,080,605 | A | 6/2000 | Distefano et al. | 6,600,334 B1 | 7/2003 | Hembree et al. |
| 6,080,932 | A | 6/2000 | Smith et al. | 6,616,966 B2 | 9/2003 | Mathieu et al. |
| 6,081,035 | A | 6/2000 | Warner et al. | 6,624,648 B2 | 9/2003 | Eldridge et al. |
| 6,090,261 | A | 7/2000 | Mathieu | 6,640,415 B2 | 11/2003 | Eslamy et al. |
| 6,091,256 | A | 7/2000 | Long et al. | 6,645,257 B1 | 11/2003 | Schacht |
| 6,110,823 | A | 8/2000 | Eldridge et al. | 6,651,325 B2 | 11/2003 | Lee et al. |
| 6,114,864 | A | 9/2000 | Soejima et al. | 6,684,499 B2 | 2/2004 | Romano et al. |
| 6,117,694 | A | 9/2000 | Smith et al. | 6,734,688 B1 | 5/2004 | Castellano et al. |
| 6,118,894 | A | 9/2000 | Schwartz et al. | 6,741,085 B1 | 5/2004 | Khandros et al. |
| 6,137,297 | A | 10/2000 | McNair et al. | 6,751,850 B2 | 6/2004 | Hu |
| 6,147,876 | A | 11/2000 | Yamaguchi et al. | 6,791,171 B2 * | 9/2004 | Mok et al. .................. 257/678 |
| 6,150,186 | A | 11/2000 | Chen et al. | 6,799,976 B1 | 10/2004 | Mok |
| 6,169,411 | B1 | 1/2001 | Johnson | 6,812,718 B1 * | 11/2004 | Chong et al. ................ 324/754 |
| 6,183,267 | B1 | 2/2001 | Marcus et al. | 6,815,961 B2 | 11/2004 | Mok et al. |
| 6,184,053 | B1 | 2/2001 | Eldridge et al. | 6,827,584 B2 | 12/2004 | Mathieu et al. |
| 6,184,065 | B1 | 2/2001 | Smith et al. | 6,844,214 B1 | 1/2005 | Mei et al. |

| | | | |
|---|---|---|---|
| 6,847,218 B1 | 1/2005 | Nulty et al. | |
| 6,856,150 B2 | 2/2005 | Sporck et al. | |
| 6,856,225 B1 | 2/2005 | Chua et al. | |
| 6,888,362 B2 | 5/2005 | Eldridge et al. | |
| 6,888,364 B2* | 5/2005 | Cram | 324/762 |
| 6,917,525 B2 | 7/2005 | Mok et al. | |
| 6,920,689 B2 | 7/2005 | Khandros et al. | |
| 7,009,412 B2* | 3/2006 | Chong et al. | 324/754 |
| 7,048,548 B2 | 5/2006 | Mathieu et al. | |
| 7,116,119 B2 | 10/2006 | Sporck et al. | |
| 7,138,818 B2* | 11/2006 | Chong et al. | 324/764 |
| 7,247,035 B2* | 7/2007 | Mok et al. | 439/81 |
| 7,403,029 B2* | 7/2008 | Chong et al. | 324/764 |
| 7,621,761 B2* | 11/2009 | Mok et al. | 439/81 |
| 2001/0009305 A1 | 7/2001 | Fjelstad | |
| 2001/0009724 A1 | 7/2001 | Chen et al. | |
| 2001/0021483 A1 | 9/2001 | Mathieu et al. | |
| 2002/0000013 A1 | 1/2002 | Sugaya et al. | |
| 2002/0000016 A1 | 1/2002 | Hsieh | |
| 2002/0013070 A1 | 1/2002 | Fork et al. | |
| 2002/0016095 A1 | 2/2002 | Fork et al. | |
| 2002/0055282 A1 | 5/2002 | Eldridge et al. | |
| 2002/0075105 A1 | 6/2002 | Douriet et al. | |
| 2002/0132501 A1 | 9/2002 | Eldridge et al. | |
| 2002/0164893 A1 | 11/2002 | Mathieu et al. | |
| 2002/0171133 A1 | 11/2002 | Mok et al. | |
| 2003/0000010 A1 | 1/2003 | Shimizu | |
| 2003/0010615 A1 | 1/2003 | Fork et al. | |
| 2003/0071348 A1 | 4/2003 | Eguchi et al. | |
| 2003/0075795 A1 | 4/2003 | Hashimoto | |
| 2003/0197285 A1 | 10/2003 | Strandberg et al. | |
| 2004/0038560 A1 | 2/2004 | Mathieu et al. | |
| 2004/0058487 A1 | 3/2004 | Eslamy et al. | |
| 2004/0102064 A1 | 5/2004 | Mathieu | |
| 2004/0155337 A1 | 8/2004 | Strandberg et al. | |
| 2004/0223309 A1 | 11/2004 | Haemer et al. | |
| 2005/0012513 A1 | 1/2005 | Cheng et al. | |
| 2005/0026476 A1 | 2/2005 | Mok et al. | |
| 2005/0212540 A1 | 9/2005 | Nulty et al. | |
| 2005/0270055 A1 | 12/2005 | Akram et al. | |
| 2005/0280430 A1* | 12/2005 | Cram | 324/754 |
| 2008/0090429 A1* | 4/2008 | Mok et al. | 439/81 |

FOREIGN PATENT DOCUMENTS

| | | | |
|---|---|---|---|
| AU | 6028796 A | 12/1996 | |
| AU | 6377796 A | 12/1996 | |
| AU | 6635296 A | 12/1996 | |
| CN | 1171167 A | 1/1998 | |
| CN | 1191500 A | 8/1998 | |
| CN | 1208368 A | 2/1999 | |
| DE | 3630548 | 3/1988 | |
| DE | 69431565 | 6/2003 | |
| DE | 69633334 | 2/2005 | |
| EP | 0369112 | 7/1989 | |
| EP | 0623826 | 11/1994 | |
| EP | 0681186 A2 | 11/1995 | |
| EP | 0731369 A2 | 9/1996 | |
| EP | 0792462 A | 9/1997 | |
| EP | 0792463 A | 9/1997 | |
| EP | 0795200 A | 9/1997 | |
| EP | 0802419 A | 10/1997 | |
| EP | 0828582 A | 3/1998 | |
| EP | 0837750 | 4/1998 | |
| EP | 0859686 | 8/1998 | |
| EP | 0886894 | 12/1998 | |
| EP | 0792519 A | 3/2003 | |
| EP | 0792517 | 10/2003 | |
| FR | 2518358 A | 10/1981 | |
| JP | 02064091 | 3/1990 | |
| JP | 3058919 | 3/1991 | |
| JP | 3267763 | 11/1991 | |
| JP | 5335746 | 12/1993 | |
| JP | 7301642 A | 11/1995 | |
| JP | 9512139 T | 2/1997 | |
| JP | 1995-292471 | 5/1997 | |
| JP | 9508241 T | 8/1997 | |
| JP | 9281144 A | 10/1997 | |
| JP | 10506197 T | 6/1998 | |
| JP | 10506238 T | 6/1998 | |
| JP | 10510107 T | 9/1998 | |
| JP | 1164386 | 3/1999 | |
| JP | 2892505 | 5/1999 | |
| JP | 11126800 A | 5/1999 | |
| JP | 11506829 T | 6/1999 | |
| JP | 11508407 T | 7/1999 | |
| JP | 2968051 | 10/1999 | |
| JP | 11514493 T | 12/1999 | |
| JP | 3022312 | 3/2000 | |
| JP | 2000067953 A | 3/2000 | |
| JP | 2000513499 T | 10/2000 | |
| JP | 2001020067 | 8/2002 | |
| KR | 252457 B | 4/2000 | |
| SG | 55303 A | 12/1998 | |
| WO | WO9425987 | 11/1994 | |
| WO | WO9514314 | 5/1995 | |
| WO | WO9615458 | 5/1996 | |
| WO | WO9615459 A | 5/1996 | |
| WO | WO9615551 | 5/1996 | |
| WO | WO9616440 | 5/1996 | |
| WO | WO9617378 | 6/1996 | |
| WO | WO9637331 A | 11/1996 | |
| WO | WO9637332 | 11/1996 | |
| WO | WO9638858 | 12/1996 | |
| WO | WO9641506 A | 12/1996 | |
| WO | WO9743656 | 11/1997 | |
| WO | WO9744676 | 11/1997 | |
| WO | WO9801906 | 1/1998 | |
| WO | WO9852224 | 11/1998 | |
| WO | WO9914404 | 3/1999 | |
| WO | WO9918445 | 4/1999 | |
| WO | WO0052487 | 9/2000 | |
| WO | WO0052488 | 9/2000 | |
| WO | WO0052703 | 9/2000 | |
| WO | WO0073905 | 12/2000 | |
| WO | WO0074110 A2 | 12/2000 | |
| WO | WO0075677 | 12/2000 | |
| WO | WO0109623 | 2/2001 | |
| WO | WO0109952 | 2/2001 | |
| WO | WO0113130 | 2/2001 | |
| WO | WO0148818 | 7/2001 | |
| WO | WO0148870 | 7/2001 | |
| WO | WO0198793 | 12/2001 | |
| WO | WO03018865 | 3/2003 | |
| WO | WO03081725 | 10/2003 | |
| WO | WO2005091996 | 10/2005 | |

OTHER PUBLICATIONS

Anderson, J., "High-Performance Multi-DUT Interfacing for Wafer Sort," Sep. 1997.

Anderson, J., "Integrated Probe Card/Interface Solutions for Specific Test Applications," International Test Conference, 1998.

Anthony, T.R., "Diodes formed by laser drilling and diffusion," 1982 American Institute of Physics, J.Appl. Physics 53(12), Dec. 1982.

Anthony, T.R., "To Fabricate Electrical Interconnections," 1981 American Institute of Physics, J.Appl. Physics 52(8), Aug. 1981.

Artisanplating.com, "Characteristics of electroplated rhodium finishes," Jan. 15, 2002.

Artisanplating.com, "Chart B: Basics of Electroplating Principles," Jan. 15, 2002.

Asai, S. et al., "Probe Card with Probe Pins Grownby the Vapor-Liquid-Solid (VLS) Method," IEEE Trans, On Components, Packaging, & Manufacturing Technology, Jun. 1996.

ATP Proposers Conference, 1 page, May 8, 2002.

Bakir, M. et al., "Sol-Compliant Wafer-level Package Technologies," Semiconductor International Apr. 2002.

Bakir, M.S., "Sea of Polymer Pillars Electrical and Optical Chip I/O Interconnections for Gigascale Integration," IEEE Transactions on Electron Devices, vol. 51, No. 7, pp. 1069-1077, Jul. 2004.

Barsotti, C. et al., "Very High Density Probing; International Test Conference Proceedings of the New Frontiers in Testing," 1988.

Barsotti, C., et al., "New Probe Cards Replace Needle Types; Semiconductor International," Aug. 1988.

Bastani, B. et al., "Intellectual Property Rights in Nanotechnology."

Bates, R.D. et al., "Search for the Universal Probe Card Solution," International Test Conference, 1997.

Beiley, M. et al., "A Micromachined Array Probe Card-Fabrication Process," IEEE Transactions on Components, Packaging, and Manufacturing Technology, Feb. 1995.

Beiley, M. et al., "Array Probe Card," Proceedings of the IEEE Multi-Chip Module Conference, 1992.

Beiley, M. et al., "Micro-Machined Array Probe Card; Procedure of the IEEE International Electronics Devices Meeting," 1992.

Bell Labs Innovations, "Lucent Technologies Electroplating Chemicals & Services Venture Develops High-Performance Material for Connector Contacts," http://www.bell-labs.com/news/1998/October/23/1.html, Jan. 15, 2002.

Bergman, D., "Forming Microvias," wwww.pcfab.com; vol. 24. No. 3, Mar. 2001.

Bilenberg, B.; PMMA to SU-8 bonding for polymer based lab-on-a-chip systems with integrated optics; submitted to: J. Micromech. Microeng. Dec. 2003, published Apr. 2004; vol. 14, issue: 6.

Bogatin, E., "Semiconductor Packaging," Technology News, Jan. 2003.

Bonham, M. et al., "Wafer-Probe Testing of High-Pin-Count ICs," Microelectronic Manufacturing and Testing, Nov. 1988.

Broz, J.J. et al., "Understanding Probe-Contact a-Spot Oxidation During Elevated-Temperature Wafer Test," Elevated Engineering, Sep. 1999.

Carbonero, J., "Comparison Between Beryllium-Copper and Tungsten High Frequency Air Coplanar Probes," IEEE Transactions on Microwave Theory and Techniques, vol. 43, No. 12, Dec. 1995, pp. 2786-2792.

Cascade Microtech, Cleaning Pyramid Probe Cards for Aluminum Pads, PPD-CLEAN-APP-0702 (p/n 121-710) 2002.

Cascade Microtech, Innovating Test Technologies, VLSR Pyramid Probe Series, Pyramid-DS-1201, 2001.

Cascade Microtech, LSI Pyramid Probe Series, LSIDS-1200, 2001.

Cascade Microtech, Pyramid Probe Cards, PRYPROBE-App-0604, pp. 1-5, 2004.

Cascade Microtech, Pyramid Probe Core Geometries, PPCORETB18-0401, 2001.

Cascade Microtech, Pyramid Probe Family, VLSR-DS-1001, 2001.

Cascade Microtech, Technical Brief, Mechanical Differences Between Pyramid and Cantilever Probes, PPDIFFTB20-0901, 2001.

Cascade Microtech/Advantages, www.cmicro.com/index.cfm/fuseaction/pg.view/pID/297, Nov. 15, 2004, 2 pages.

Center for Tribology, Inc., "Characterization of Overcoats Durability for MEMS," copyright 2006-2009. Application Note, www.cetr.com.

Chen, K. et al., "Microstructure Examination of Copper Wafer Bonding"; Apr. 2001; Massachusetts Institute of Technology, Cambridge, MA 02139, 18 pages.

Chiang, C., "Wafer Level Backside Emission Microscopy: Dynamics and Effects," Microelectronics Reliability, May 1999.

Chow, E. et al., Electrical Through-Wafer Interconnects for Released Silicon Sensors, Dec. 2001; Int'l Electron Devices Meeting; Ginzton Lab, Stanford, CA.

Chow, E.M., "Process Compatible Polysilicon-Based Electrical Through-Wafer Interconnection in Silicon Substrates," Journal of Microelectromechanical Systems, vol. 11, No. 6, Dec. 2002.

Cobra, "Probe Cards," Array Probe Card Product; pp. 1-3, Nov. 9, 2001.

"Comparisons of Materials: Coefficient of Thermal Expansion," www.handyharmancanada.com/TheBrazingBrook/comparis.htm, Sep. 4, 2002.

Comtois, J.H., et al., "Fabricating Micro-Instruments in Surface-Micromachined Polycrystalline Silicon," The 43$^{rd}$ International Instrumentation Symposium, 1997.

Connector Specifier, "Electrically Conductive Adhesives," Feb. 1999.

Douglas Plating Limited, "www.douglas-plating.co.uk/top.html," Jan. 16, 2002.

Dudley, D., "Emerging Digital Micromirror Device (DMD) Applications"; Jan. 2003; DLP Products New Applications, Texas Instruments, Inc. P.O. Box 869305, MS 8477, Plano, Texas 75086.

DuraProbe, "DuraProbe Specifications," Kulick & Soffa Industries, Inc., 1 page, 2001.

"Efunds: Surface Treatments," Electroplating. Jan. 15, 2002.

Ehlermann, E., "Matched Expansion Probe Cards," Hiten 99 3$^{rd}$ European Conference on High Temperature Electronics, 1999.

Ehrlich, D.J. et al., Fabrication of Through-Wafer Via Conductors in Si by Laser, IEEE Transactions, 0148-6411/821200-0520, 1982 IEEE.

"Electroplating of Hard Glassy Metals," National Aeronautics and Space Administration; www.nasasolutions.com, Feb. 27, 2001.

"Electroplating Properties by Solution by Type," Types of Plating Services We Provide, www.epson-platingcom.sg/wegtop/proper1.html, Feb. 15, 2002.

Emery, R., "Novel Microelectronic Packaging Method for reduced Thermomechanica Stresses on Low Dielectric Constant Materials," Advanced Metabolism Conf; Montreal, Canada, Oct. 9, 2001.

Evans, U.R., "The Corrosion and Oxidation of Metals: Scientific Principles and Practice Applications"; 1960; London, Edward Arnold (Publishers) Ltd., Chapter II, pp. 18-29, 32-35 & 820&821.

Final Patent Report, PARC; Nov. 21, 2003.

Formfactor Business, Overview, 2002.

"Fundamentals of Contact Resistance," Part 1—Contact Theory; Advanced probing Systems, Inc. Technical Bulletin, May 1999.

Goldstein, H., "Packages, Stacking different chips," IEEE Spectrum, Aug. 2001.

Haemer, J.M., et al., "Flexible Mico-Spring Interconnects for High Performance Probing," Electronic Components and Technology Conference, 2000 Proceedings, 50th Volume, pp. 1157-1163, 2002.

Hah, D., "A Low-Voltage Actuated Micromachined Microwave Switch Using Torsion Spings and Leverage," IEEE Transaction on Microwave Theory and Techniques, vol. 48, No. 12, pp. 2540-2545, Dec. 2000.

Ho, M,Y. et al., "Morphology and Crystallization Kinetics in HfO2 Thin Films Grown by Atomic Layer Deposition," pp. 1-18, Jun. 1, 2002.

Ho, M.Y. et al., "Suppressed Crystallization of Hf-Gate Dielectrics by Controlled Addition of Al2O3 Using Atomic Layer Deposition," Applied Physics Letters; American Institute of Physics, pp. 4218-4220, 2002.

Hong, S. et al., "Design & Fabrication of a MonolothicHigh-Density Probe Card for High-Frequency On-Wafer Testing," International Electronic Devices Meeting Technical Digest, 1989.

Hughes, P., "Science Over Art"; 1991; Our New IC Membrane Test Probe.

IBM Research, Conclusion, p. 24, Jun. 4, 2001.

Intel Develops Breakthrough Packaging Technology, Intel Labs, 2002.

International Technology Roadmap for Semiconductors, Executive Summary, 2001 Edition.

International Technology Roadmap for Semiconductors; Assembly and Packaging, 2001 Edition.

Itoh, T. et al., "Characteristics of Fritting Contacts Utilized for Micromachined Wafer Probe Cards," Review of Scientific Instruments, May 2000.

Itoh, T., "Contact Properties of Micromachines Ni Probes," IEEE vol. 8:2, pp. 223-227, 2003.

Jacob, G., "Contacting a Multitude of Miniscule Nodes," Evaluation Engineering, Aug. 1991.

Jacob, G., "Shrinking Geometry Issues," Probe Cards and Station Cope with Submicron IC Features, www.evaluationengineering.com/archive/articles/0398wafr.htm, 6 pages, Nov. 8, 2004.

Kataoka, K., et al., "Low contact-force and compliant MEMS probe card utilizing fritting contact," 0-7803-7185-2/02, IEEE, 2002.

Kim, B. et al., "A Novel MEM Silicon Probe Card," 0-7803-7185-2/0, IEEE, 2002.

Kim, B., "A Vertically Guided MEMS Probe Card with Deeply Recessed Trench-Type Cantilever," pp. 271-274, IEEE, 2005.

Kruger, C. et al., "Electroplated Micro-Springs for Demountable Chip Connections13th European Conf," Sep. 12-15, 1999.

Landis, D.L., "A Self-Test System Architecture for Reconfigurable WSI," International Test Conference Procedure Meeting the Tests of Time, 1989.

Landis, D.L., "Self-Test Methodology for Restructurable WSI," Procedure of the International Conference on Wafer Scale Integration, 1990.

Landis, D.L., "A Test Methodology for Wafer Scale Systems," IEEE Transactions on Computer-Aided Design of Integrated Circuits & Systems, Jan. 1992.

Lecklider, T., "Technical Editor: Multiple Area-Array Devices Challenge Wafter Probing" Wafer Test EE, www.evaluationengineering, pp. 25-28, 31&34, 37&38, Mar. 1999.

Lee, K.M., "SEM/EDS evaluation of porcelain adherence to gold-coated cast titanium"; Jan. 2003; Journal of Biomedical Materials Research Part B: Applied Biomaterials, vol. 68B, Issue 2, pp. 165-173.

Lee, S., "Curled Micro-Cantilevers using Benzocyclobutene Polymer and Mo for Wafer Level probing," Sensors and Actuators A 121, pp. 472-479, 2005.

Leslie, B. et al., "Membrane Probe Card Technology (The future for high performance test)," ITC Proceedings, p. 601, 1988.

Leslie, B., et al., "Wafer-Level Testing with a Membrane Probe," IEEE Design & Test of Computers, Feb. 1989.

Leung, J. et al., "Active Substrate Membrane Probe Card; International Electron Devices Meeting Technical Digest," 1995.

Levy, L., "WaferProbe System," Jun. 1997.

Li, X. et al., "Fabrication of High-Density Electrical Feed-Throughs by Deep-Reactive-Ion Etching of Pyrex Glass," Journal of Microelectromechanical Systems, vol. 11, No. 6, Dec. 2002.

Li, X. et al., "High Density Electrical Feedthrough Fabricated," 0-7803-5998-4/01 IEEE 2001.

Lin, C. et al., "Universal Substrate Development Project," Nexus Proprietary and Confidential, Aug. 12, 2002.

Linder, C. et al., "Nanosprings—New Dimensions in Sputtering Chips"; Jul. 2002; Palo Alto Research Center, Chips newsletter.

Liu, C., "Through-Wafer Electrical Interconnects by Sidewall Photolithographic Pattering," IEEE Tech Conf. May 19/21, 1998.

Lumbantobing, A., Electrical Contact Resistance as a Diagnostic Tool for MEMS Contact Interfaces, Journal of Microelectromechanical Systems, vol. 13, No. 6, Dec. 2004, pp. 977-987.

Ma, L. et al., "J-Springs-Innovative Compliant Interconnects for Next-Generation Packaging," PARC, Inc. ECTC02002.

Mann, W.R., "Introduction to Wafer Test Technology," Southwest Test Workshop, Jun. 3, 2001, pp. 1-31.

Martinez, S., TEA & John Pitts Motorola, Inc., "Wafer Level Tech & Burn In—Accomplishments Challenges"; Sep. 2002; 9th Annual International KGD Packaging and Test Workshop, Napa, CA.

Matta, F., "Advances in IC Testing: The Membrane Probe Card," Hewelett-Packard Journal, Jun. 1990.

Matteo, D.C., Hewlett Packard Corporate Intellectual Property Licensing, May 31, 2002.

McGraw-Hill Encyclopedia of Science and Technology, 8th Ed., Part 3, p. 124, USA, 1997.

Metric Conversion Factors, pp. 1-16, Jan. 8, 2003.

Xerox Palo Alto Research Center, "Micro-Contact Springs for High Performance Probing and Packaging," Apr. 8, 1998.

MTBSolutions, "The AMITEC Substrate Advantage: Design Rules & Electrical Properties," May 5, 2002.

Myung, N. V. et al., "Electrodeposited Hard Magnetic Thin Films for MEMS," 6th Int'l Symp on Magnetic Materials, PV 2000-29, 2002.

Nadeau, N. et al., "An Analysis of Tungsten Probes' Effect on Yield in a Production Wafer Probe Environment," International Test Conference Procedure Meeting the Tests of Time, 1989.

Nadeau, N. et al., "Effect of Tungsten Probes on Wafer-Probe Yield in a Production Environment," Microelectronic Manufacturing & Testing, Sep. 1989.

Natter, H., et al., "Nanocrystalline Nickel and Nickel-Copper Alloys," J.Mater Res., vol. 13, No. 5, May 1998.

"New Build-up HDI technique using copper bumps," Victory Circuit Co., Ltd., Sep. 2002.

Newboe, B., "The Probe Card Dilemma," Semiconductor International, Sep. 1992.

Ok, S.J. et al., "High Aspect Ratio, Through-Wafer Electrical," IPACK'01 proceedings, Hawaii, USA, Jul. 8-13, 2001.

Pandey, R., et al., "P4 Probe Card-A Solution for At-Speed, High Density, Wafer Probing," Proc. International Test Conference, 1998.

Dennis S. Fernandez, "Patent Strategies and Portfolio Development," Fernandez & Associates. 16 pages, 2002.

Pena, D.J., et al., "Electromechanical Synthesis of Multi Material," Mat. Res. Soc. Symp. vol. 636, Materials Research Society, 2001.

Petefish, W.G., "High Performance Laminated Chip Package Technology"; Sep. 1998; W.L. Gore & Associates, Inc., Electronic Products Division.

Pham, N.P. et al., "A Micromachining Post-Process Module for RF Silicon Technology," IEEE, Feldmannweg 17, 2628 CT Delft, 2000.

Phillips, M.A., "Stress and Microstructure Evolution During Initial Growth of Pt on Amorphous Substrates," J. Mater, Res., vol. 15, No. 11, Nov. 2000.

Pruitt, B.L., "Measurement System for Low Force and Small Displacement Contacts," Journal of Microelectromechanical Systems, vol. 13, No. 2, Apr. 2004, pp. 220-229.

Reagan, J. et al., "Thin Film Hybrid Technology for On-Wafer Probing of Integrated Circuits," Hybrid Circuit Technology, Apr. 1990.

Renard, S., et al., Expanding MEMS with low-cost SOI wafers, Sep. 23, 2002.

Renz, U., "Multipoint Test Probe for Printed Cards," IBM Technical Disclosure Bulletin, vol. 17, No. 2, 2 pages, Jul. 1974.

Robertazzi, R., "Area Array Probe Card Interposer," IBM Research, pp. 1-23, Jun. 4, 2001.

Saha, R. et al., "Effects of the Substrate on the Determination of Thin Film Mechanical Properties by Nanoindentation," Acta Materialia 50, vol. 23-38, 2002.

Santner, E., et al., "Adhesion and Deformation on a Microscopic Scale"; 2000; Federal Institute for Material Research and Testing (BAM), D-1200 Berlin, Germany.

Sasho, S. et al., "Four Multi Probing Test for 16 Bit DAC with vertical contact Probe Card," 1996.

Schleifer, S., "Improving Wafer Sort Yields with Radius-Tip Probes; Procedure of International Test Conference," 1990.

Schwartz, R., "Measurement Repeatability Key to Probe-Card Metrology," EE-Evaluation Engineering, Sep. 1998.

Shi, B, "Intrinsic Stress Development in Ti-C:H Ceramic Nanocomposite Coatings," Applied Physics Letters, vol. 81, No. 2, pp. 352-354. Jul. 8, 2002.

Singer, P., "The Dual Challenges of Wafer Probing," Semiconductor International, Dec. 1989.

Slade, P.G., "Electrical Contacts, Principles and Applications," pp. 603-605, Marchel Dekker, New York, Basel, 1999.

Soejima, K. et al., "New Probe Microstructure for Full-Wafer," Contact-Probe Cards; 49th Electronic Components & Technology Conference, 1999.

Soh, H.T., "Ultra-Low Ressitance, Through-Wafer VIA (TWV) Technology," 1998 Int'l Conf. on Solid Sate Devices and Materials, Hiroshima, pp. 284-285, 1998.

Stanley, J.K., "Electrical and Magnetic Properties of Metals, American Society for Metals," Metals Park, Ohio, Electrical Conduction, Chapter 11, table 11.2, figure 11-10, 11-11 & 11-12, pp. 439 & 440, 1963.

Strohm, K. M. et al., "Via hole technology for Microstrip Transmission," IEEE MTT-S Digest, 1999.

Subramanian, E., et al., "Enhanced Probe Card Facilities At-Speed Wafer Probing in Very High Density Applications," Procedure of International Test Conference, 1992.

Table of Contents, EDGAR Online, Inc., p. 17, 2002.

Tada, T. et al., "Fine Pitch Probe Technology for VLSI Wafer Testing" Procedure of International Test Conference, 1990.

Takahiro, I., et al., "Fabrication of Micro IC Probe for LSI Testing," Sensors & Actuators A, Mar. 10, 2000.

Tamura, T., "Probing Techniques for Ultra-High Pin Counts," NEC Research and Development, Apr. 2000.

Tan, Q. et al., "Reliability Evaluation of Probe-Before-Bump Technology," 24th IEEE/CPMT International Electronics Manufacturing Technology Symposium, 1999.

Texas Instruments, DMD 0.7 XGA 12 DDR DMD Discovery, Product Preview Data Sheet, TI DN 2505686 Rev C, Aug. 2004, 22 pages.

"The Final Test Report," vol. 13, No. 07, Jul. 2002.

Tonnies, D., "A Review and Trends in Flip Chip Technology," Germany, Chip Scale Review, Apr. 2004, pp. 55, 57 & 59.

Towle, S. et al., "Bumpless Build-Up Layer Packaging," Intel Corporation, Components Research, Presented at ASME International Mechanical Engineering Congress and Exposition (IMECE), New York, Nov. 12, 2001.

U.S. Environment Protection Agency Region 9 Pollution Prevention Program: Extending Electroless Nickel Bath Life Using Electrodialysis, Jul. 1998.

VC Task Force Breakfast Workshop, May 31, 2002.

Joseph Fletcher, VC Task Forces, May 31, 2002.

"Venom, Probe Cards, a Cobra Card Product," Powerful Interface Technology, pp. 1-3, Nov. 9, 2001.

Wu, J.H., et al., "A High Aspect-Silicon Substrate-Via technology and Applications: Through-Wafer," 0-7803-6441-4/00, 2000 IEEE.

Yassine, A.M., "Characterization of Probe Contact Noise for Probes Used in Wafer-Level Testing," IEEE Electron Device Letter, vol. 12, No. 5, Mary 1991, pp. 200-202.

Yin, W.M., "Creep in Boron-Doped Nanocrystalline Nickel," Scripta Matter 44, vol. 44, No. 4, pp. 569-574, 2001.

Zhang, Y. et al., "A New MEMS Wafer Probe Card," Systems. An Investigation of Micro Structures, Sensors, Acuators, Machines and Robots, 1997.

Zhang, Y., "Design, Simulation, Fabrication and testing of Microprobes for a New MEMS Wafer Probe Card," Dissertation, Dept. of Electrical and Computer Engineering, New Jersey Institute of Technology, May 1997.

Zhang, Y., et al., "Thermally Actuated Microprobes for a New Wafer Probe Card," Journal of Microelectromechanical Systems, Mar. 1999.

Zheng, Y., "Study of Copper Applications and Effects of Copper Oxidation in Microelectronic Package," In Partial Fulfillment of MatE 234, 26 pages, May 10, 2003.

Zhu, S., "Joining of Ain Ceramic to Metals Using Sputtered Al or Ti Film," Journal of Materials Processing Technology, vol. 109, Issue 3, pp. 277-282, Feb. 15, 2001.

\* cited by examiner

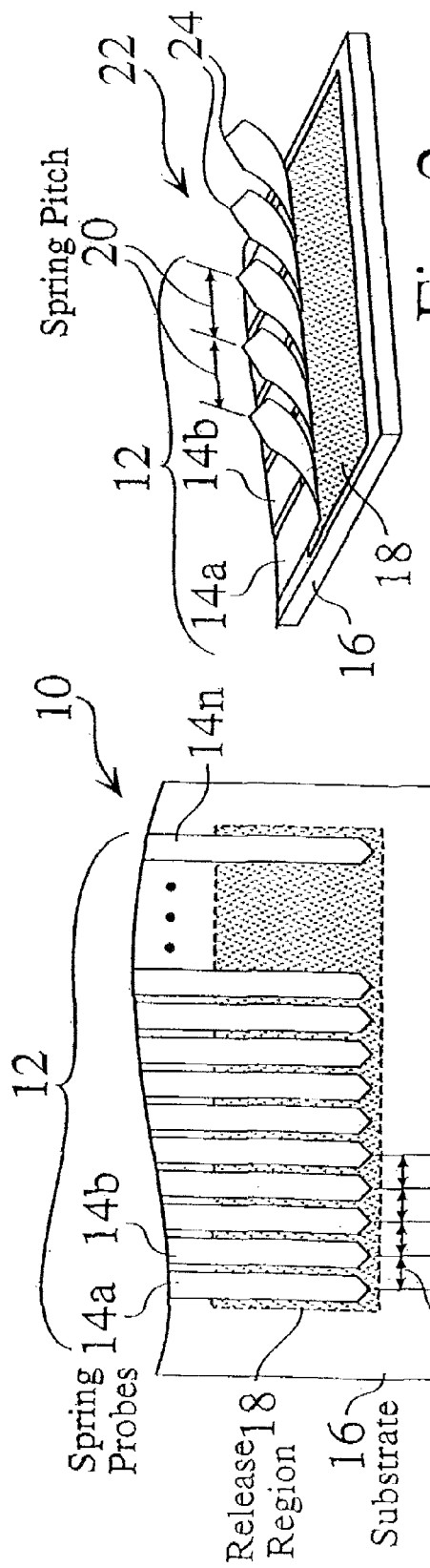
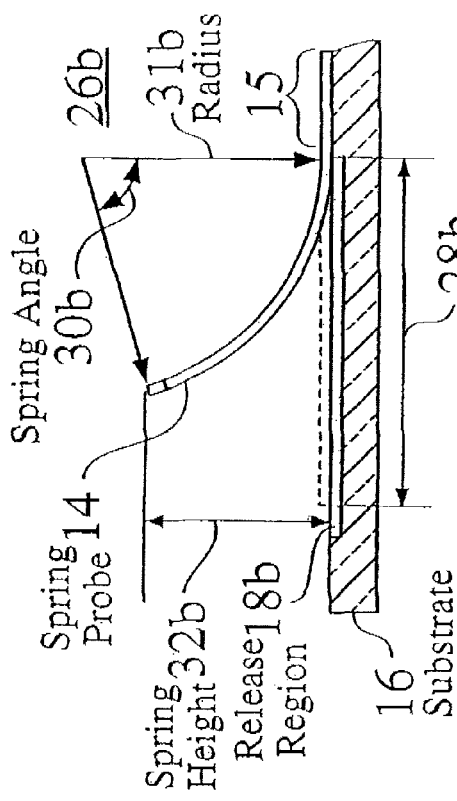
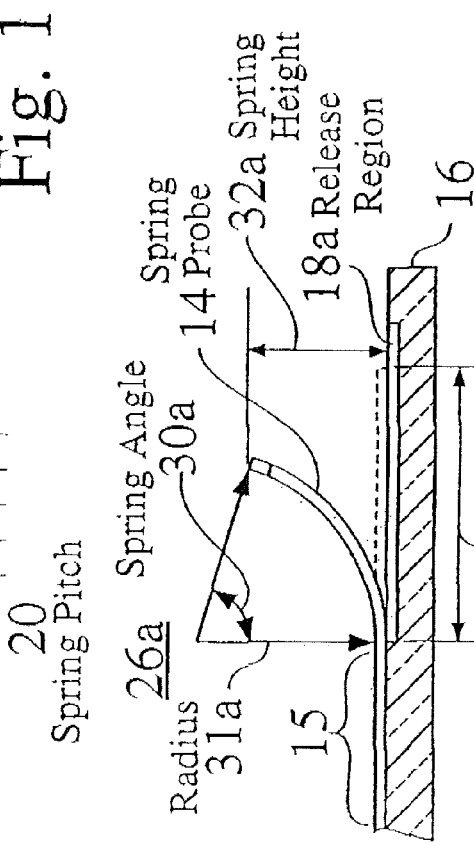

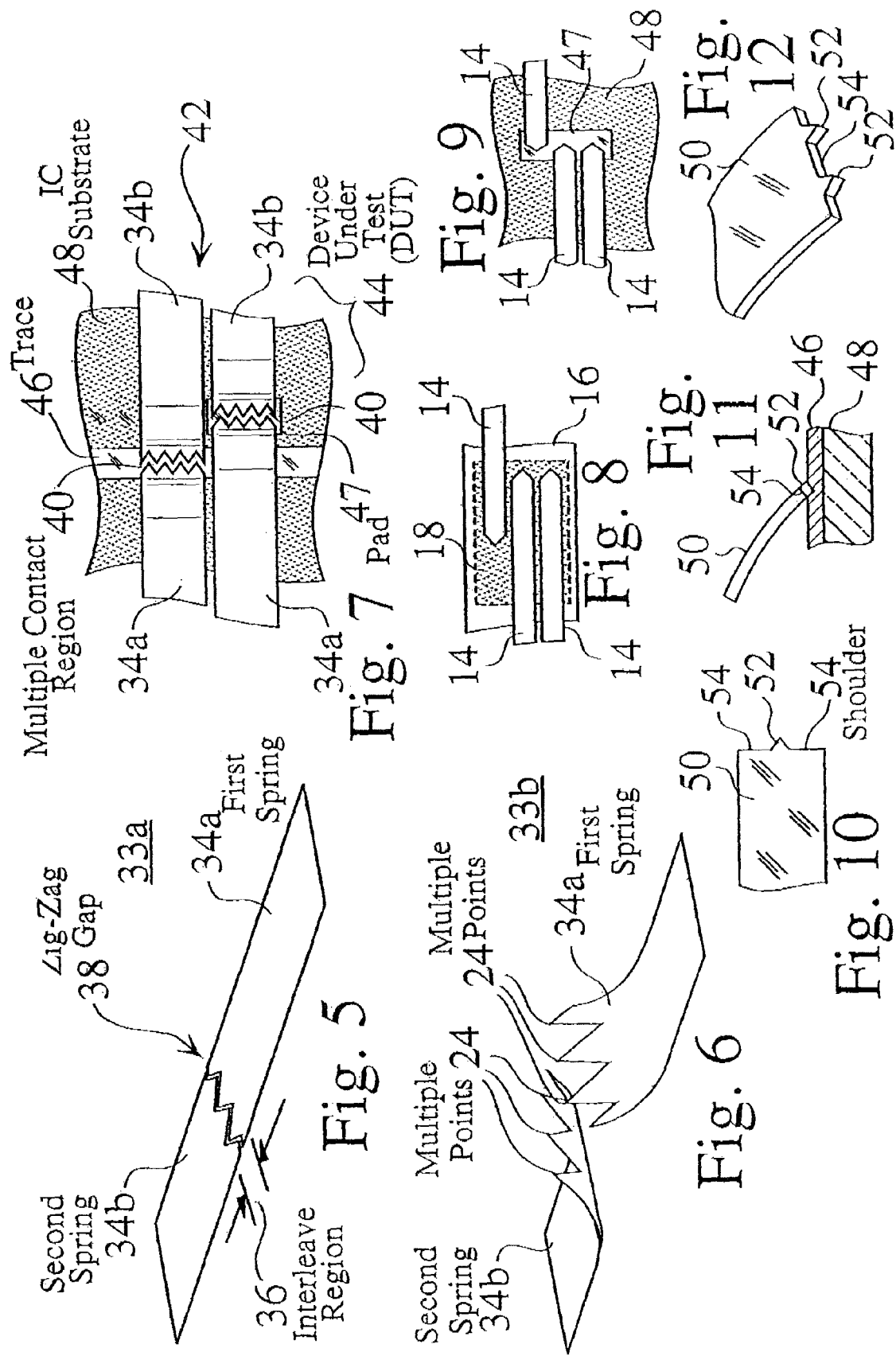

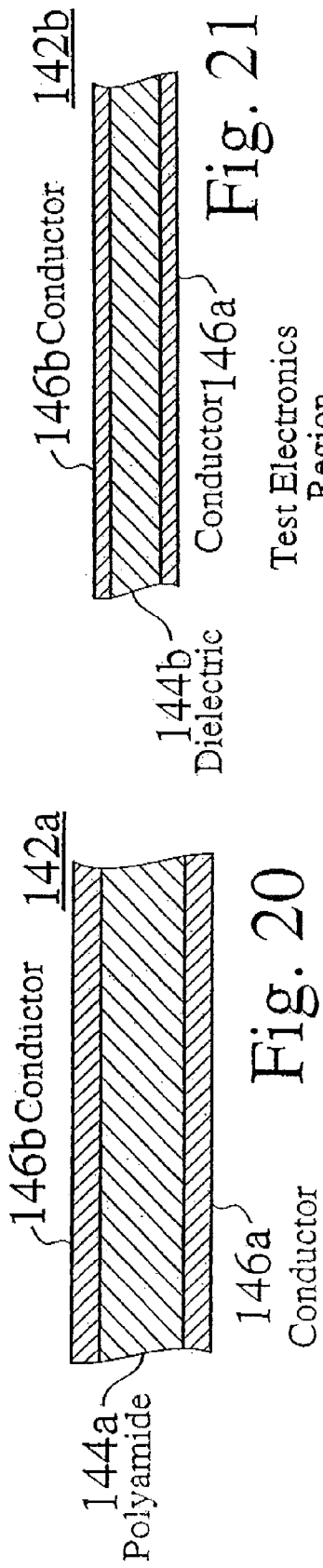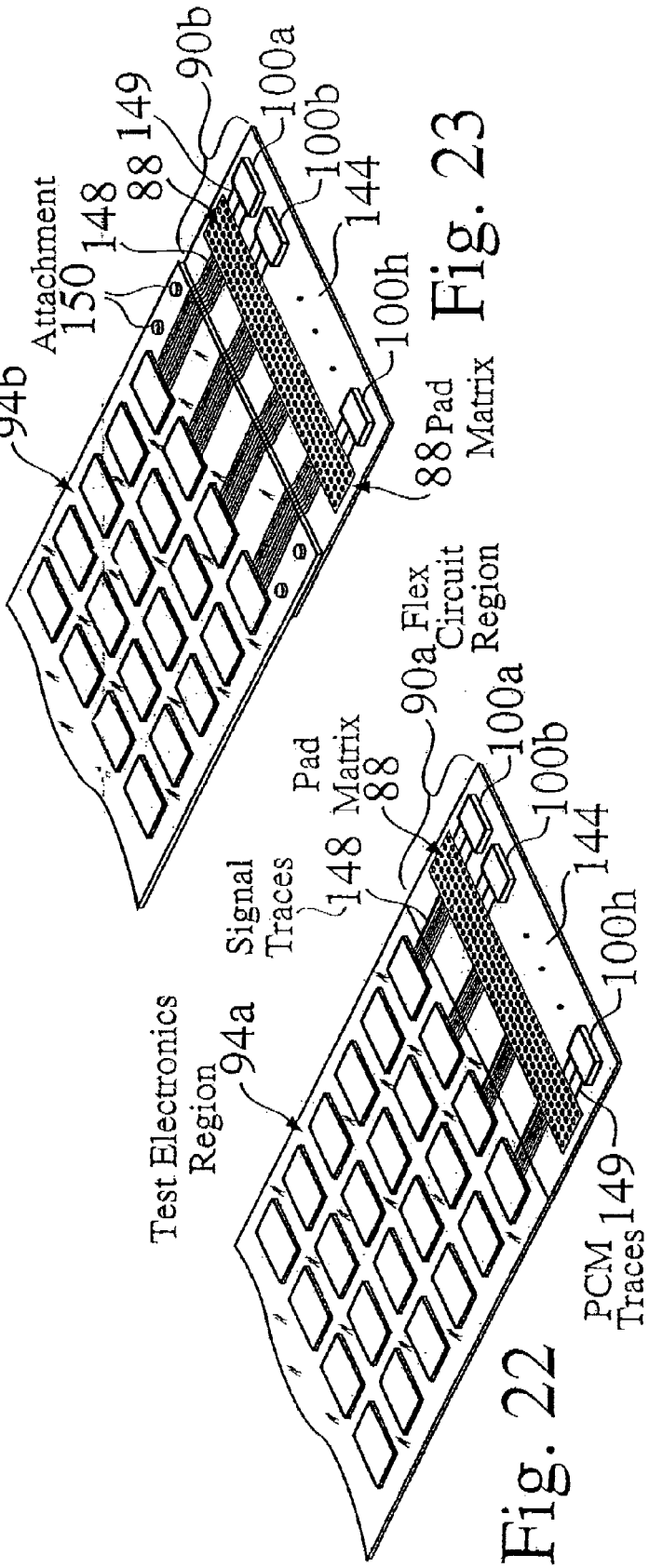

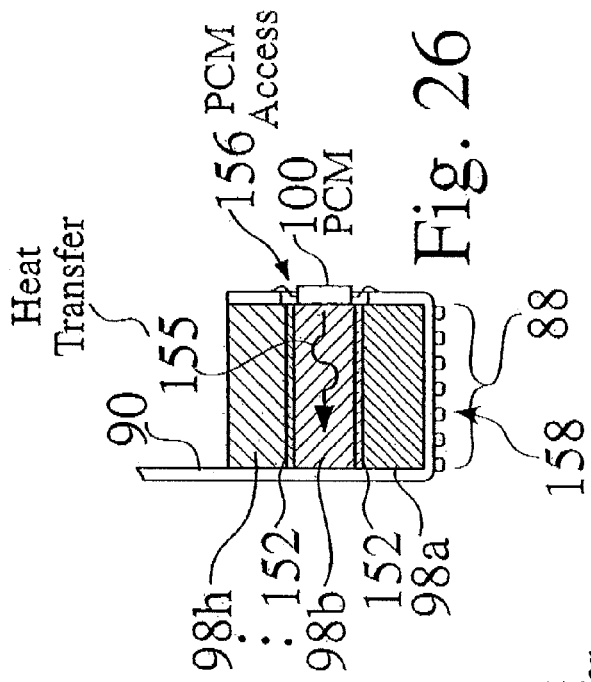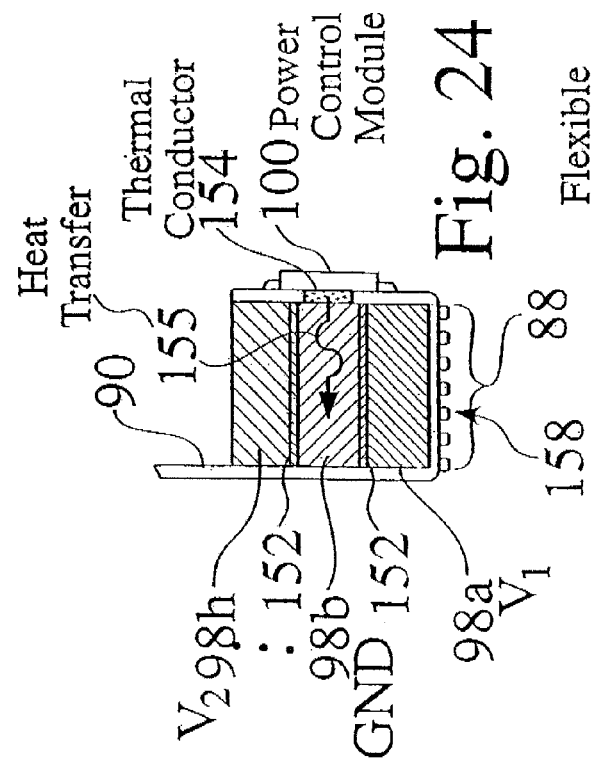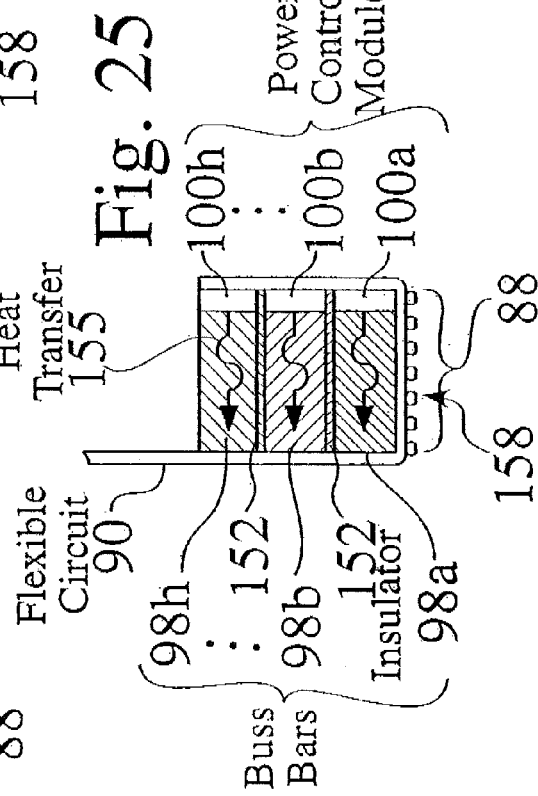

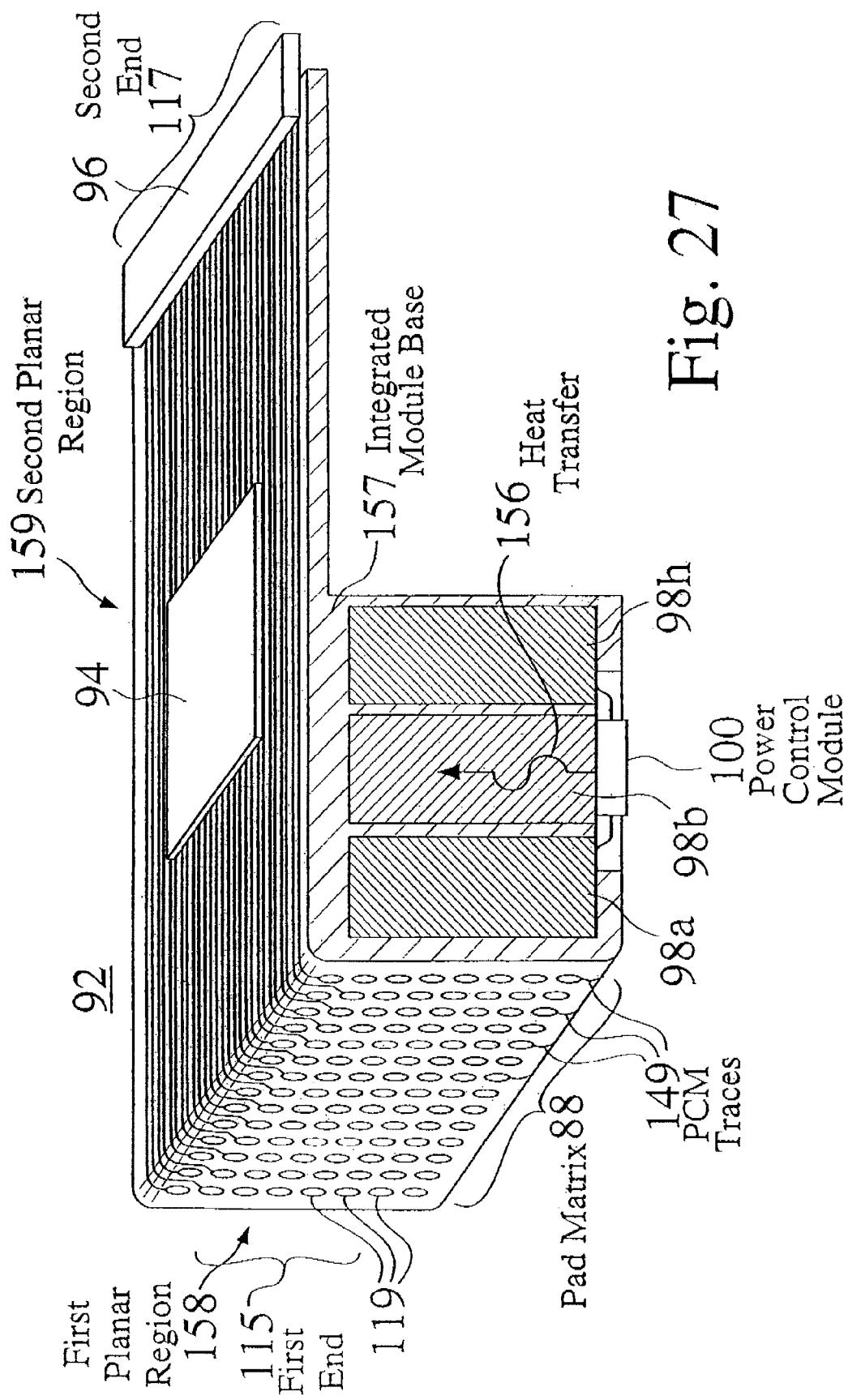

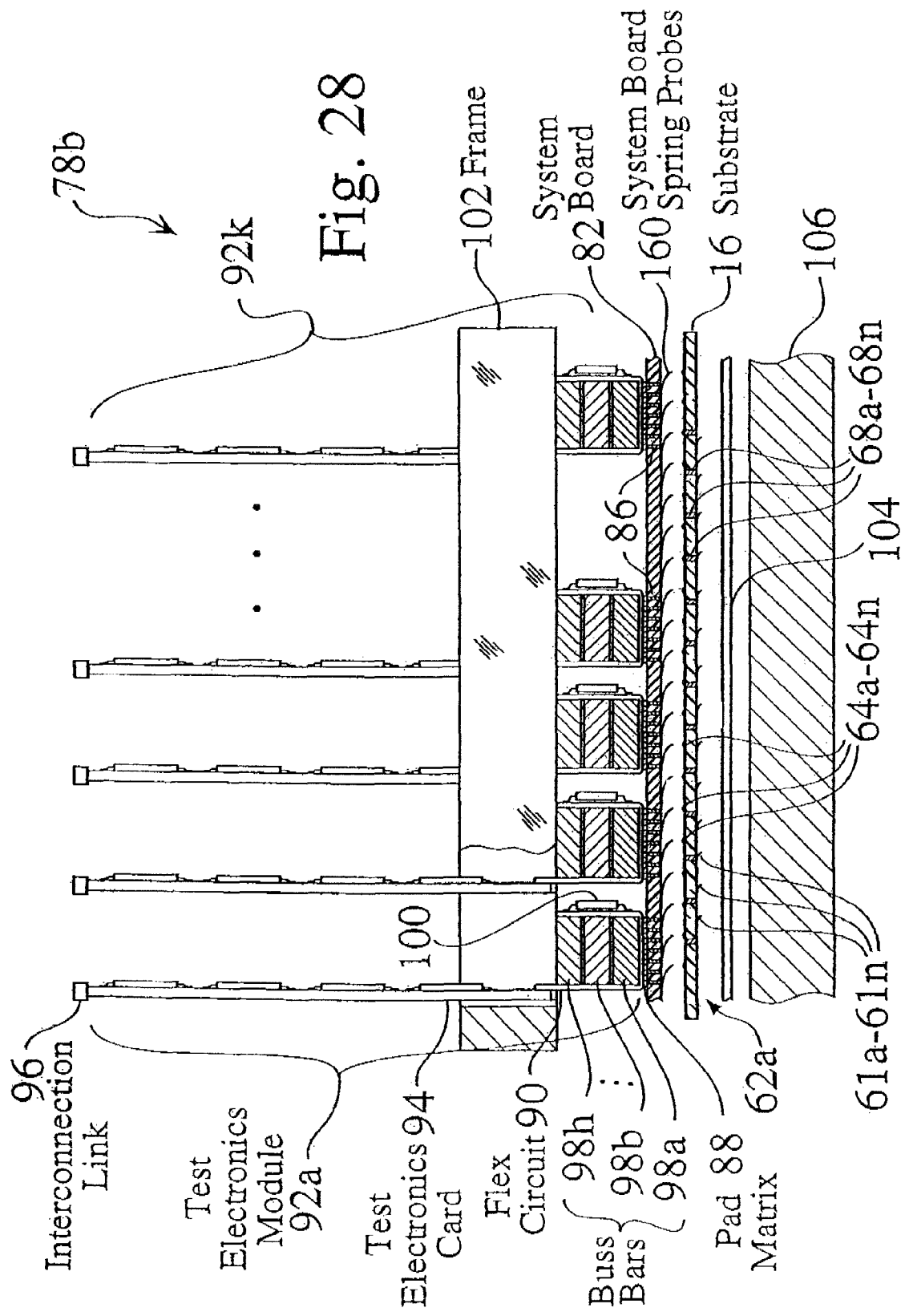

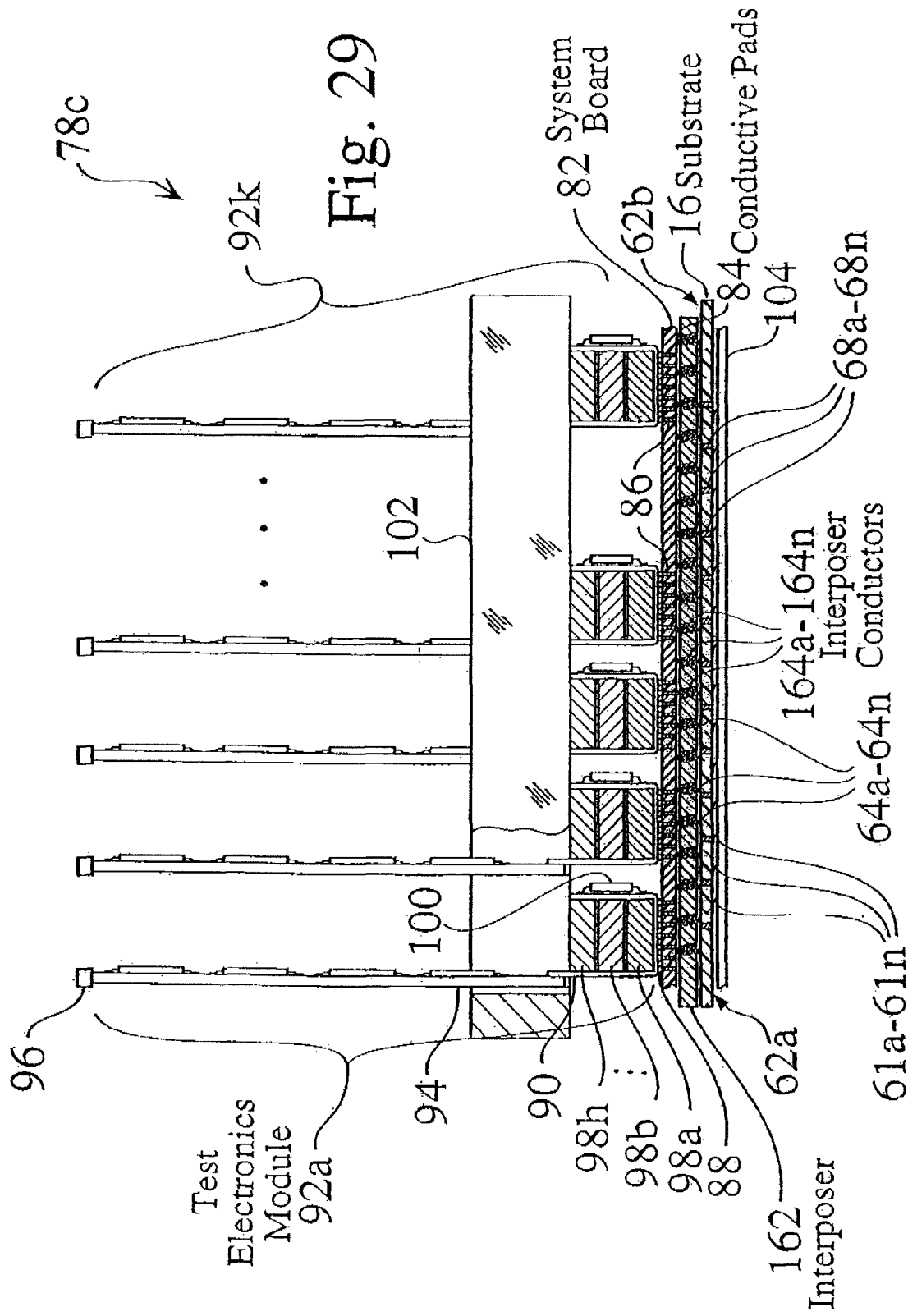

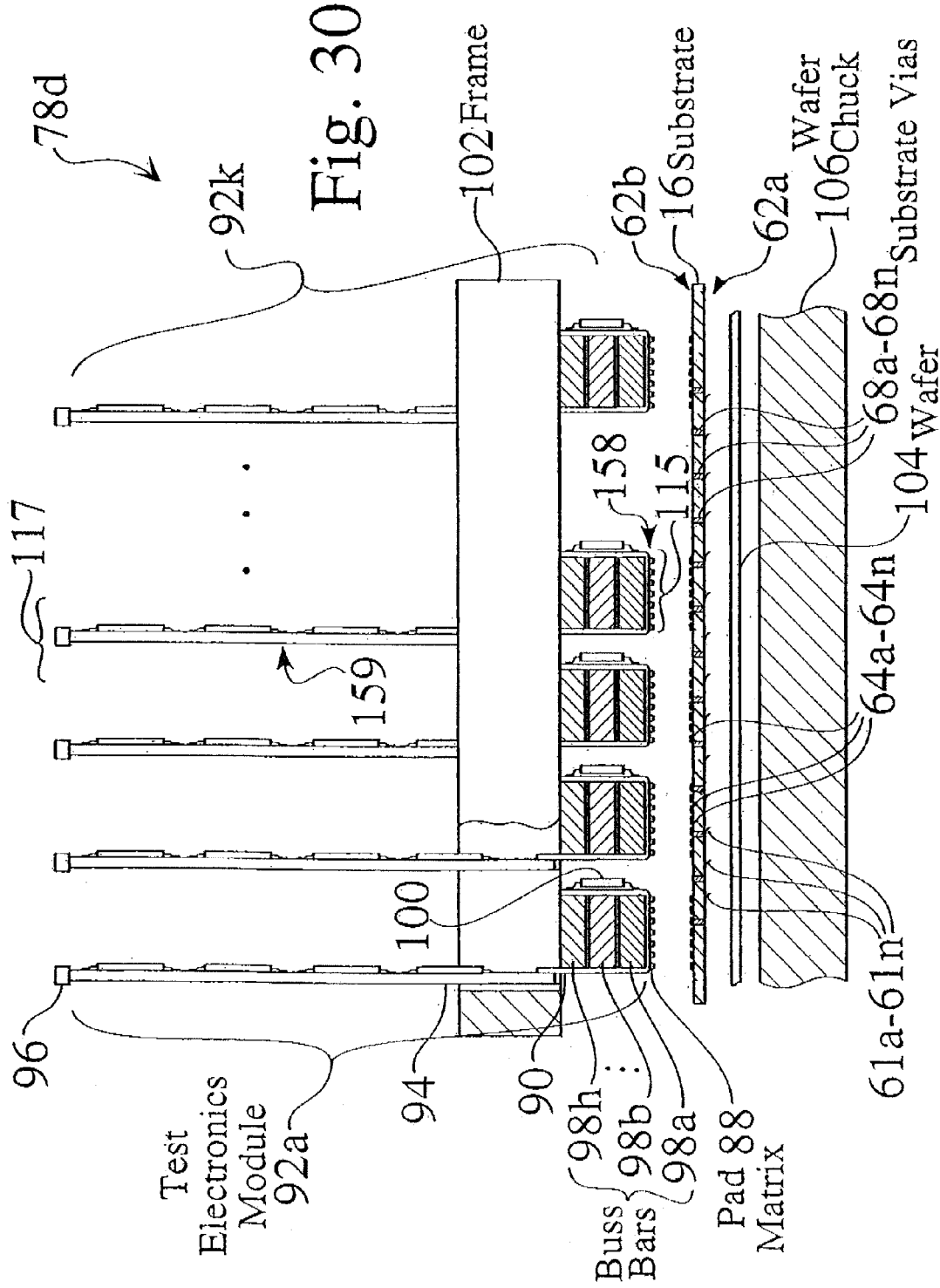

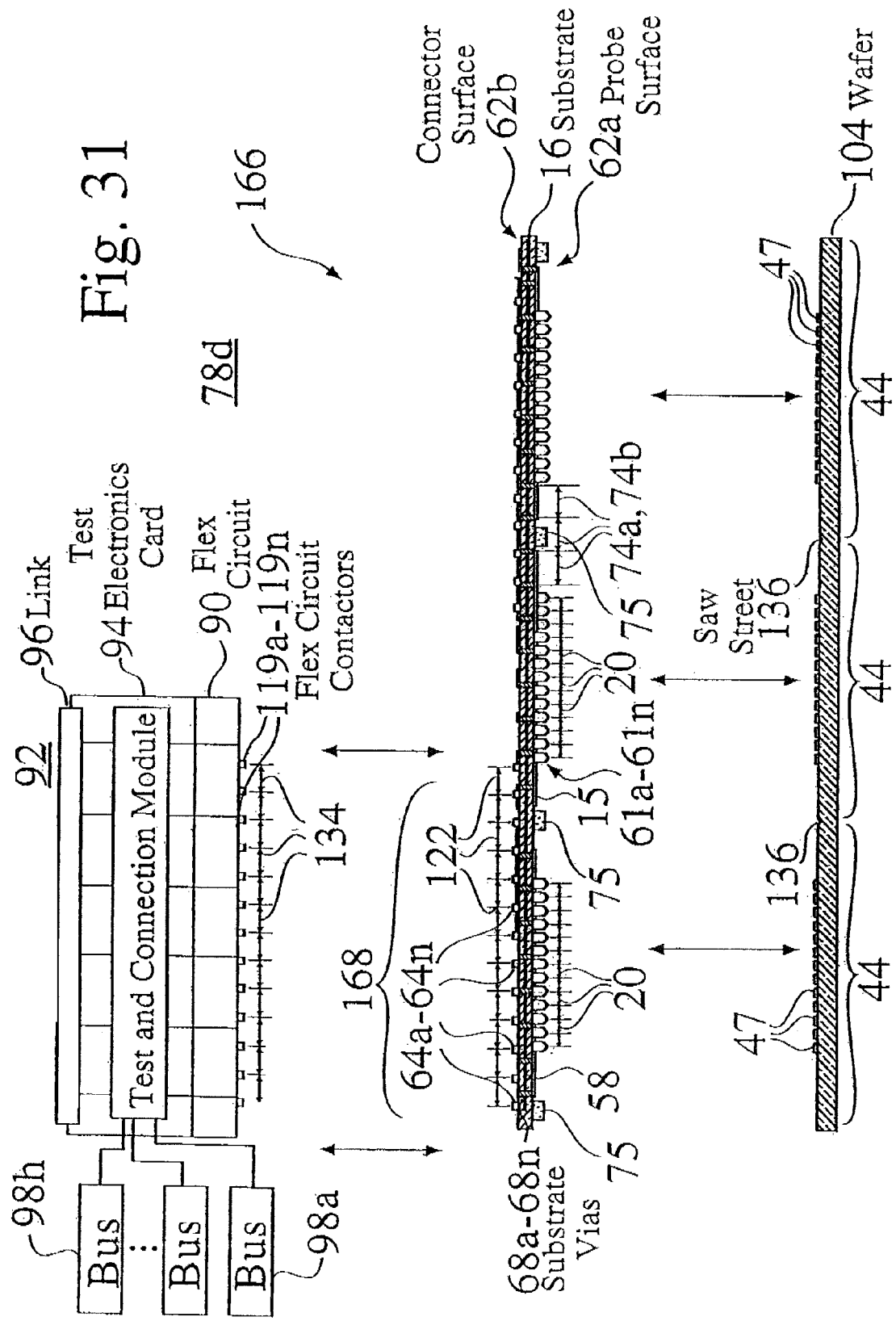

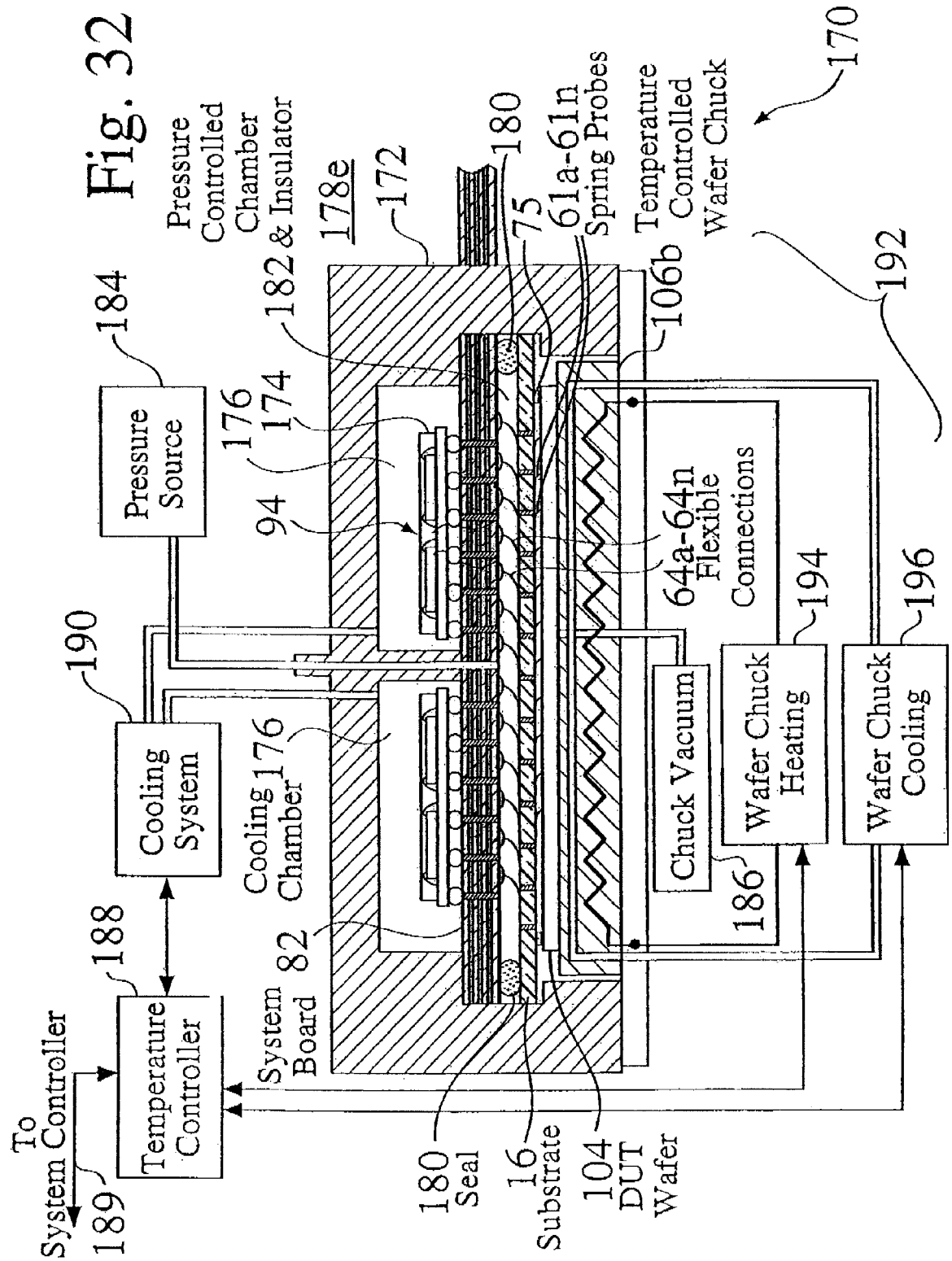

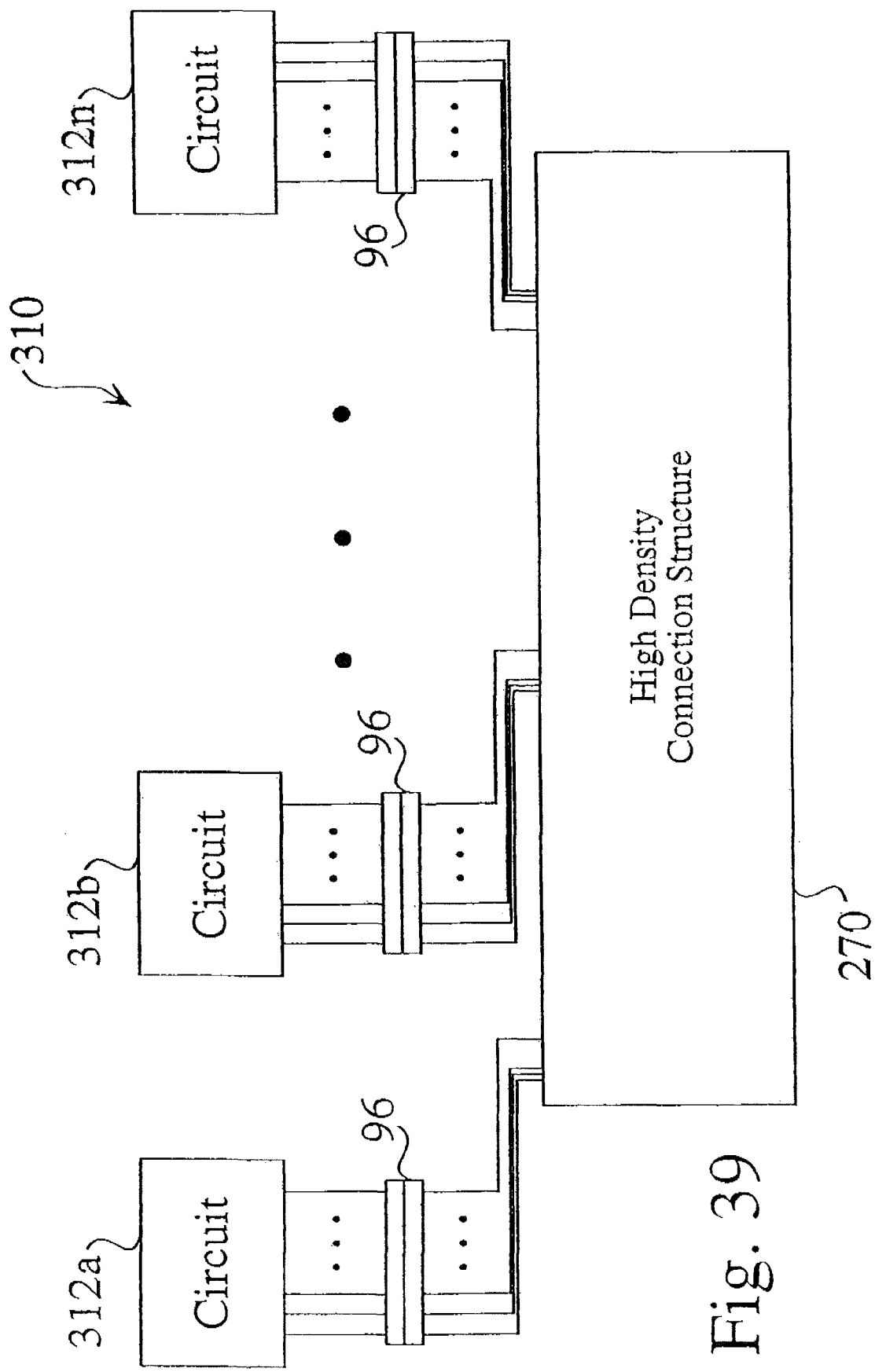

MASSIVELY PARALLEL INTERFACE FOR ELECTRONIC CIRCUIT

CROSS-REFERENCE TO RELATED APPLICATIONS

This application is a Divisional Application of U.S. Ser. No. 11/555,603, filed Nov. 1, 2006, now U.S. Pat. No. 7,403,029 which is a continuation of U.S. Ser. No. 11/327,728, filed Jan. 05, 2006, now U.S. Pat. No. 7,138,818, which is a continuation of U.S. Ser. No. 10/918,511, now U.S. Ser. No. 7,009,412, filed Aug. 12, 2004, which is a divisional of U.S. Ser. No. 09/979,551, now U.S. Pat. No. 6,812,718, filed Nov. 21, 2001, which is a National Stage Entry of International Patent Application No. PCT/US00/14768, filed May 26, 2000, which claims priority to U.S. Provisional Application 60/136,637, filed May 27, 1999, all of which are incorporated herein in their entirety by this reference thereto.

FIELD OF THE INVENTION

The invention relates to the field of integrated circuit (IC) testing and burn-in structures and processes, as well as high bandwidth electronic systems. More particularly, the invention relates to improvements in photolithography-patterned spring contacts and enhanced system interconnect assemblies having photolithography-patterned spring contacts for use in the testing or burn-in of integrated circuits and interconnecting a large number of signals between electronic systems or subsystems.

BACKGROUND OF THE INVENTION

Integrated circuits are typically tested in wafer form (wafer sort) before they are packaged. During wafer sort, integrated circuits are tested one or few at a time, even though there may be hundreds or even hundreds of thousands of the same integrated circuit located on a wafer. The packaged integrated circuits are then tested again, and burned-in, if necessary.

Parallel testing on the wafer level has been limited in number and has so far been limited to low pin count devices, due to the difficulty in managing the large number of interconnects, and the limited amount of electronics which can conventionally be placed close to a wafer under test.

Attempts have also been made to burn-in ICs while in the wafer form. However, wafer-level burn-in is plagued with multiple problems, such as thermal expansion mismatch between the connector and the silicon wafer under test. Conventional structures, such as large area substrates having a large plurality of fanout traces which are electrically connected to pin or socket connectors, are typically implemented to manage connections between the IC under test, test electronics, and power management electronics.

The density of integrated circuits on semiconductor wafers continues to increase, due to semiconductor device scaling, with more gates and memory bits per unit area of silicon. As well, the use of larger semiconductor wafers (e.g. often having a nominal diameter 8 inches or 12 inches) has become common. However, semiconductor test costs have increased on a cost per unit area of silicon basis. Therefore, semiconductor test costs have increased disproportionately over time, to become a greater percentage of the total manufacturing cost for each integrated circuit device.

Furthermore, advances in chip scale packaging (CSP) and other forms of small footprint packages have often made traditional packaged IC handlers obsolete for testing and burn-in.

In some conventional large surface area substrate integrated circuit (IC) test boards, electrical contacts between the test board and an integrated circuit wafer are typically provided by tungsten needle probes. However, tungsten needle probe technology is not able to meet the interconnect requirements of advanced semiconductors having higher pin counts, smaller pad pitches, and higher clock frequencies.

While emerging technologies have provided spring probes for different probing applications, most probes have inherent limitations, such as limited pitch, limited pin count, varying levels of flexibility, limited probe tip geometries, limitations of materials, and high costs of fabrication.

K. Banerji, A. Suppelsa, and W. Mullen III, *Selectively Releasing Conductive Runner and Substrate Assembly Having Non-Planar Areas*, U.S. Pat. No. 5,166,774 (24 Nov. 1992) disclose a runner and substrate assembly which comprises "a plurality of conductive runners adhered to a substrate, a portion of at least some of the conductive runners have non-planar areas with the substrate for selectively releasing the conductive runner from the substrate when subjected to a predetermined stress."

A. Suppelsa, W. Mullen III and G. Urbish, *Selectively Releasing Conductive Runner and Substrate Assembly*, U.S. Pat. No. 5,280,139 (18 Jan. 1994) disclose a runner and substrate assembly which comprises "a plurality of conductive runners adhered to a substrate, a portion of at least some of the conductive runners have a lower adhesion to the substrate for selectively releasing the conductive runner from the substrate when subjected to a predetermined stress."

D. Pedder, *Bare Die Testing*, U.S. Pat. No. 5,786,701 (28 Jul. 1998) disclose a testing apparatus for testing integrated circuits (ICs) at the bare die stage, which includes "a testing station at which microbumps of conductive material are located on interconnection trace terminations of a multilayer interconnection structure, these terminations being distributed in a pattern corresponding to the pattern of contact pads on the die to be tested. To facilitate testing of the die before separation from a wafer using the microbumps, the other connections provided to and from the interconnection structure have a low profile."

D. Grabbe, I. Korsunsky and R. Ringler, *Surface Mount Electrical Connector*, U.S. Pat. No. 5,152,695 (6 Oct. 1992) disclose a connector for electrically connecting a circuit between electronic devices, in which "the connector includes a platform with cantilevered spring arms extending obliquely outwardly therefrom. The spring arms include raised contact surfaces and in one embodiment, the geometry of the arms provide compound wipe during deflection."

H. Iwasaki, H. Matsunaga, and T. Ohkubo, *Partly Replaceable Device for Testing a Multi-Contact Integrated Circuit Chip Package*, U.S. Pat. No. 5,847,572 (8 Dec. 1998) disclose "a test device for testing an integrated circuit (IC) chip having side edge portions each provided with a set of lead pins. The test device comprises a socket base, contact units each including a contact support member and socket contact numbers, and anisotropic conductive sheet assemblies each including an elastic insulation sheet and conductive members. The anisotropic conductive sheet assemblies are arranged to hold each conductive member in contact with one of the socket contact members of the contact units. The test device further comprises a contact retainer detachably mounted on the socket base to bring the socket contact members into contact with the anisotropic sheet assemblies to establish electrical communication between the socket contact members and the conductive members of the anisotropic conductive sheet assemblies. Each of the contact units can be replaced by a new contact unit if the socket contact members partly become fatigued, thereby making it possible to facilitate the maintenance of the test device. Furthermore, the lead pins of the IC chip can be electrically connected to a test circuit board with the shortest paths formed by part of the socket contact members and the conductive members of the anisotropic conductive sheet assemblies."

W. Berg, *Method of Mounting a Substrate Structure to a Circuit Board*, U.S. Pat. No. 4,758,927 (19 Jul. 1988) discloses "a substrate structure having contact pads is mounted to a circuit board which has pads of conductive material exposed at one main face of the board and has registration features which are in predetermined positions relative to the contact pads of the circuit board. The substrate structure is provided with leads which are electrically connected to the contact pads of the substrate structure and project from the substrate structure in cantilever fashion. A registration element has a plate portion and also has registration features which are distributed about the plate portion and are engageable with the registration features of the circuit board, and when so engaged, maintain the registration element against movement parallel to the general plane of the circuit board. The substrate structure is attached to the plate portion of the registration element so that the leads are in predetermined position relative to the registration features of the circuit board, and in this position of the registration element the leads of the substrate structure overlie the contact pads of the circuit board. A clamp member maintains the leads in electrically conductive pressure contact with the contact pads of the circuit board."

D. Sarma, P. Palanisamy, J. Hearn and D. Schwarz, *Controlled Adhesion Conductor*, U.S. Pat. No. 5,121,298 (9 Jun. 1992) disclose "Compositions useful for printing controllable adhesion conductive patterns on a printed circuit board include finely divided copper powder, a screening agent and a binder. The binder is designed to provide controllable adhesion of the copper layer formed after sintering to the substrate, so that the layer can lift off the substrate in response to thermal stress. Additionally, the binder serves to promote good cohesion between the copper particles to provide good mechanical strength to the copper layer so that it can tolerate lift off without fracture."

R. Mueller, *Thin-Film Electrothermal Device*, U.S. Pat. No. 4,423,401 (27 Dec. 1983) discloses "A thin film multilayer technology is used to build micro-miniature electromechanical switches having low resistance metal-to-metal contacts and distinct on-off characteristics. The switches, which are electrothermally activated, are fabricated on conventional hybrid circuit substrates using processes compatible with those employed to produce thin-film circuits. In a preferred form, such a switch includes a cantilever actuator member comprising a resiliently bendable strip of a hard insulating material (e.g. silicon nitride) to which a metal (e.g. nickel) heating element is bonded. The free end of the cantilever member carries a metal contact, which is moved onto (or out of) engagement with an underlying fixed contact by controlled bending of the member via electrical current applied to the heating element."

S. Ibrahim and J. Elsner, *Multi-Layer Ceramic Package*, U.S. Pat. No. 4,320,438 (16 Mar. 1982) disclose "In a multilayer package, a plurality of ceramic lamina each has a conductive pattern, and there is an internal cavity of the package within which is bonded a chip or a plurality of chips interconnected to form a chip array. The chip or chip array is connected through short wire bonds at varying lamina levels to metallized conductive patterns thereon, each lamina level having a particular conductive pattern. The conductive patterns on the respective lamina layers are interconnected either by tunneled through openings filled with metallized material, or by edge formed metallizations so that the conductive patterns ultimately connect to a number of pads at the undersurface of the ceramic package mounted onto a metalized board. There is achieved a high component density; but because connecting leads are "staggered" or connected at alternating points with wholly different package levels, it is possible to maintain a 10 mil spacing and 10 mil size of the wire bond lands. As a result, there is even greater component density but without interference of wire bonds one with the other, this factor of interference being the previous limiting factor in achieving high component density networks in a multi-layer ceramic package."

F. McQuade, and J. Lander, *Probe Assembly for Testing Integrated Circuits*, U.S. Pat. No. 5,416,429 (16 May 1995) disclose a probe assembly for testing an integrated circuit, which "includes a probe card of insulating material with a central opening, a rectangular frame with a smaller opening attached to the probe card, four separate probe wings each comprising a flexible laminated member having a conductive ground plane sheet, an adhesive dielectric film adhered to the ground plane, and probe wing traces of spring alloy copper on the dielectric film. Each probe wing has a cantilevered leaf spring portion extending into the central opening and terminates in a group of aligned individual probe fingers provided by respective terminating ends of said probe wing traces. The probe fingers have tips disposed substantially along a straight line and are spaced to correspond to the spacing of respective contact pads along the edge of an IC being tested. Four spring clamps each have a cantilevered portion which contact the leaf spring portion of a respective probe wing, so as to provide an adjustable restraint for one of the leaf spring portions. There are four separate spring clamp adjusting means for separately adjusting the pressure restraints exercised by each of the spring clamps on its respective probe wing. The separate spring clamp adjusting means comprise spring biased platforms each attached to the frame member by three screws and spring washers so that the spring clamps may be moved and oriented in any desired direction to achieve alignment of the position of the probe finger tips on each probe wing".

D. Pedder, *Structure for Testing Bare Integrated Circuit Devices*, European Patent Application No. EP 0 731 369 A2 (Filed 14 Feb. 1996), U.S. Pat. No. 5,764,070 (9 Jun. 1998) discloses a test probe structure for making connections to a bare IC or a wafer to be tested, which comprises "a multilayer printed circuit probe arm which carries at its tip an MCM-D type substrate having a row of microbumps on its underside to make the required connections. The probe arm is supported at a shallow angle to the surface of the device or wafer, and the MCM-D type substrate is formed with the necessary passive components to interface with the device under test. Four such probe arms may be provided, one on each side of the device under test".

B. Eldridge, G. Grube, I. Khandros, and G. Mathieu, *Method of Mounting Resilient Contact Structure to Semiconductor Devices*, U.S. Pat. No. 5,829,128 (3 Nov. 1998), *Method of Making Temporary Connections Between Electronic Components*, U.S. Pat. No. 5,832,601 (10 Nov. 1998), *Method of Making Contact Tip Structures*, U.S. Pat. No. 5,864,946 (2 Feb. 1999), *Mounting Spring Elements on Semiconductor Devices*, U.S. Pat. No. 5,884,398 (23 Mar. 1999), *Method of Burning-In Semiconductor Devices*, U.S. Pat. No. 5,878,486 (9 Mar. 1999), and *Method of Exercising Semiconductor Devices*, U.S. Pat. No. 5,897,326 (27 Apr. 1999), disclose "Resilient contact structures are mounted directly to bond pads on semiconductor dies, prior to the dies being singulated (separated) from a semiconductor wafer. This enables the semiconductor dies to be exercised (e.g. tested and/or burned-in) by connecting to the semiconductor dies with a circuit board or the like having a plurality of terminals disposed on a surface thereof. Subsequently, the semiconductor dies may be singulated from the semiconductor wafer, whereupon the same resilient contact structures can be used to effect interconnections between the semiconductor dies and other electronic components (such a wiring substrates, semiconductor packages, etc.). Using the all-metallic composite interconnection elements of the present invention as the resilient contact structures, burn-in can be performed at temperatures of at least 150° C., and can be completed in less than 60 minutes". While the contact tip structures disclosed by B. Eldridge et al. provide resilient contact structures, the structures are each individually mounted onto bond pads on semiconductor dies, requiring complex and costly fabrication. As well, the contact tip structures are fabricated from wire, which often limits the resulting geometry for the tips of the contacts. Furthermore, such contact tip structures have not been able to meet the needs of small pitch applications (e.g. typically on the order of 50 µm spacing for a peripheral probe card, or on the order of 75 µm spacing for an area array).

T. Dozier II, B. Eldridge, G. Grube, I. Khandros, and G. Mathieu, *Sockets for Electronic Components and Methods of Connecting to Electronic Components*, U.S. Pat. No. 5,772,451 (30 Jun. 1998) disclose "Surface-mount, solder-down sockets permit electronic components such as semiconductor packages to be releaseably mounted to a circuit board. Resilient contact structures extend from a top surface of a support substrate, and solder-ball (or other suitable) contact structures are disposed on a bottom surface of the support substrate. Composite interconnection elements are used as the resilient contact structures disposed atop the support substrate. In any suitable manner, selected ones of the resilient contact structures atop the support substrate are connected, via the support substrate, to corresponding ones of the contact structures on the bottom surface of the support substrate. In an embodiment intended to receive an LGA-type semiconductor package, pressure contact is made between the resilient contact structures and external connection points of the semiconductor package with a contact force which is generally normal to the top surface of the support substrate. In an embodiment intended to receive a BGA-type semiconductor package, pressure contact is made between the resilient contact structures and external connection points of the semiconductor package with a contact force which is generally parallel to the top surface of the support substrate".

Other emerging technologies have disclosed probe tips on springs which are fabricated in batch mode processes, such as by thin-film or micro electronic mechanical system (MEMS) processes.

D. Smith and S. Alimonda, *Photolithographically Patterned Spring Contact*, U.S. Pat. No. 5,613,861 (25 Mar. 1997), U.S. Pat. No. 5,848,685 (15 Dec. 1998), and International Patent Application No. PCT/US 96/08018 (Filed 30 May 1996), disclose a photolithography patterned spring contact, which is "formed on a substrate and electrically connects contact pads on two devices. The spring contact also compensates for thermal and mechanical variations and other environmental factors. An inherent stress gradient in the spring contact causes a free portion of the spring to bend up and away from the substrate. An anchor portion remains fixed to the substrate and is electrically connected to a first contact pad on the substrate. The spring contact is made of an elastic material and the free portion compliantly contacts a second contact pad, thereby contacting the two contact pads." While the photolithography patterned springs, as disclosed by Smith et al., are capable of satisfying many IC probing needs, the springs are small, and provide little vertical compliance to handle the planarity compliance needed in the reliable operation of many current IC prober systems. Vertical compliance for many probing systems is typically on the order of 0.004"-0.010", which often requires the use of tungsten needle probes.

The round trip transit time between the device under test and conventional test equipment is often longer then the stimulus to response times of high speed electronic circuits. It would be advantageous to provide a test interface system which reduces this transit time, by placing high speed test electronics in close proximity of the device under test, while meeting space and cost constraints. Furthermore, it would be advantageous to provide a test interface system which minimizes the cost, complexity, tooling, and turn around time required to change the test structure for the testing of different devices. The development of such a system would constitute a major technological advance.

It would be advantageous to provide a test interface system which provides probe contact with many, hundreds, or even hundreds of thousands of pads for one or more devices on a semiconductor wafer, such as for massively parallel testing and/or burn-in applications, wherein the pads may be in close proximity of one another, with a minimum spacing approaching 1 mil or less, while providing a uniform force across all probes over the entire wafer. It would also be advantageous to provide such a test interface system which organizes and manages the interconnections between the device under test and the tester electronics, while maintaining signal integrity and power and ground stability, and assures that no two or more adjacent pads are contacted by a single test probe tip. Furthermore, it would be advantageous to provide such a test structure which preferably provides planarity compliance with the devices under test. The development of such a system would constitute a further technological advance.

In addition, it would be advantageous to provide such a test system which preferably provides continuous contact with many, hundreds, or even hundreds of thousands of pads for one or more devices on a semiconductor wafer over a wide temperature range, while providing thermal isolation between the test electronics and the devices under test. As well, it would be advantageous to provide a system for separate thermal control of the test system and of the devices under test.

It would also be advantageous to provide a test interface system which may be used to detect power to ground shorts in any die quickly, and to isolate power from a die having a detected power to ground short, before damage is done to the test electronics. In addition, it would be advantageous to provide a test interface structure which can detect that the contacts to many, hundreds, or even hundreds of thousands of pads are reliably made and are each of the contacts are within the contact resistance specification, to assure that the self inductance and self capacitance of each signal line are below values that would adversely affect test signal integrity, and to assure that the mutual inductance and mutual capacitance between pairs of signal lines and between signal lines and power or ground lines are below values that would adversely affect test signal integrity. As well, it would also be advantageous to provide a test interface structure which provides stimulus and response detection and analysis to many, hundreds, or even hundreds of thousands, of die under test in parallel, and which preferably provides diagnostic tests to a failed die, in parallel with the continued testing of all other die.

Furthermore, it would be advantageous to provide a large array interface system which can reliably and repeatedly establish contact to many, hundreds, or even hundreds of thousands of pads, without the need to periodically stop and inspect and/or clean the probe interface structure.

It would also be advantageous to provide a system for massively parallel interconnections between electrical components, such as between computer systems, which utilize spring probes within the interconnection structure, to provide high pin counts, small pitches, cost-effective fabrication, and customizable spring tips. The development of such a method and apparatus would constitute a major technological advance.

SUMMARY OF THE INVENTION

Several embodiments of massively parallel interface integrated circuit test assemblies are disclosed, which use one or more substrates to establish connections between one or more integrated circuits on a semiconductor wafer, and use one or more test modules which are electrically connected to the integrated circuits on the semiconductor wafer through the substrates. One or more layers on the intermediate substrates preferably include MEMS and/or thin-film fabricated spring probes. The massively parallel interface assemblies provide tight pad pitch and compliance, and preferably enable the parallel testing or burn-in of multiple ICs. In some preferred embodiments, the massively parallel interface assembly structures include separable standard electrical connector components, which reduces assembly manufacturing cost and manufacturing time. These massively parallel interface structures and assemblies enable high speed testing in wafer form, and allow test electronics to be located in close proximity to the wafer. Preferred embodiments of the massively parallel interface assemblies provide thermal expansion matching to the wafer under test, and provide a thermal path for system electronic. Alternate massively parallel interface structures provide massively parallel connection interfaces, which may be used in a wide variety of circuitry, such as for interconnecting computers in a network, or for interconnecting other electronic circuitry.

BRIEF DESCRIPTION OF THE DRAWINGS

FIG. 1 is a plan view of a linear array of photolithographically patterned springs, prior to release from a substrate;

FIG. 2 is a perspective view of a linear array of photolithographically patterned springs, after release from a substrate;

FIG. 3 is a side view of a first, short length photolithographically patterned spring, having a first effective radius and height after the short length spring is released from a substrate;

FIG. 4 is a side view of a second, long length photolithographically patterned spring, having a second large effective radius and height after the long length spring is released from a substrate;

FIG. 5 is a perspective view of opposing photolithographic springs, having an interleaved spring tip pattern, before the springs are released from a substrate;

FIG. 6 is a perspective view of opposing photolithographic springs, having an interleaved spring tip pattern, after the springs are released from a substrate;

FIG. 7 is a top view of a first opposing pair of interleaved multiple-point photolithographic spring probes, in contact with a single trace on an integrated circuit device, and a second opposing pair of interleaved multiple-point photolithographic spring probes, in contact with a single pad on the integrated circuit device;

FIG. 8 is a plan view of opposing single-point photolithographic spring probes, before the springs are released from a substrate;

FIG. 9 is a top view of parallel and opposing single-point photolithographic spring probes, after the springs are released from a substrate, in contact with a single pad on an integrated circuit device;

FIG. 10 is a front view of a shoulder-point photolithographic spring probe;

FIG. 11 is a partial cross-sectional side view of a shoulder-point photolithographic spring in contact with a trace on an integrated circuit device;

FIG. 12 is a perspective view of a multiple shoulder-point photolithographic spring probe;

FIG. 20 is a partial cross-sectional view of one embodiment of the flexible circuit structure;

FIG. 21 is a partial cross-sectional view of an alternate embodiment of the flexible circuit, which comprises a flex circuit membrane structure;

FIG. 22 is a partial perspective view of a flexible membrane circuit structure, wherein a flexible region is defined as an extension of the electronic test card structure;

FIG. 23 is a partial perspective view of an alternate flexible circuit structure, wherein a flexible circuit is attached to an electronic test card structure;

FIG. 24 is a partial cross-sectional view of one embodiment of a preferred flex circuit region of a test electronics module, in which the flex circuit is wrapped around the power and ground buss structure, and which preferably includes a thermal path across the flex circuit between a power module and a buss bar;

FIG. 25 is a partial cross-sectional view of an alternate embodiment of the flex circuit region of a test electronics module, in which a plurality of power modules mounted on the inner surface of a flex circuit are positioned in thermal contact with a plurality of buss bars;

FIG. 26 is a partial cross-sectional view of a second alternate embodiment of the flex circuit region of a test electronics module, in which a power module is electrically connected to the outer surface of a flex circuit, and is positioned in thermal contact with a buss bar;

FIG. 27 is a perspective view of an alternate embodiment of a test electronics module, in which an integrated module base provides a pad matrix on a first planar region, and in which a power module is electrically connected to the pad matrix and to one or more buss bars, and is positioned in thermal contact with a buss bar;

FIG. 28 is a partial cutaway assembly view of an alternate massively parallel test assembly having an intermediate system board, in which flexible spring probes are located on the lower surface of the system board;

FIG. 29 is a partial cutaway assembly view of another alternate massively parallel test assembly having an intermediate system board, in which an interposer structure provides electrical connections between the substrate and the system board;

FIG. 30 is a partial cutaway assembly view of a basic massively parallel test assembly, in which a substrate having spring probes is directly connected to the test electronics modules;

FIG. 31 is a partial expanded cross-sectional view of a basic massively parallel test assembly, which shows staged pitch and distribution across a substrate and a flex circuit having a pad matrix;

FIG. 32 is a partial cutaway assembly view of a massively parallel burn-in test assembly, in which burn-in test modules are connected directly to the system board, and in which separate temperature control systems are provided for the wafer under test and for the test electronics modules;

FIG. 39 is a schematic block diagram of connections between a plurality of electronic circuits, using a massively parallel interface assembly.

DETAILED DESCRIPTION OF PREFERRED EMBODIMENTS

Figure 13:
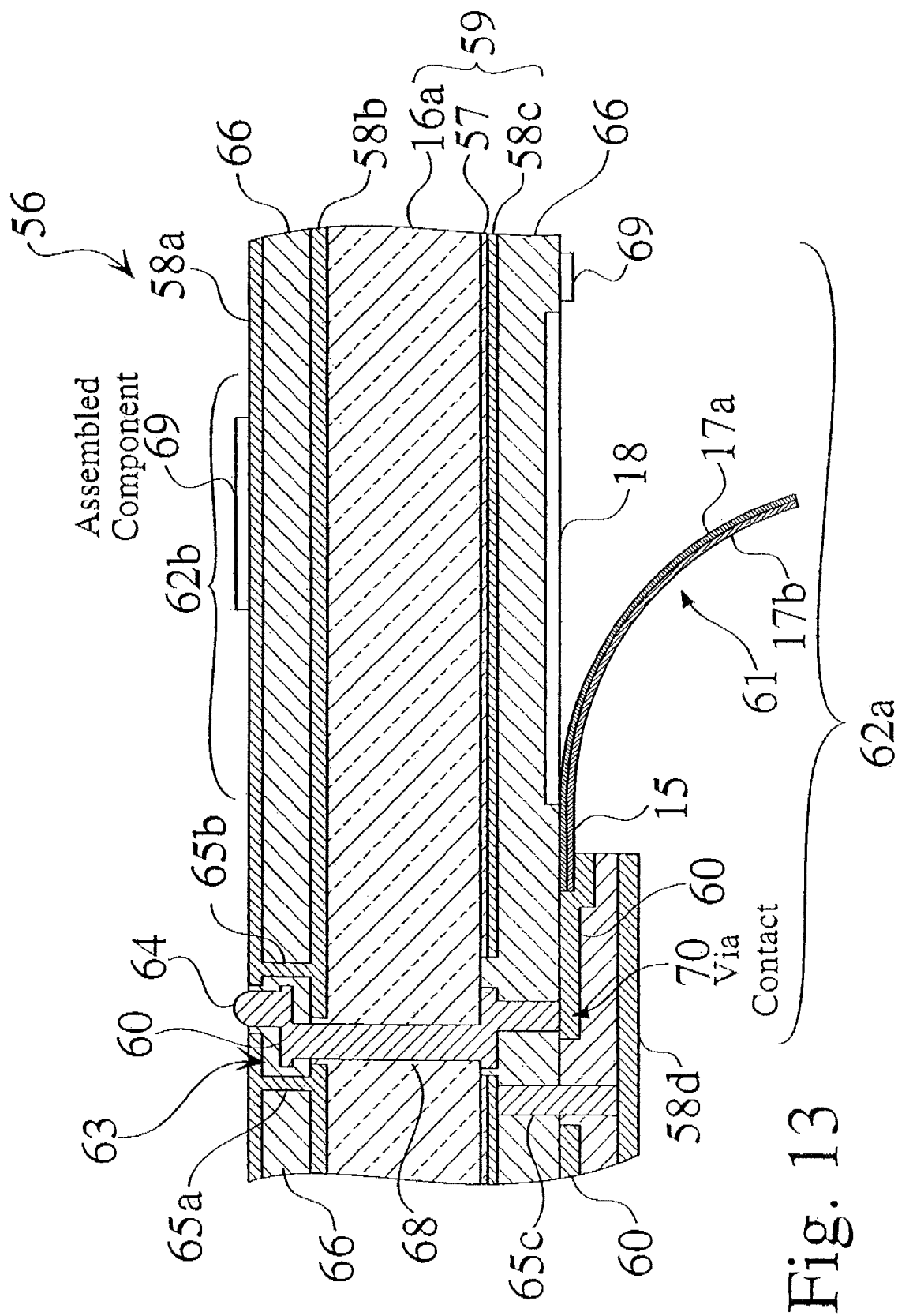
FIG. 13 is a partial cross-sectional view of a multi-layered spring probe substrate providing controlled impedance and integrated components.

FIG. 1 is a plan view 10 of a linear array 12 of photolithographically patterned springs 14a-14n, prior to release from a substrate 16. The conductive springs 14a-14n are typically formed on the substrate layer 16, by successive layers of deposited metal 17 (e.g. such as layers 17a,17b in FIG. 13), such as through low and high energy plasma and sputter deposition processes, followed by photolithographic patterning, as is widely known in the semiconductor industry. The successive layers 17 have different inherent levels of stress. The release regions 18 of the substrate 16 are then processed by undercut etching, whereby portions of the spring contacts 14a-14n, which are located over the release regions 18, are released from the substrate 16 and extend (i.e. bend) away from the substrate 16, as a result of the inherent stresses between the deposited metallic layers. Fixed regions 15 (FIG. 3, FIG. 4) of the deposited metal traces remain affixed to the substrate 16, and are typically used for routing (i.e. such as for redistribution or fan-out) from the spring contacts 14a-14n. FIG. 2 is a perspective view 22 of a linear array 12 of photolithographically patterned springs 14a-14n, after release from a substrate 16. The spring contacts 14a-14n may be formed in high density arrays, with a fine pitch 20, currently on the order of 0.001 inch.

FIG. 3 is a side view 26a of a first photolithographically patterned spring 14 having a short length 28a, which is formed to define a first effective spring angle 30a (which can be from a few degrees to a full circle), spring radius 31a, and spring height 32a, after the patterned spring 14 is released from the release region 18a of the substrate 16, away from the planar anchor region 15. FIG. 4 is a side view 26b of a second photolithographically patterned spring 14, having a long spring length 28b, which is formed to define a second large effective spring angle 30b, spring radius 31b and spring height 32b, after the patterned spring 14 is released from the release region 18b of the substrate 16. The effective geometry of the formed spring tips 14 is highly customizable, based upon the intended application. As well, the spring tips are typically flexible, which allows them to be used for many applications.

Figure 18:
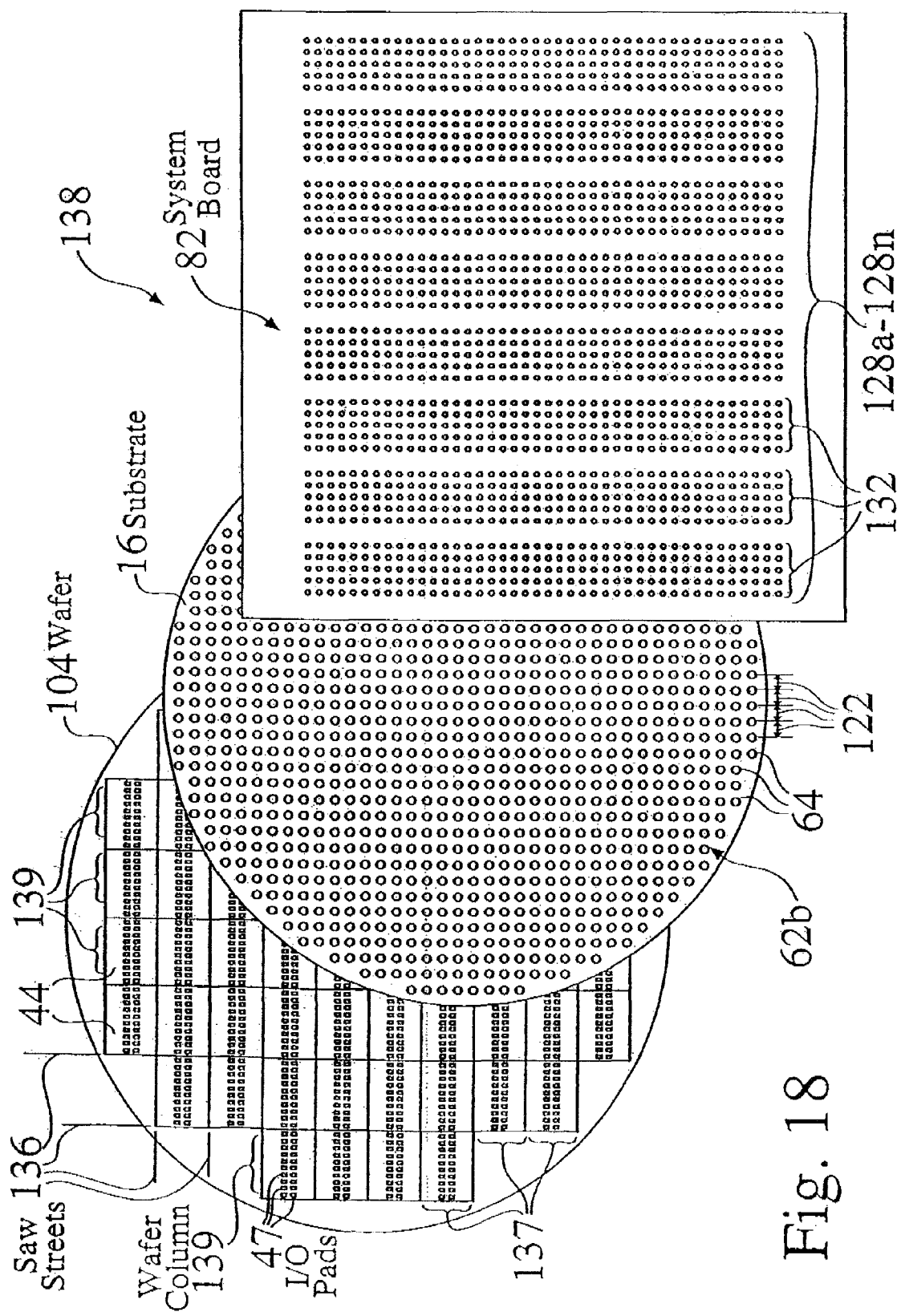
FIG. 18 is an expanded layer plan view of a wafer, a circular substrate, and a rectangular system board.
Figure 19:
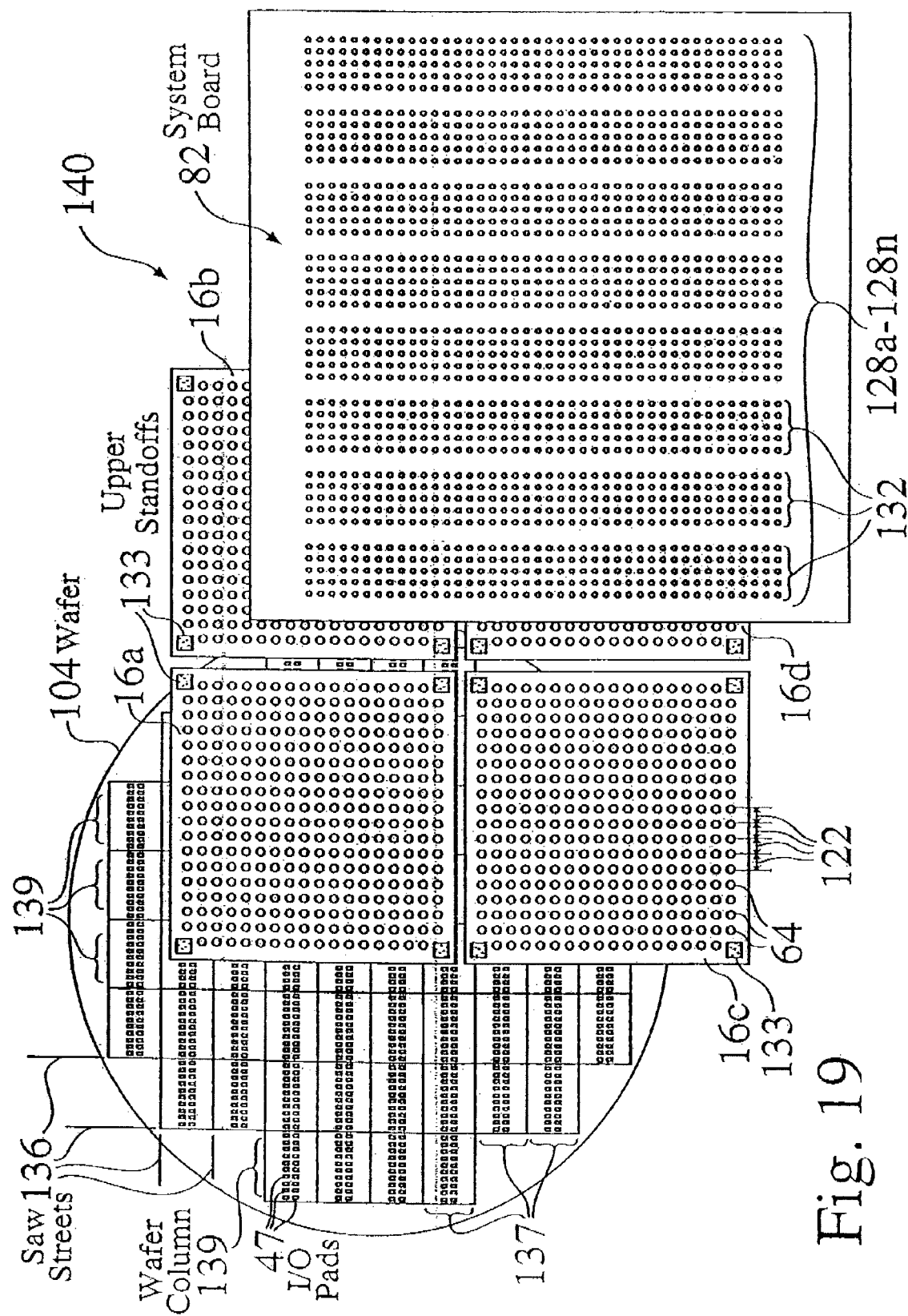
FIG. 19 is an expanded layer plan view of a wafer, a plurality of rectangular substrates, and a rectangular system board.

Patterned spring probes 14 are capable of very small spring to spring pitch 20, which allows multiple spring probes 14 to be used to contact power or ground pads on an integrated circuit device 44 (FIG. 18, FIG. 19), thereby improving current carrying capability. As well, for a massively parallel interconnect assembly 78 (e.g. 78a, FIG. 15) having an array 12 (FIG. 1) of spring probes 14, multiple spring probes 14 may be used to probe I/O pads 47 on an IC substrate 48 (FIG. 9), such as on an integrated circuit device under test (DUT) 44 (FIG. 18, FIG. 19). Every spring probe contact 14 to be verified for continuity after engagement of the spring contacts 14 to the wafer 104 under test (FIG. 15), thereby ensuring complete electrical contact between a massively parallel interface assembly 78 and a devices 44 on a wafer 104 (FIG. 15), before testing procedures begin.

Improved Structures for Miniature Springs. FIG. 5 is a first perspective view of opposing photolithographic springs 34a, 34b, having an interleaved spring tip pattern, before spring to substrate detachment. FIG. 6 is a perspective view of opposing interleaved photolithographic springs 34a, 34b, after spring to substrate detachment.

The interleaved photolithographic springs 34a, 34b each have a plurality of spring contact points 24. When spring contacts are used for connection to power or ground traces 46 or pads 47 of an integrated circuit device 44, the greatest electrical resistance occurs at the point of contact. Therefore, an interleaved spring contact 34, having a plurality of contact points 24, inherently lowers the resistance between the spring contact 34 and a trace 46 or pad 47. As described above, multiple interleaved spring probes 34 may be used for many applications, such as for high quality electrical connections for an integrated circuit device 44, or for a massively parallel interface assembly 78 (FIG. 15), such as for probing an integrated circuit device 44 during testing.

FIG. 7 is a top view 42 of opposing interleaved photolithographic spring pairs 34a,34b in contact with the same traces 46 or pads 47 on an integrated circuit device under test (DUT) 44. The interleaved spring contact pair 34a and 34b allows both springs 34a and 34b, each having a plurality of contact points 24, to contact the same trace 46 or pad 47. As shown in FIG. 5, when a zig-zag gap 38 is formed between the two springs 34a,34b on a substrate 16, multiple tips 24 are established on each spring 34a,34b. Before the interleaved spring probes 34a,34b are released from the substrate 16, the interleaved points 24 are located within an overlapping interleave region 36. When the interleaved spring probes 34a,34b are released from the substrate 16, the interleaved spring points 24 remain in close proximity to each other, within a contact region 40, which is defined between the springs 34a, 34b. The interleaved spring contact pair 34a and 34b may then be positioned, such that both interleaved spring probes 34a and 34b contact the same trace 46, such as for a device under test 44, providing increased reliability. As well, since each interleaved spring 34a,34b includes multiple spring points 24, contact with a trace 46 is increased, while the potential for either overheating or current arcing across the multiple contact points 24 is minimized.

FIG. 8 is a top view of parallel and opposing single-point photolithographic springs 14, before the springs 14 are released from a substrate 16. As described above for interleaved springs 34a, 34b, parallel springs 14 may also be placed such that the spring tips 24 of multiple springs contact a single trace 46 on a device 44. As well, opposing spring probes 14 may overlap each other on a substrate 16, such that upon release from the substrate 16 across a release region 18, the spring tips 24 are located in close proximity to each other. FIG. 9 is a top view of parallel and opposing parallel single-point photolithographic springs 14, after the springs 14 are released from the substrate 16, wherein the parallel and opposing parallel single-point photolithographic springs 14 contact a single pad 47 on an integrated circuit device 44.

FIG. 10 is a front view of a shoulder-point photolithographic spring 50, having a point 52 extending from a shoulder 54. FIG. 11 is a partial cross-sectional side view of a shoulder-point photolithographic spring 50, in contact with a trace 46 on an integrated circuit device. FIG. 12 is a perspective view of a multiple shoulder-point photolithographic spring 50. Single point spring probes 14 typically provide good physical contact with conductive traces 46 on an integrated circuit device 22, often by penetrating existing oxide layers on traces 46 or pads 47 by a single, sharp probe tip 24. However, for semiconductor wafers 104 or integrated circuit devices having thin or relatively soft traces 46 or pads 47, a single long probe tip 24 may penetrate beyond the depth of the trace 46, such as into the IC substrate 48, or into other circuitry.

Shoulder-point photolithographic springs 50 therefore include one or more extending points 52, as well as a shoulder 54, wherein the points 52 provide desired penetration to provide good electrical contact to traces 46, while the shoulder 54 prevents the spring 50 from penetrating too deep into a device 44 or wafer 104. Since the geometry of the spring probes 50 are highly controllable by photolithographic screening and etching processes, the detailed geometry of the shoulder-point photolithographic spring 50 is readily achieved.

FIG. 13 shows a partial cross-sectional view 56 of an ultra high frequency spring probe substrate 16. For embodiments wherein a spring probe 61 and related electrical conductors 60, 68, 64 on and through the substrate 16 are required to be impedance matched, one or more conductive reference surfaces 58a,58b,58c,58d and vias 65a,65b,65c may preferably be added, either within or on the substrate 16. The substrate 16 may also contain alternating ground reference traces 62a, 62b, which are connected to reference planes 58a,58b,58c, to effectively provide a shielded coaxial transmission line environment 63. As well, the impedance control surfaces 58a,58b, 58c,58d are not limited to the planar surfaces shown in FIG. 13.

An insulating layer 66 may be deposited on a portion the probe spring 61, such as on the fixed region of the probe spring 61, up to but not enclosing the tip 24 (FIG. 2), as well as on the trace 60, which connects the spring probe 61 to the via 68. A conductive layer 58d may be deposited on top of the insulating layer 66, to provide a coaxial, controlled low impedance connection. Alternate layers of conductive materials 58 and dielectric materials 66 can preferably be integrated within the substrate 16, such as for embodiments which require decoupling capacitors in close proximity to a probe spring 61. For a substrate 16 which is a conductive material, such as silicon, a thin oxide layer 57 may preferably be deposited between the substrate 16 and a conductive reference plane 58c, thereby forming a high capacitance structure 59 between the spring probe 61 and the ground planes 58a and 58b. As well, one or more assembled components 69, such as passive components 69 (e.g. typically capacitors, resistors, and/or inductors), or active component devices 69, may be incorporated on either surface 62a,62 of the substrate.

The fixed portions 15 of the spring probes 61 typically extend a relatively short distance across the substrate 16. Traces 60 located on the surface of the substrate 16 are electrically connected to the fixed portions 15 of the spring probes 61, and electrically connect the probe springs 61 to the vias 68. The traces may be comprised of a different material than the spring probes 61, and are preferably comprised of metals having high electrical conductivity (e.g. such as copper or gold).

Figure 14:
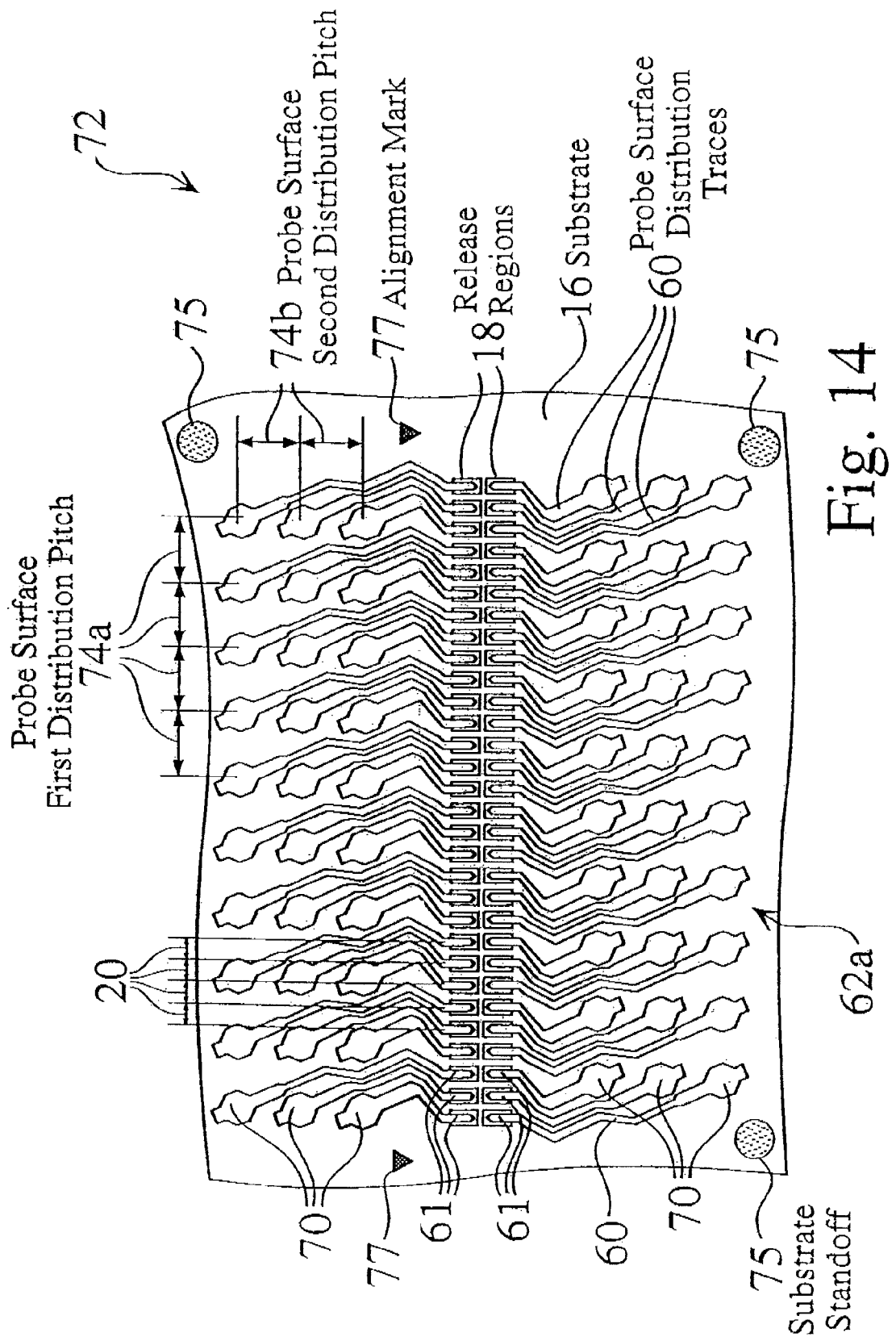
FIG. 14 is a partial plan view of a substrate, in which a plurality of trace distribution regions are defined on the probe surface of the substrate, between a plurality of spring probes and a plurality of via contacts.

FIG. 14 is a partial plan view 72 of a substrate 16, in which a plurality of distribution fanout traces 60 are defined on the probe surface 62a of the substrate 16, between a plurality of spring probes 61 and a plurality of via contacts 70. As described above, the spring probes 61, which are preferably photolithographically formed springs 61, may currently be formed with a pitch of approximately 0.001 inch. The traces 60 are preferably routed on the probe surface 62a, to connect to via contact areas 70, which are preferably laid out in a matrix across the surface of the substrate 16. In the substrate 16 shown in FIG. 14, the via contact areas 70 are positioned with a probe surface first distribution pitch 74a, and a probe surface second distribution pitch 74b.

As the size and design of integrated circuit devices 44 becomes increasingly small and complex, the fine pitch 20 (FIG. 2) provided by miniature spring probe tips 61 becomes increasingly important. Furthermore, with the miniaturization of both integrated circuits 44 and the required test assemblies, differences in planarity between one or more integrated circuits 44 located on a wafer 104 and a substrate 16 containing a large number of spring probes 61 becomes critical.

As seen in FIG. 14, lower standoffs 75 are preferably provided on the probe surface 62a of the substrate 16, such as to prevent the substrate 16 from damaging a wafer under test 104, or to set the spring probe tips 24 to operate at an optimal contact angle. The lower standoffs 75 are preferably made of a relatively soft material, such as polyamide, to avoid damage to the semiconductor wafer under test 104. In addition, to further avoid damage to active circuits 44 in the semiconductor wafer 104, the standoffs 75 are preferably placed, such that when the massively parallel interface assembly 78 is aligned with a device 44 on a semiconductor wafer 104, the standoffs 75 are aligned with the saw streets 136 (FIG. 18, FIG. 19) on the semiconductor wafer 104, where there are no active devices 44 or test structures. Furthermore, the height of the lower standoffs 75 are preferably chosen to limit the maximum compression of the spring probes 61a-61n, thus preventing damage to the spring probes 61a-61n.

The substrate 16 also typically includes one or more alignment marks 77 (FIG. 14), preferably on the probe surface 62a, such that the probe surface 62a of the substrate 16 may be precisely aligned with a wafer to be tested 104.

Figure 15:
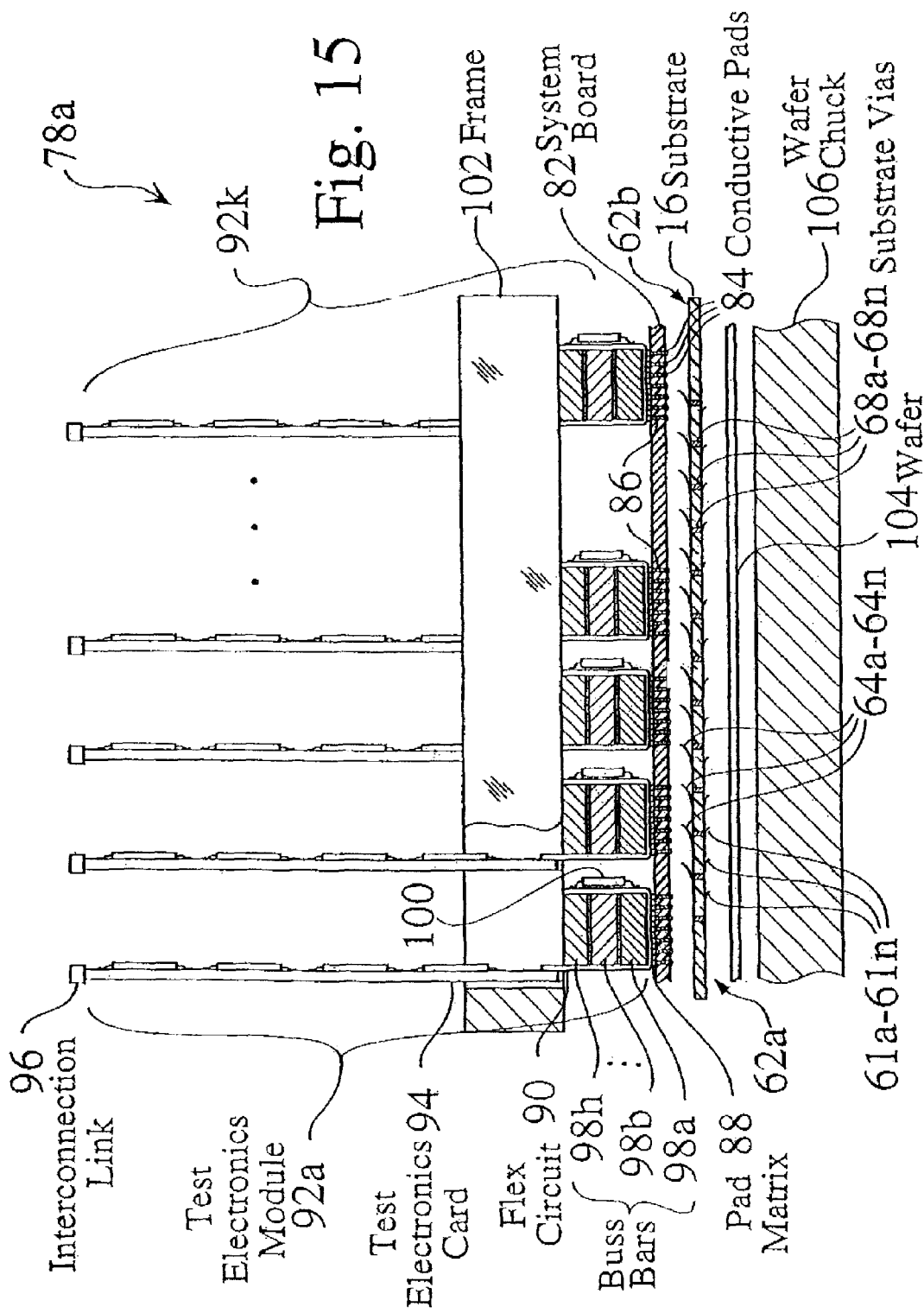
FIG. 15 is a partial cutaway assembly view of a massively parallel test assembly having test electronics located in close proximity to the wafer under test.
Figure 16:
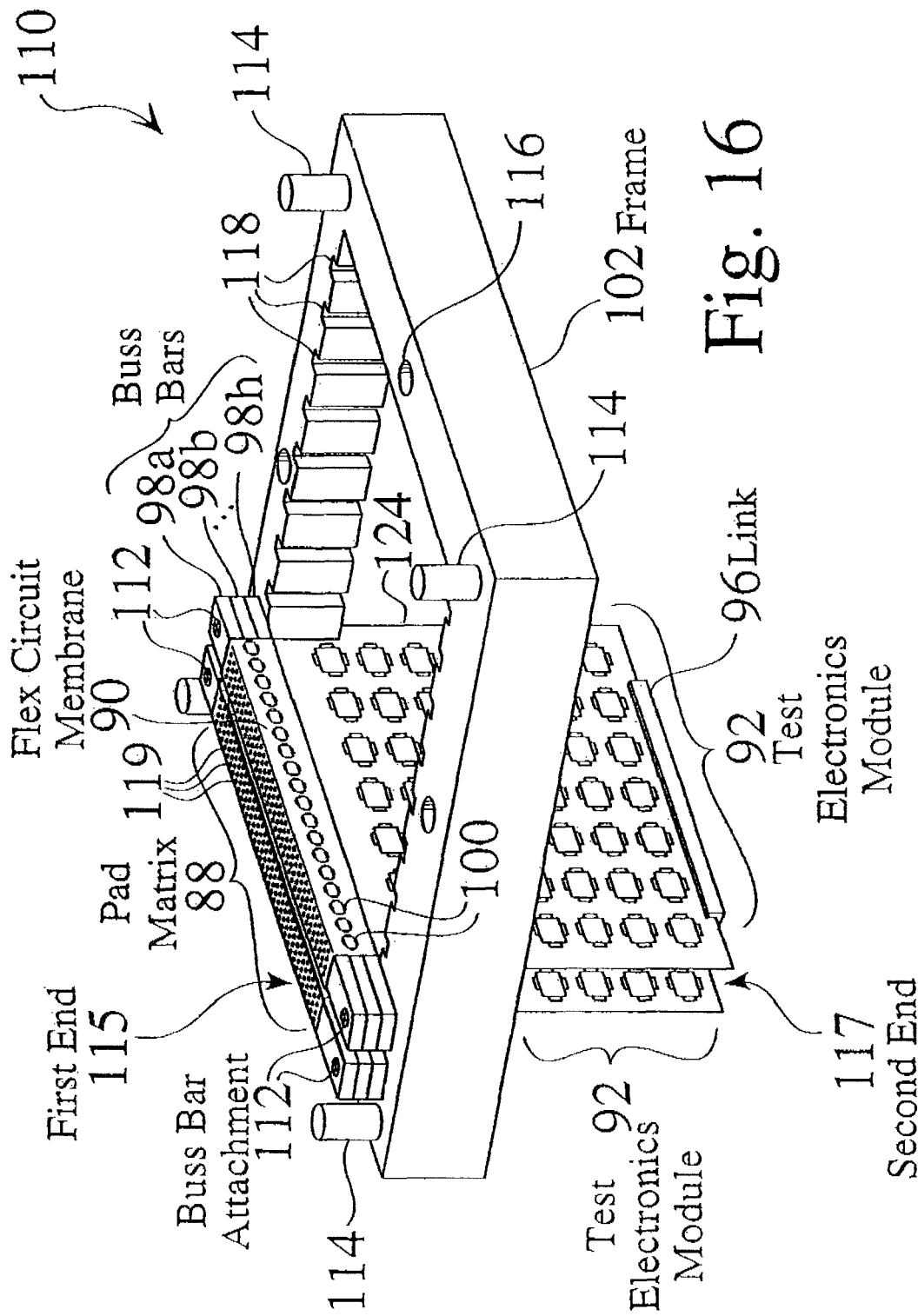
FIG. 16 is a partial perspective view of a massively parallel interconnection assembly.
Figure 17:
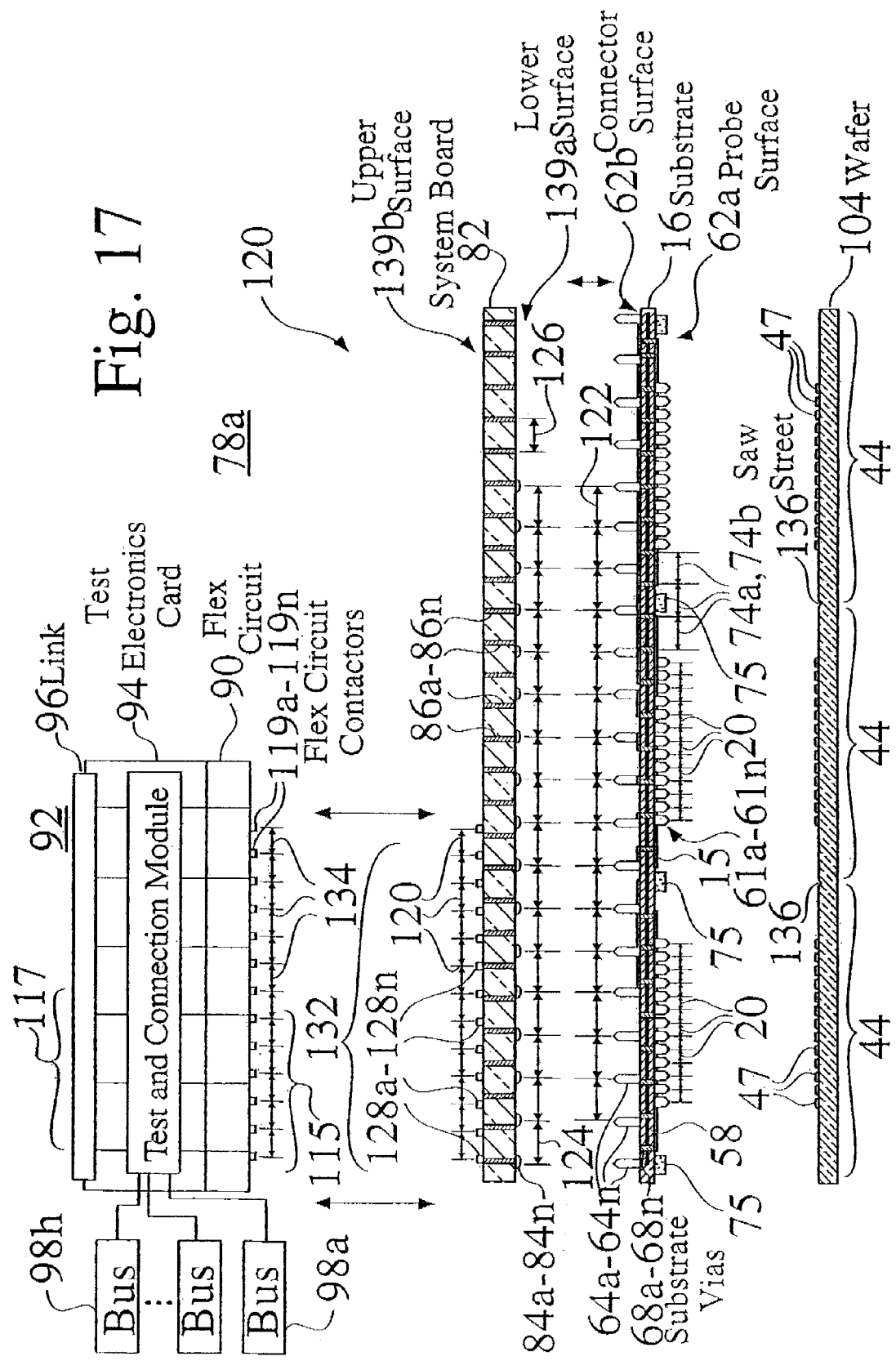
FIG. 17 is a partial expanded cross-sectional view of a massively parallel test assembly having an intermediate system board, which shows staged pitch and distribution across a substrate, a system board, and a flex circuit having a pad matrix.

Massively Parallel Interface Assemblies for Testing and Burn-In. FIG. 15 is a partial expanded cross-sectional view of a massively parallel test assembly 78a having an intermediate system board 82. FIG. 16 is a partial perspective view 110 of a massively parallel interface assembly 78a. FIG. 17 is a partial expanded cross-sectional view 120 of a massively parallel test assembly 78a having an intermediate system board 82, which shows staged pitch and distribution across a substrate 16, a system board 82, and a flex circuit 90 having a pad matrix 88 (FIG. 15) of electrical connectors 119a-119n. As shown in FIG. 15 and FIG. 17, the interface assembly 78a is typically positioned in relation to a semiconductor wafer 104, having one or more integrated circuits 44, which are typically separated by saw streets 136 (FIG. 18, FIG. 19).

The massively parallel interface assembly 78a provides electrical interconnections to a substrate 16, which may contain hundreds of thousands of spring probe tips 61a-61n, while providing adequate mechanical support for the interface assembly 78a, to work effectively in a typical integrated circuit testing environment. The interface assembly 78a is readily used for applications requiring very high pin counts, for tight pitches, or for high frequencies. As well, the interface assembly 78a is easily adapted to provide electrical contact for all traces 46 (FIG. 7) and input and output pads 47 (FIG. 7, FIG. 9) for one or more integrated circuit devices under test 44 on a wafer 104.

As seen in FIG. 15, a plurality of electrically conductive spring probe tips 61a-61n are located on the lower probe surface 62a of the substrate 16, and are typically arranged with a fine spring pitch 20 (FIG. 1, FIG. 17), which is typically required to interconnect to specific pads 47 (FIG. 17) on one or more devices under test 44 on a wafer 104. The spring probe tips 61a-61n may have a variety of tip geometries, such as single point springs 14, interleaved springs 34, or shoulder point springs 50, and are fabricated on the substrate 16, typically using thin-film or MEMS processing methods, to achieve low manufacturing cost, well controlled uniformity, very fine pad pitches 20, and large pin counts. In some embodiments, the flexible connections 64a-64n are built in compliance to photolithographic springs, such as described above, or as disclosed in either U.S. Pat. No. 5,848,685 or U.S. Pat. No. 5,613,861, which are incorporated herein by reference. The spring probes 61a-61n on the probe side 62a of the substrate 16 mate with pads 47 on each die 44 of the wafer 104.

The fixed trace portions 15,60 (FIG. 3, FIG. 14) are then preferably routed to a plurality of metalized vias 68a-68n, which are typically arranged with a substrate distribution pitch 74a,74b, such that the vias 68a-68n are preferably distributed relatively uniformly across the substrate 16. Electrically conductive traces 60 are preferably fabricated on one or both sides of the substrate 16, preferably providing a distribution of the conductive connections 64a-64n across the connector surface 62b of the substrate 16.

The probe tips 61a-61n are electrically connected to the electrically conductive connections 64a-64n, preferably through metalized vias 68a-68n within the substrate 16. Each of the plurality of electrically conductive connections 64a-64n are then electrically connected to a plurality of conductive pads 84a-84n on the lower surface 139a on a system board 82. The preferred metallized via electrical connections 68a-68n (e.g. such as produced by Micro Substrate Corporation, of Tempe, Ariz.) within the substrate 16, are typically fabricated using standard PTH methods, or extrusion methods, such as by first creating holes in the substrate 16, using laser or other drilling methods. The holes are then filled or plated with conductive material, such as by plating or by extrusion. After the conductive vias 68a-68n are formed, they are typically polished back, to provide a flat and smooth surface. Capacitors may preferably be mounted or built into the substrate 16 (FIG. 13), providing close proximity decoupling to the IC wafer 104 under test.

The substrate 16 is preferably comprised of silicon, glass, ceramic, ceramic glass, or other suitable substrate material, and preferably has a thermal coefficient of expansion (TCE) which matches the thermal coefficient of expansion (TCE) of the wafer 104. In some preferred embodiments of the parallel interface assembly 78, the substrate 16 is relatively thin, such that the substrate 16, the spring probes 61 a-61 n, and the preferred flexible connections 64a-64n provide enhanced planarity compliance to a wafer under test 104.

In an alternate embodiment of the substrate 16, a starting substrate 16 (e.g. such as a silicon substrate 16), is etched, such as by a plasma etching process or a wet anisotropic etching process, to create through holes (i.e. vias) in the substrate 16, as practiced in the MEMS industry. The substrate 16 may be thinned, such as by atmospheric plasma ion etching, prior to the creation of the through holes, such that fine pitch holes may be defined in the preferred silicon wafer 16, thereby creating a flexible substrate 16. The flexible substrate 16 is compliant to the surface of one or more devices under test 44 on a wafer 104, such as when a pressure differential (as described in reference to FIG. 32) is provided between the probe surface 62a and the connector surface 62b of the substrate 16. As described above, the holes are then filled or plated with conductive material, such as by plating or by extrusion. After the conductive vias 68a-68n are formed, they are typically polished back, to provide a flat and smooth surface. Capacitors may preferably be mounted or built into the substrate 16 (FIG. 13), providing close proximity decoupling to the IC wafer 104 under test.

The electrically conductive connections 64a-64n are located on the upper connector surface 62b of the substrate 16, and are connected to the vias 68a-68n. The electrically conductive connections 64a-64n are typically arranged with a connection pitch 122 (FIG. 17), which may be aligned with the substrate distribution pitch 74a,74b, or may preferably be redistributed on the upper connector surface 62b of the substrate 16. In some preferred embodiments of the substrate 16, the electrically conductive connections 64a-64n are preferably distributed relatively uniformly across the substrate 16.

The electrically conductive connections 64a-64n are preferably arranged within an area array, having an array pitch 122 such as 0.5 mm, 1.00 mm or 1.27 mm, which provides a reasonable density to mate to plated through-holes (PTH) 86a-86n on the system board 82 (which are typically arranged with a system board pitch 126), and allows the distribution of signals on multiple layers within the system board 82, without resorting to advanced system boards 82 containing blind conductive vias 86a-86n.

The electrically conductive connections 64a-64n, which contact conductive pads 84a-84n on the underside of the system board 82, maintain electrical connection between the substrate 16 and the system board 82. The electrically conductive connections 64a-64n also provide lateral compliance between a substrate 16 and a system board 82 having different thermal coefficients of expansion (e.g. such as for a low TCE substrate 16 and a relatively high TCE system board 82).

In an alternate embodiment of the massively parallel interface system 78b (FIG. 27) the spring probes 64a-64n on the connector 62b side of the substrate 16 mate directly to a pad matrix 88 on the test electronics modules 92a-92k.

The electrically conductive connections 64a-64n are preferably evenly distributed across the upper connector surface 62b of the substrate 16. Similarly, the conductive pads 84a-84n are preferably evenly distributed across the lower surface 139a of the system board 82. The distributed layout of the electrically conductive connections 64a-64n and the conductive pads 84a-84n provides a large connector pitch 122 and associated pad pitch 124 (e.g. typically on the order of 0.020-0.050 inch), whereby relatively large sized conductive pads 84a-84n and/or electrically conductive connections 64a-64n may be used. The distributed pitches 122,124 and relatively large connections promote high quality electrical connections between the substrate 16 and the system board 82 over a wide range of operating temperatures, even when the interface assembly 78a and wafer 104 are subjected to elevated temperatures, even for a substrate 16 and a system board 82 which are comprised of materials having different thermal coefficients of expansion (TCE).

The electrically conductive connections 64a-64n are connected to the system board 82, either permanently (e.g. such as by solder or conductive epoxy) or non-permanently (e.g. such as by corresponding metal pads which mate to the tips 24 of flexible spring probes 64a-64n).

In the preferred embodiment of the massively parallel interconnect assembly 78a shown in FIG. 15, the plurality of electrically conductive connections 64a-64n are flexible spring probes 64a-64n. In embodiments of the substrate 16 in which the electrically conductive connections 64a-64n are flexible electrically connections 64a-64n, the flexible electrically conductive connections 64a-64n are typically fabricated using a longer spring length 28 and a larger spring angle 30b (which can be up to 360 degrees), as compared to the spring probe tips 61a-61n, to provide a compliance of approximately 4-10 mils. In some embodiments, the flexible connections 64a-64n are typically built in compliance to photolithographic springs, such as described above, or as disclosed in either U.S. Pat. No. 5,848,685 or U.S. Pat. No. 5,613,861, which are incorporated herein by reference.

The conductive pads 84a-84n on the lower surface of the system board 82 are typically arranged with a pad pitch 124 (FIG. 17), such that the conductive pads 84a-84n are aligned with the electrically conductive connections 64a-64n located on the upper connector surface 62b of the substrate 16.

The conductive pads 84a-84n on the lower surface of the system board 82 are then routed to conductive paths 86a-86n, which are typically arranged with a system board pitch 126. The electrically conductive connections 128a-128n, which may be arranged within one or more connection regions 132, are located on the upper surface of the system board 82, and are routed to the conductive paths 86a-86n. The electrically conductive connections 128a-128n are typically arranged in within the connection region 132, with a system board pad matrix pitch 120, which is typically aligned with the flex circuit pad matrix pitch 134 for each of the test electronics modules 92a-92k.

The system board matrix pitch 120 is typically chosen such that the electrically conductive connections 128a-128n are aligned with the flex circuit electrical connectors 119a-119n located on the flex circuits 90, which are typically arranged in a plurality of pad matrices 88 (FIG. 16), having a flex circuit pad matrix pitch 134.

The test electronics modules 92a-92k are a basic building block for most of the embodiments of the massively parallel interface test assemblies 78a-78d. The test electronics modules 92a-92k are mounted in parallel (e.g. as seen in FIG. 15), to form an array of modules 92a-92k, which each provide electronics support to one or more columns 139 (FIG. 18, FIG. 19) on a wafer 104, or to a portion of a column 139 or die 44, along which the test electronics modules 92a-92k are mounted.

FIG. 16 is a partial perspective view 110 of a massively parallel interface assembly 78a, wherein test electronics modules 92 are mounted on a frame 102. Each of the test electronics modules 92 shown includes a preferred flex circuit 90, having a pad matrix 88 of electrical contactors 119, and one or more power control modules 100. The flex circuit 90 for each of the test electronics modules 92 is mounted on one or more buss bars 98a-98h, and extends downwardly through the frame 102. The buss bars 98a-98h are attached to the frame 102, such as by electrically isolated fasteners 112, thereby providing a substantially rigid structure. The frame 102 preferably includes test module alignment guides 118, as well as frame to system alignment pins 114 and means 116 for fastening the frame 102 to a wafer chuck 106 (FIG. 15). The assembly 110 may also preferably include other means for holding the test electronics modules 92a-92k, such as a card cage (not shown) located below the frame 102.

The substrate 16 interfaces to a system board 82, which provides a standard interface to the tester electronics, at a coarser pitch. It also makes the substrate 16 a basic replacement unit, such that only the substrate 16 is typically required to be changed for a new device under test (DUT) design 44, or if the spring probes 61 need to be replaced. The combined use of standard pitch system boards 82, with substrates 16 having fanout traces 60 to small pitch spring probes 61a-61n reduces both the cost and turnaround time for test and burn-in assemblies 78.

The system board 82, which is typically comprised of ceramic, high density printed wiring board, or glass board, provides a an alignment surface for the substrate 16. Due to the larger pitch 122,124 (FIG. 17) of the connection between the system board 82 and the substrate 16, this reference can typically be achieved by mechanical means. As well, the system board 82 provides the first level routing interface between the tester electronics modules 92a-92k and the substrate 16. Each of the tester electronics modules 92a-92n are attached to the system board 82, via a membrane or flex circuit 90.

In the interface assembly 78a shown in FIG. 15, the probe tips 61a-61n are flexible, which inherently provides planarity compliance between the substrate 16 and the semiconductor wafer 104. As well, the electrically conductive connections 64a-64n, which are also preferably flexible conductive springs 14, 34, 50, provide further planarity compliance between the substrate 16 and the semiconductor wafer 104. The interface assembly 78a therefore provides planarity compliance between a substrate 16 and a wafer 104. As well, the interface assembly 78a also accommodates differences in thermal coefficients of expansion (TCE) between the substrate 16 (which is typically comprised of ceramic, ceramic glass, glass, or silicon) and the system board 82 (which is typically comprised of glass epoxy material).

The flexible connections 64a-64n are preferably laid out on a standardized layout pattern, which can match standardized power and ground pad patterns (i.e. assignments) on the system board 82, thus allowing the same system board 82 to be used for substrates 16 laid out to mate to different integrated circuit devices 44. As a system board 82 may be adapted to specialized substrates 16, for the testing of a variety of different devices 44, the operating cost for a system board 82 is reduced.

Lower substrate standoffs 75, which are typically taller than other features on the substrate 16 (except for the spring tips 61a-61n), are preferably placed on the lower surface 62a of the substrate 16, preferably to coincide with the saw streets 94 on a semiconductor wafer under test 104, thereby preventing the wafer under test 104 from crashing into the substrate 16, and preventing damage to active regions on the semiconductor wafer 104.

Contact between test electronics modules 92a-92k and the system board 82 are achieved using solder, pressure contact, or spring probes 119,128. The spring probe tips 119,128 (FIG. 17) may have a variety of tip geometries, such as single point springs 14, interleaved springs 34, or shoulder point springs 50, and are fabricated on the substrate 16, typically using thin-film or MEMS processing methods, to achieve low manufacturing cost, well controlled uniformity, very fine pad pitches 20, and large pin counts. In some embodiments, the flexible connections 119,128 are built in compliance to photolithographic springs, such as described above, or as disclosed in either U.S. Pat. Nos. 5,848,685 or 5,613,861, which are incorporated herein by reference.

The configuration shown in FIG. 15 brings power through the switchable power modules 100, and input/output signals 148 (FIG. 22, FIG. 23) from the pin electronics card 94 to the system board 82. This configuration has the advantage of reducing routing congestion in the flex circuit or membrane 90.

The structure of the interface assembly 78a provides very short electrical distances between the probe tips 61a-61n and the controlled impedance environment in the system board 82, which allows the interface assembly 78a to be used for high frequency applications. For embodiments wherein the traces on one or both surfaces 62a,62b of the substrate 16 are required to be impedance controlled, one or more conductive reference planes may be added within the substrate 16, either on top of the traces, below the traces, or both above and below the traces. For ultra high-frequency applications, the substrate 16 may contain alternating ground reference traces, which are connected to the one or two reference planes 58a, 58b (FIG. 13) at regular intervals using vias 65a,65b (FIG. 13), to effectively provide a shielded coaxial transmission line environment 63.

FIG. 18 is an expanded layer plan view of a wafer 104, a circular substrate 16, and a rectangular system board 82. For substrates 16 which are preferably comprised of silicon (which may be preferably chosen to match the thermal coefficient of expansion (TCE) of a wafer 104), the silicon substrate 16 may preferably be fabricated by a similar process to that of a wafer 104, such that the substrate 16 may be fabricated from a circular wafer substrate 16.

FIG. 19 is an expanded layer plan view of a wafer 104, a plurality of rectangular substrates 16a, 16b, 16c and 16d, and a rectangular system board 82. For substrates which are preferably comprised of ceramic materials, the silicon substrate 16 may preferably be fabricated from one or more rectangular ceramic substrates 16a, 16b, 16c and 16d. Any of the substrates 16, 16a-16b may include a travel limit mechanism, such as one or more upper standoffs 133 located on the connector surface of the substrate 16, such as to limit perpendicular travel of the substrate in relation to the system board 82.

As seen in FIG. 18 and FIG. 19, devices 44, each having a plurality of pads 47, are formed on a wafer 104, and are typically populated across the wafer 104 by a series of rows 137 and columns 139, wherein saw streets are located between the rows 137 and columns 139. As can be seen in the system board 82 in FIG. 18 and FIG. 19, the electrically conductive connections 128a-128n, which are located on the upper surface of the system board 82, are typically arranged within one or more connection regions 132, to connect to flex circuit contactors 119 (FIG. 17), which are preferably arranged within a similar number of one or more pad matrices 88 (FIG. 16).

In some preferred embodiments of the massively parallel interface assembly 78, each of the test electronics modules 92 (e.g. 92a) is identical to the other test electronics modules (e.g. 92b-92k), thereby having an identical number of test componentry (thereby having an identical test capacity). In some embodiments of the massively parallel interface assembly 78, a similar number of devices 44 is routed to each test electronics modules 92a-92k.

In alternate embodiments of the massively parallel interface assembly 78, a different number of devices 44 may routed to a test electronics module 92 (e.g. 92a), such as for outer columns 139 of devices under test 44 on a specific wafer 106. For a plurality of standardized test electronics modules 92a-92k having an identical number of test componentry, a test electronics module 92 which has a greater capacity than the number of devices 44 which are connected may still be used, typically through programming the test electronics module 92 to bypass testing for unused test circuitry 94, or through system control 230.

FIG. 20 is a partial cross-sectional view of one embodiment of the flexible circuit structure 142a, having a polyamide layer 144a, and opposing conductive layers 146a and 146b. FIG. 21 is a partial cross-sectional view of an alternate embodiment of the flexible circuit 90, which comprises a dielectric flex circuit membrane structure 142b, and opposing conductive layers 146a and 146b. In some embodiments of the flex circuit 90, the flex circuit membrane structure 142 is inherently flexible. In alternate embodiments of the flex circuit 90, the flex circuit structure 142 is rigid in regions where one or both conductive layers are substantially located. The controlled removal of the conductive layers 146a,146b produces controlled flexibility for the flex circuit 90, while providing regions of formed conductive paths.

FIG. 22 is a partial perspective view of a flexible membrane circuit structure, wherein a flexible region 90a is defined on the test card structure 94a. FIG. 23 is a partial perspective view of an alternate flexible circuit structure, wherein a flexible circuit 90b is attached to a test card structure 94b by attachments 150 (e.g. such as but not limited to fasteners, heat staking, microwelding, or adhesives).

The test electronics 94a,94b populated on each of the test electronics modules 92a-92k provide stimulus and response detection for one or more devices under test 44. The test electronics 94a,94b are built on a high density interconnect (HDI) substrate 142a,142b, or on a standard printed wiring board 94a, which is connected to the flexible circuit 90. The test electronic card 94a,94b is populated with control and response electronics (e.g. such as test electronics 240 in FIG. 35). Each test electronics module 92 (e.g. 92a) is connected to the backend electronics and computer interface links 96 (e.g. typically by parallel or serial links). Alternatively, the signal pins in the tester electronics modules 92a-92k can be connected serially, on a daisy chain, to simplify the electrical connections, such as to external test hardware. Test vector and setup information is sent to the pin electronics, from a system computer 202 and control electronics (e.g. such as external pattern generator 246 in FIG. 35), through the links 96.

Within each of the test electronics modules 92a-92k, a test electronics card 94, is connected to the flex circuit/membrane 90. Test electronics cards 94 may preferably be fabricated as an integral structure with the flexible circuit 90, such as on an etched thin film substrate, whereby portions of the substrate are etched, to create the flexible membrane circuit 90. In an alternate embodiment of the test electronics module, a separate test electronics card substrate 94 is connected to a flex circuit, typically by solder, wire bond or connectors.

FIG. 24 is a partial cross-sectional view of one embodiment of the flex circuit region 90 of a test electronic module 92, which preferably includes a thermally conductive pathway 154 across a flex circuit 90 between a power control module 100 and one or more buss bars 98. Each of the buss bars 98a-98h, which are typically separately electrically connected to a plurality of external power supplies 234a-234h (FIG. 35), are typically electrically isolated from each other by insulators 152. The insulators 152 may be a separate layer from the buss bars 98a-98h, or may alternately be an electrically insulative layer 152 on the buss bars 98a-98h.

FIG. 25 is a partial cross-sectional view of an alternate embodiment of the flex circuit region 90 of a test electronic module 92, in which one or more power control modules 100a-100h are mounted on the inner surface of the flex circuit 90, and are positioned in thermal contact with a plurality of buss bars 98a-98h.

FIG. 26 is a partial cross-sectional view of a second alternate embodiment of the flex circuit region 90 of a test electronic module 92, in which a power control module 100 is electrically connected to the outer surface of a flex circuit 100. A power control access region 158 is preferably defined through the flex circuit region 90, whereby the power control module 100 positioned in intimate thermal contact with a buss bar 98 (e.g. such as buss bar 98b).

One or more power and ground bus bars 98a-98h are used to distribute power to all the devices under test 44. Power control modules 100, typically comprising de-coupling capacitors, switching control circuits and regulators for each device under test 44, are preferably mounted on the flex circuit 90 as shown in FIG. 24, FIG. 25, or FIG. 26.

While some preferred embodiments of the test electronics modules 92a-92k include flex circuit structures 90, the unique interface structure provided by the flex circuit structure 90 may alternately be achieved by other suitable interface designs. FIG. 27 is a perspective view of one alternate embodiment of a test electronics module 92, in which an integrated module base 157 provides a pad matrix 88 of electrical contacts 119 on a pad matrix planar region 158. One or more power control modules 100 are electrically connected to electrical contacts 119 located the pad matrix, through power control module (PCM) traces 149, and to one or more buss bars 98a-98h. The power control modules 100 are also preferably positioned in thermal contact with one or more buss bars 98a-98h. Signal traces 148 are also connected to electrical contacts 119 located the pad matrix 88. The signal traces 148 extend across a link and component planar region 159, and are either connected to test electronics 94, or extend to link 96.

In the various embodiments of the test electronics modules 92, one or more bus bars 98 provide the power and heat sink paths for the power control modules 100. Power for devices under test 44 is typically provided through separate rail buss bars 98, or may alternately share the same rail buss bars 98 with the power control modules 100. The power rail buss bars 98 also preferably provide mechanical support for the flex circuit 90 and the system board 82 and/or the test electronics cards 94a-94k. In some embodiments of the test electronics modules 92a-92k, the power control module circuits 100 are connected in the serial scan path, to provide individual power and ground control to the devices under test 44.

Alternate Massively Parallel Test Assemblies. FIG. 28 is a partial cutaway assembly view of an alternate massively parallel test assembly 78b having an intermediate system board 82, in which flexible spring probes 160 are located on the lower surface 139b (FIG. 17) of the system board 82. The structure and features of the massively parallel test assembly 78b are otherwise identical to the massively parallel test assembly 78a shown in FIG. 15. The system board spring probes 160, in conjunction with the electrically conductive connections 64a-64n on the substrate 16, provide planarity compliance between the system board 82 and the substrate 16, and provide high quality electrical connections, over a wide range of temperatures.

FIG. 29 is a partial cross-sectional view of an alternate interface assembly 78c, wherein a large grid array (LGA) interposer connector 162 is located between the substrate 16 and the system board 82. The LGA interposer connector 162 provides a plurality of conductors 164a-164n between the electrical connections 64a-64n on the substrate 16 and plurality of conductive pads 84a-84n on the lower surface of the system board 82. In one embodiment, the LGA interposer connector 162 is an AMPIFLEX™ connector, manufactured by AMP, Inc., of Harrisburg Pa. In another embodiment, the interposer connector 162 is a GOREMATE™ connector, manufactured by W. L. Gore and Associates, Inc., of Eau Clare, Wis. In another alternate embodiment, a pogo pin interposer 162 is used to connect opposing conductive pads 84a-84n on the system board 82 to electrical connections 64a-64n on the substrate 16.

FIG. 30 is a partial cutaway assembly view of a basic massively parallel test assembly 78d, in which a substrate 16 having spring probes 61a-61n is directly connected to the test electronics modules 92a-92k. FIG. 31 is a partial expanded cross-sectional view 166 of the basic massively parallel test assembly 78d, which shows staged pitch and distribution across a substrate 16 and a test electronics module 92 having a pad matrix 88 of electrical contactors 119.

FIG. 32 is a partial cross sectional view 170 of an alternate massively parallel interface assembly 178e, which shows one embodiment of a basic clamping structure 172. The interface assembly 178e is typically intended for burn-in testing only, whereby test electronics 94 are packaged in small modules 174. The modules 174 are mounted directly onto the system board 82, and are preferably used for burn-in testing, which typically requires significantly less test electronics than the test electronics modules 92a-92k (e.g. such as shown in FIG. 15). The clamping structure 172 shown in FIG. 32 may also be used for the wafer level massively parallel interface assemblies 178a-178d.

The interposer substrate 16 is preferably fabricated from a thin substrate 16, such as a 10 mil thick glass plate, whereby the substrate 16 may flex slightly, to conform to the surface of a wafer under test, to accommodate for non-planarity or bowing between the wafer 134 and the interposer substrate 16.

A seal 180 around the periphery of the interposer substrate 16 preferably provides an air-tight chamber 182. Air pressure is preferably applied between the system board 82 and the interposer substrate 16. An applied pressure 184 also thermally isolates the DUT wafer 104 from the test electronics 174,94. While DUT wafers 104 are typically required to operate at elevated temperatures during burn-in testing (e.g. such as at 125-160 degrees Celsius), the test electronics 94 should preferably operate at a lower temperature (e.g. such as below 75 degrees Celsius).

Figure 35:
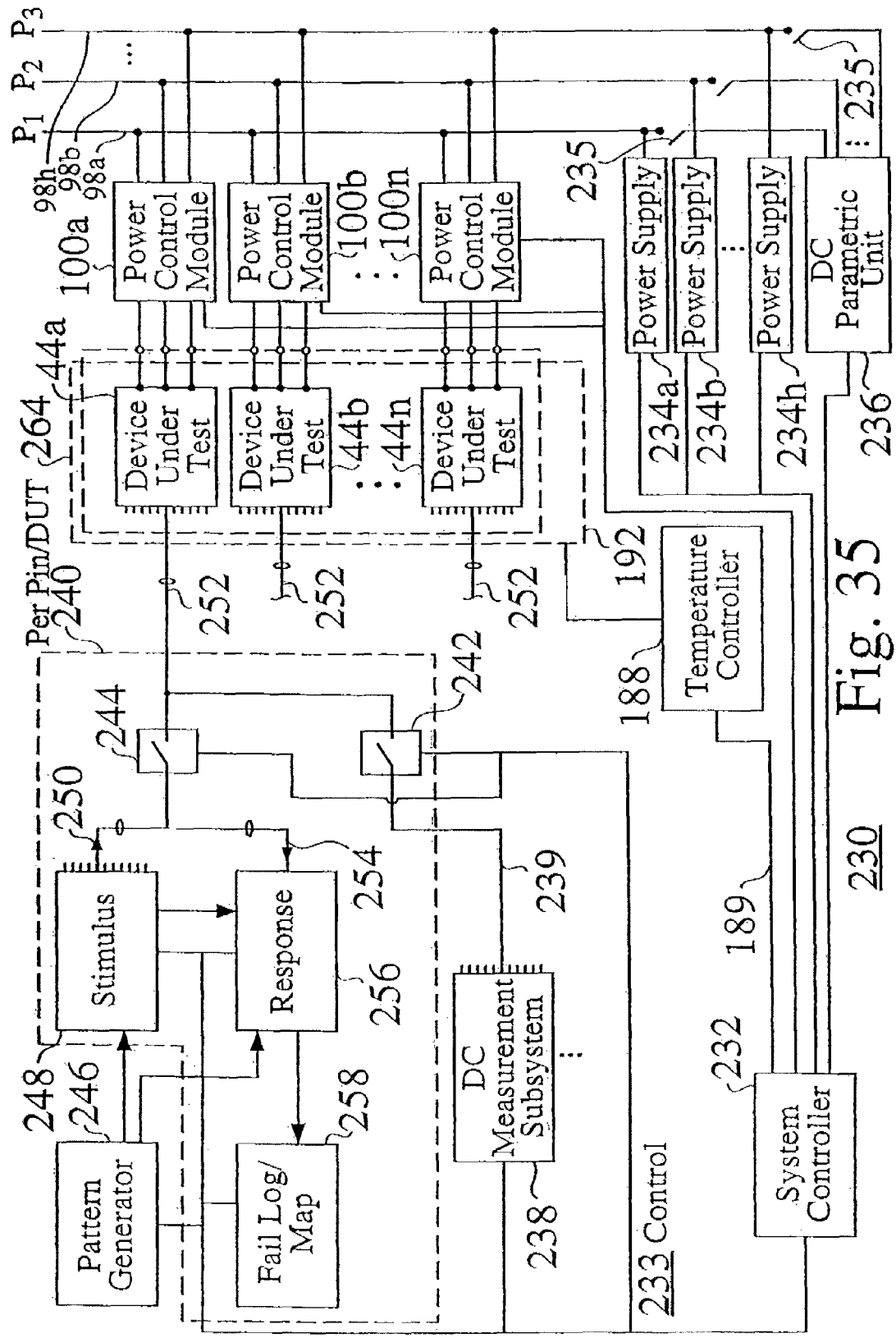
FIG. 35 is a partial schematic block diagram of test circuitry for the massively parallel test system.

The wafer chuck 106 preferably includes a wafer thermal control system 192, which preferably comprises a wafer heating system 194 and/or a wafer cooling system 196, such as to provide temperature control to the wafer under test 104. The wafer thermal control system 192 is preferably controlled by a test system temperature controller 188, which is typically linked 189 to the system controller 232 (FIG. 35).

The test electronics 174,94 are preferably located in one or more cooling chambers 176. A cooling system 190 is preferably used to control the operating temperature of the test electronics 174,94 within the cooling chambers 176, and is also preferably controlled by the test system temperature controller 188.

A wafer loading vacuum circuit 186, having vacuum tracks 208 (FIG. 33), is preferably built into the wafer chuck 106, to provide vacuum suction to hold the wafer under test (DUT) 104 in position, and to improve planarity between the substrate connector 16 and the wafer under test 104.

Test System Architecture. The test system consists of an alignment set up, which performs wafer alignment, cooling unit, and tester electronics: The alignment subsystem and cooling units can be built with technology known in the art.

Figure 33:
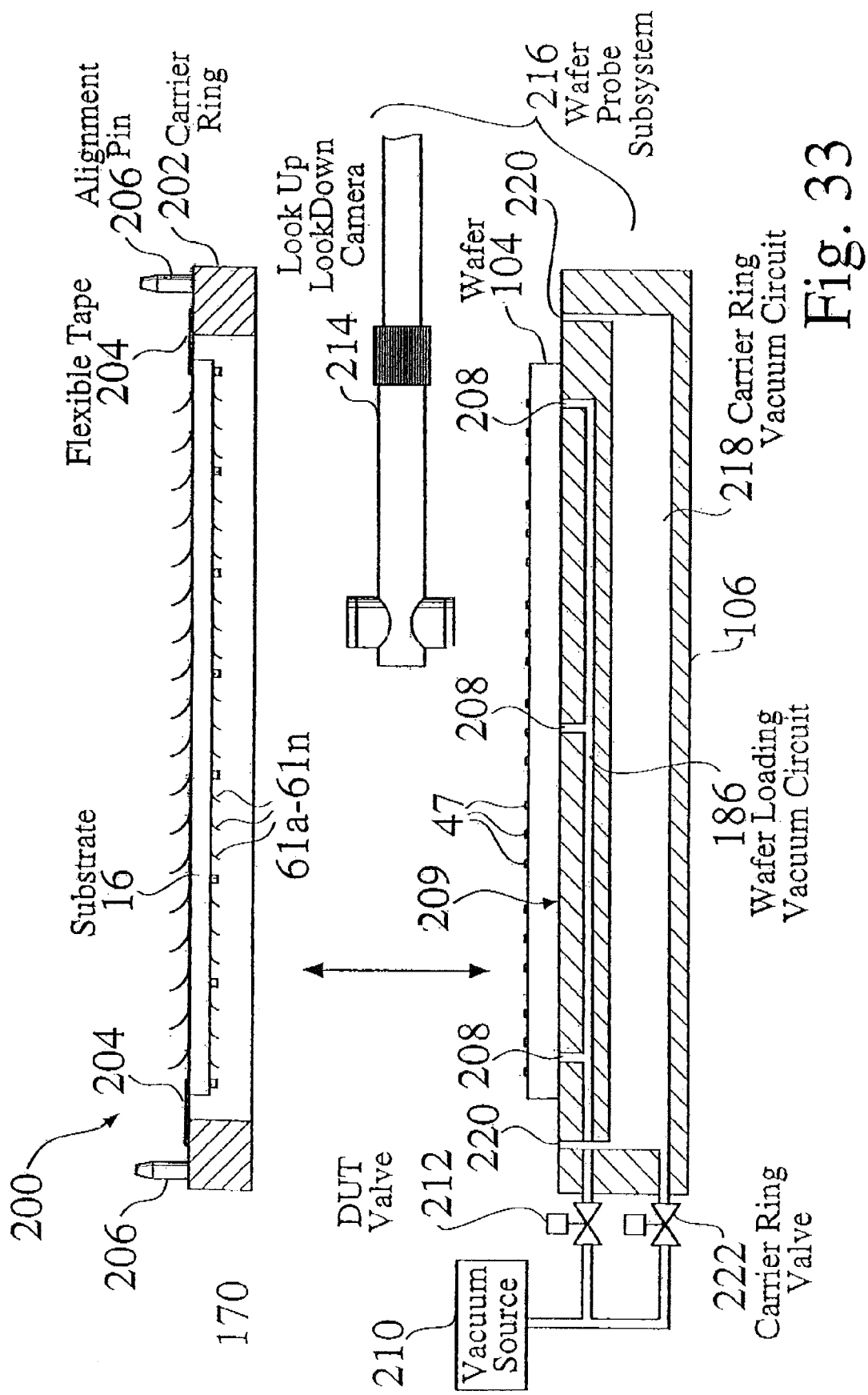
FIG. 33 is a first partial expanded cross-sectional view showing massively parallel test assembly and alignment hardware and procedures.
Figure 34:
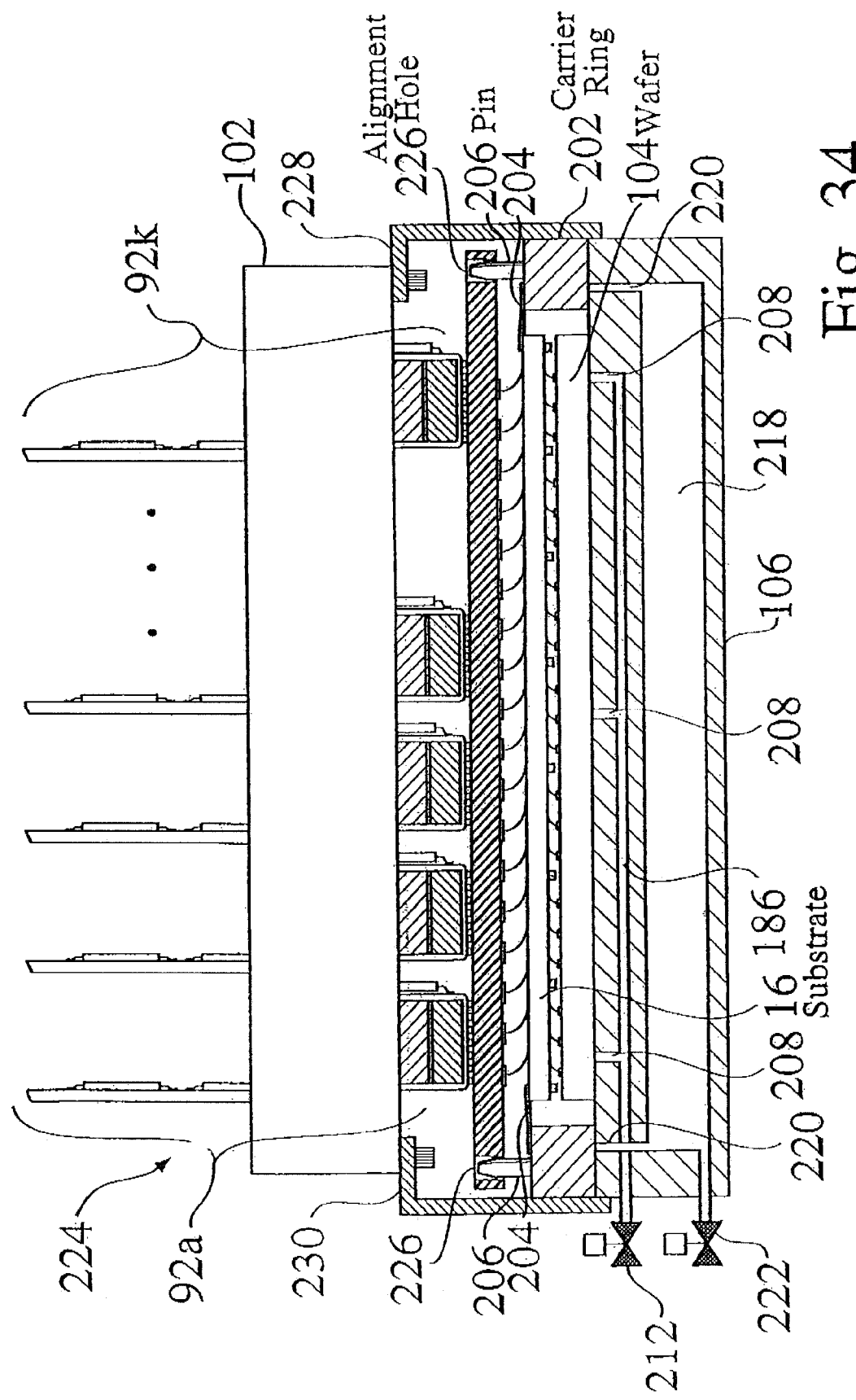
FIG. 34 is a second partial expanded cross-sectional view showing massively parallel test assembly and alignment hardware and procedures.

System Alignment. FIG. 33 is a first partial expanded cross-sectional view showing massively parallel test assembly 200 and alignment hardware and procedures. The test assembly 200 includes a carrier ring 202, which preferably includes one or more alignment features, such as alignment pins 206, whereby the carrier ring 202 may be aligned to a system board 82. The system board 82 preferably has mating alignment features, such as alignment holes 226 (FIG. 34).

A substrate 16 is releaseably mounted to a carrier ring 202, such as by a flexible tape 204 (e.g. such as a ring-shaped KAPTON™ tape), whereby the electrical connections 64a-64n (e.g. such as seen in FIG. 31) on the connector surface 62b of the substrate 16 are aligned to the alignment pins 206, such that the electrical connections 64a-64n on the connector surface 62b of the substrate 16 may be aligned to the conductive pads 84a-84n (FIG. 17) on the lower surface of the system board 82.

The wafer chuck 106 preferably includes a wafer loading vacuum circuit 186, having one or more wafer loading holes 208 on a wafer loading surface 209. The wafer loading vacuum circuit 186 is connectable to a vacuum source 210, and may be sealed by wafer loading vacuum circuit valve 212. A wafer to be tested 104 is placed onto the wafer chuck 106, and is held in place by a applied vacuum applied through the wafer loading holes 208.

A substrate 16, mounted on a carrier ring 202, which is to be mounted to the wafer chuck 106, is controllably positioned over the wafer 104, which is held in place by vacuum applied to the wafer chuck 106. The substrate 16 and the wafer to be tested 104 are then accurately aligned, such as by a lookup/lookdown camera 214 within a modified wafer probe system 216, whereby the probe springs 61a-61n on the probe surface 62a (FIG. 17) of the substrate 16 are brought into alignment with the die pads 47 on the DUT wafer 104. Alignment is typically achieved, either by looking at spring tips 24 (FIG. 2), or at alignment marks 77 (FIG. 14) printed on the substrate 16. The wafer chuck 106 also preferably includes a carrier ring vacuum circuit 218, having one or more carrier ring vacuum holes 220. The carrier ring vacuum circuit 218 is also connectable to a vacuum source 210, and may be sealed by carrier ring vacuum circuit valve 222. Once the substrate 16 and the wafer to be tested 104 are accurately aligned, the lookup/lookdown camera 214 is removed, and the carrier ring 202 is controllably moved onto the wafer chuck 104, whereby the substrate 16 is accurately positioned over the wafer 16, such that the probe springs 61a-61n on the probe surface 62a of the substrate 16 contact the die pads 47 on the DUT wafer 104. The carrier ring 202 is held in place by a vacuum applied through the carrier ring vacuum holes 220.

The wafer loading vacuum circuit valve 212 and the carrier ring vacuum circuit valve 222 are then closed, such that the applied vacuum to the wafer loading vacuum circuit 206 and the carrier ring vacuum circuit 218 is maintained, while the entire test assembly can be handled as a unit, for mounting to the system board 82 and test electronics modules 92a-92k. In alternate embodiments of the wafer loading vacuum circuit 206 and the carrier ring vacuum circuit 218, a single valve is used to apply a sealable vacuum to both vacuum circuits 206,218. To enhance the vacuum sustaining ability after the vacuum circuit valves 212 and 222 are closed, each circuit 206,218 preferably includes a vacuum chamber, which serves to maintain the vacuum level over time.

FIG. 34 is a second partial expanded cross-sectional view showing massively parallel test assembly and alignment hardware and procedures 224, whereby a massively parallel interface test assembly 78 may be assembled into a system which may then be used for wafer testing. As described above, the system board 82 preferably includes a means for alignment 226 to the carrier ring and/or to the wafer chuck 106, such as alignment holes 226. The system board 82, which is mounted to the test electronics modules 92a-92k and the frame 102, is then positioned over the carrier ring 202, such that the alignment pins 206 engage the alignment holes 226. A means for attachment 228 is then typically provided, such as between the frame 102 and the wafer chuck 106 or the carrier ring 202, thus completing the assembly structure.

While accurate means (e.g. such as optical alignment) is typically used to align the fine pitch probe springs 61a-61n to the fine pitch pads 47 on the wafer to be tested, the mechanical alignment provided between the carrier ring 202 and the system board 82 (e.g. such as between alignment pins 206 and holes 226) is typically sufficient for the distributed electrical connections 64a-64n and pads 84a-84n, which preferably have larger features, and preferably have coarser pitches 122, 124, respectively. As well, the flex circuit pitch 134 on the pad matrix is relatively large (e.g. on the order of 1 mm), making alignment between the test electronics modules 92a-92k and the system card 82 relatively easy using similar conventional mechanical alignment techniques.

Tester Electronics. FIG. 35 is a partial schematic block diagram of test circuitry 230 for the massively parallel interface test systems 78. The tester electronics 230 consists of but not limited to a control computer 232, a power subsystem, test electronics modules 92a-92k, DC parametric and measurement systems 236,238, and control electronics.

As seen in FIG. 35, a test electronics module 92 is typically connected to a group 264 of one or more devices to be tested 44 on a wafer 104 (e.g. such as but not limited to a column 139 of devices under test 44).

The test electronics modules 92a-92k each provide stimulus signals 250 to the device under test (DUT) 44, monitor the responses 254, and store the device under test pass or fail information 258 within the tester memory, or transfer the device under test pass or fail information 258 to the system controller 232.

For example, in memory testing, a test electronics module 92 has all the critical functions of a memory tester. This includes the hardware pattern generator 246 to drive the memory devices under test 44 connected to the same test electronics module 92, in parallel. Response detection and fail detection circuits in the test electronics module 92 records the fail locations for each device under test 44, as needed.

The test electronics modules 92 are preferably software re-configurable and programmable, making it possible to configure the test electronics modules 92 for a specific DUT design or test function. A built-in self-test (BIST) engine can also be integrated into the test electronics modules 92, such as to provide additional test features.

Each test electronics module 92 also provides analog multiplexing functions, to route the intended DUT pin 47 to the digital test electronics in the test electronics module 92, or to one or more DC measurement subsystems 238, which perform analog measurements of the output signals 254.

Sample Test Sequence. After a wafer to be tested 104 loaded, aligned, and engaged, the system controller 232 sends a control signal to all the power control modules 100, to connect all power and ground pins 47 for a device under test (DUT) 44 to ground, except for a selected pin 47 to be tested, which is controllably connected to the DC parametric unit 236. The power supplies 234a-234h are disconnected from the power buses 98a-98h. The power pin integrity of the selected device 44 is then determined, through the DC parametric unit 236.

The DC parametric unit 236, which is connected to the power rails 98a-98h, via relay or solid state switches 235, is then programmed, to check for power to ground shorts. The same sequence is repeated for every power pin on every device under test 44. Similar testing is performed on the DUT input and output pins 47, through the test electronics card 94, to determine short circuits and open circuits for a selected device under test 44. An open connection for a device under test 44 is typically detected by the absence of a parasitic diode in the input and output pins 47 of the device under test 44, as is commonly practiced in the art.

Upon the completion of setup testing, the integrity of the connections and the status of each device pin 47 is determined, in regard to open or short circuits. An excessive number of measured open circuits for one or more devices under test 44 on a wafer 104 may be due to a defective wafer 104, to system setup, or to one or more defective devices under test 44.

The test circuitry 230 preferably provides diagnostic capabilities, to further diagnose faults. Shorts can be isolated from the power busses 98 and pin test electronics 94, by scanning the appropriate bit control pattern into the power control module 100 and pin test electronics module 92.

The remaining devices to be tested 44 can then be powered up, and tested in parallel. Short circuit detection and report circuitry is preferably built into each power control module 100, such that a particular device under test 44 may be disconnected, if a short circuit is developed in the device under test while the device 44 is tested. Other features, such as but not limited to transient device current testing circuitry, may preferably be included within the power control module 100, such as to provide additional test coverage.

Power Pin Testing. The system controller 232 selectively switches on the power connections to one or more devices under test 44. With the power supplies 234a-234h turned off (disconnected), a device under test 44 can be tested for open circuits and short circuits, using the DC parametric unit 236.

I/O Pin Testing. Similarly, the input and output pins 47 on a device under test 44 can be tested for leakage, open, shorts, through the system controller 232.

Device Functional Testing. With test results from power pin testing and I/O Pin Testing, for any devices under test 44 which have failed (e.g. due to power), the input and output pins 47 for the failed devices 44 are typically isolated from the tester common resources. The remaining devices under test 44 which have passed power pin testing and I/O pin testing are then powered up, and may then be tested in parallel.

Functional Testing. The stimulus unit 248 and pattern generator 246 generate the input pattern 250 to the device under test 44. The DUT response 254 is captured in the response block 256, which compares the device under test 44 output with the expected value from the pattern generator 246 or stimulus unit 248. A pattern generator 246 is commonly used in memory testing, whereas a truth table representing the device stimulus 250 and expected response 254 can be stored in the pattern memory of the stimulus unit 248 for logic device testing. A fail map or log 258 is maintained for each die 44. While FIG. 35 portrays one embodiment of the functional schematic of the pattern generation and stimulus/response system architecture, other pattern generation and stimulus/response system architectures may suitably be used to meet the testing requirements of a device under test 44, as is commonly practiced in the art.

Figure 36:
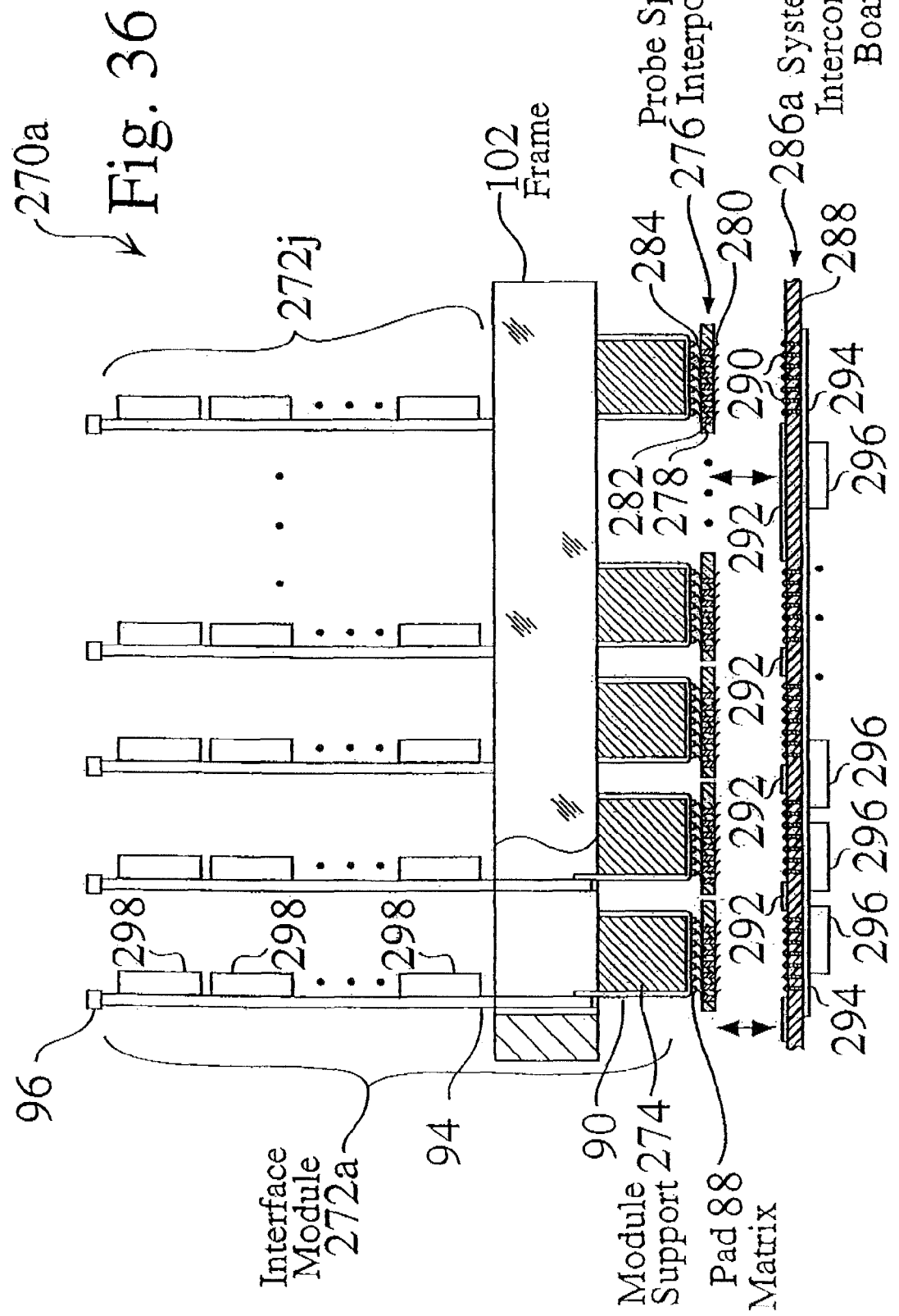
FIG. 36 is a partial cutaway assembly view of a massively parallel interface assembly, in which a plurality of interface modules are connected, through a plurality of probe spring interposers and a system interconnect board structure.

Alternate Interface Embodiments. FIG. 36 is a partial cutaway assembly view of a massively parallel interface assembly 270a, in which a plurality of interface modules 272a-272j are electrically connected to a system interconnect board 286a. Each of the interface modules 272 (e.g. such as 272a) includes a pad matrix 88 of electrical conductors 119, which are each electrically connected to a probe spring interposer 276.

Each of the probe spring interposer 276 includes lower surface spring probes 280, electrically connected to upper surface spring probes 284 by vias 282. As described above, the lower surface spring probes 280, as well as the upper surface spring probes 284, may have a variety of tip geometries, such as single point springs 14, interleaved springs 34, or shoulder point springs 50, and are fabricated on the substrate 16, typically using thin-film or MEMS processing methods, to achieve low manufacturing cost, well controlled uniformity, very fine pad pitches 20, and large pin counts. In some embodiments, the flexible connections lower surface spring probes 280 and/or the upper surface spring probes 284 are built in compliance to photolithographic springs, such as described above, or as disclosed in either U.S. Pat. Nos. 5,848,685 or 5,613,861, which are incorporated herein by reference.

The probe spring interposers 276 are provide electrical connections between each of the interface modules 272a-272j and the system interconnect board 286a. The system interconnect board 286a has upper surface electrical contactors 290, vias 291, upper surface interconnection structures 292 and lower surface interconnection structures 292 294, such that one or more pads one each interface modules 272 may typically be connected together. The system interconnect board 286a may also preferably include board electrical componentry, which may be electrically connected to one or more of the interface modules 272. Each of the interface modules 272 includes links 96 which provide electrical connections to the system interconnect board 286a, and may also preferably include interface module circuitry 298.

Figure 37:
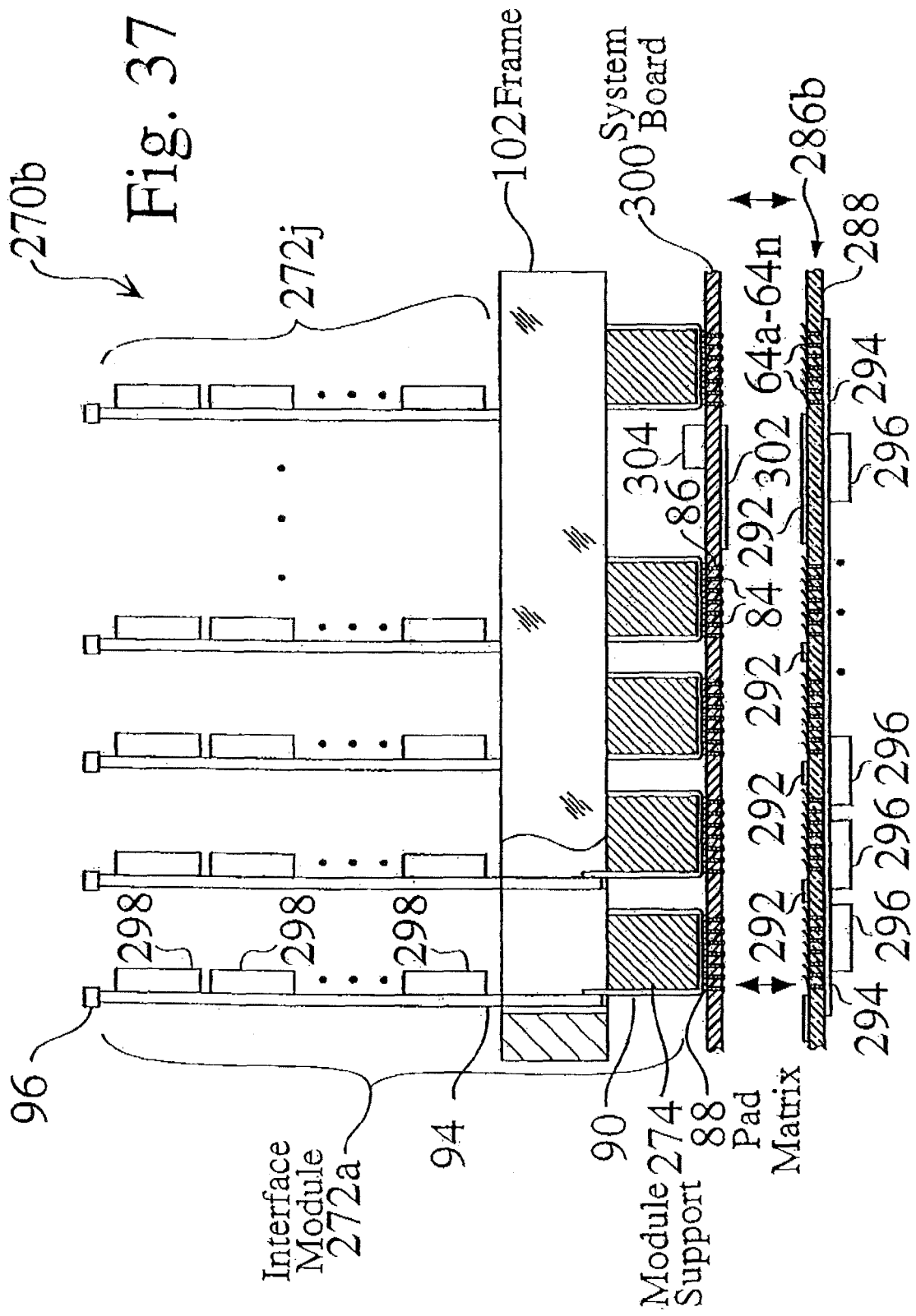
FIG. 37 is a partial cutaway assembly view of an alternate massively parallel interface assembly, in which a plurality of interface modules are connected through a system board and a system interconnect board structure.

FIG. 37 is a partial cutaway assembly view of an alternate massively parallel interface assembly 270b, in which a plurality of interface modules 272a-272j are electrically connected, through a system board interposer 300 to a system interconnect board 286b, which includes flexible probe spring 64a-64n, as described above. The system board interposer 300 may preferably include interconnection structures 302 and/or board electrical componentry 304, which may be electrically connected to one or more of the interface modules 272.

The massively parallel interface assemblies 270a,270b each provide a versatile and robust interface between a plurality of interconnected structures. The massively parallel interface assembly 270a may simply be used to provide a robust massively parallel interface (such as to provide complex parallel connections between similar components). In preferred interface embodiments, the massively parallel interface assemblies 270a,270b may also include module specific electronic circuitry 298, or shared circuitry 296.

Figure 38:
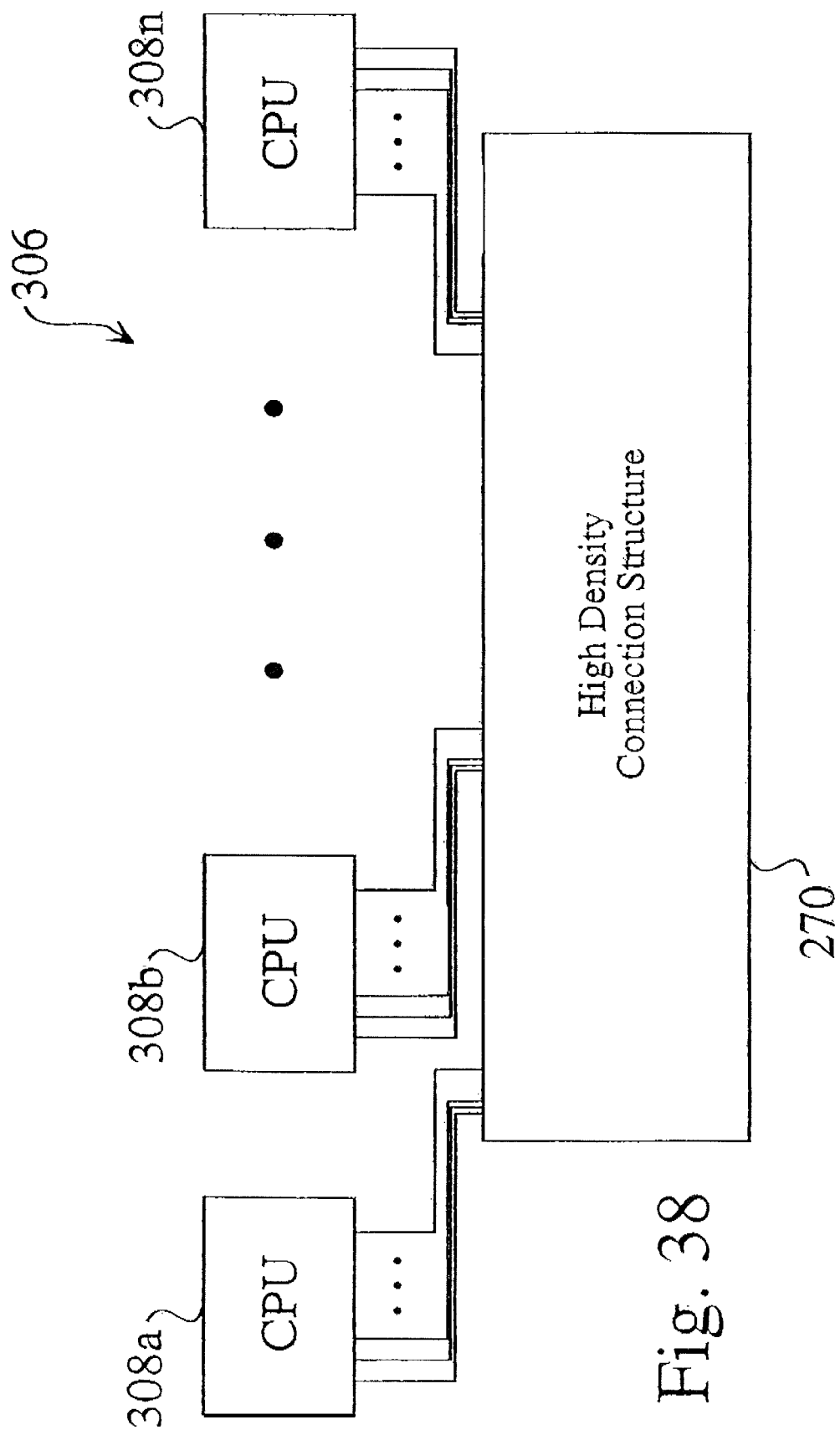
FIG. 38 is a schematic block diagram of connections between a plurality of computer systems, using a massively parallel interface assembly.

FIG. 38 is a schematic block diagram 306 of connections between a plurality of computer systems 308a-308n, using a massively parallel interface assembly 270. FIG. 39 is a schematic block diagram 310 of connections between a plurality of electronic circuits 312a-312n, using a massively parallel interface assembly 270.

System Advantages. The massively parallel interface assemblies 78a-78d provide signal and power interconnections between a test system and a large number of devices 44 located on a wafer 104, while providing planarity compliance between the wafer 104 and successive assembly layers (e.g. such as substrate 16, system board 82, and the pad matrices 88 on the test electronics modules 92a-92k.

As well, the massively parallel interface assemblies 78a-78d provide short electrical paths for the power and input and output signals, between the test electronics modules 92a-92k and the devices under test 44, through the combined use of high pitch spring probe tips 61a-61n, layered substrates 16,82, and the vertically packaged test electronics modules 92a-92k, which typically include flex circuits 90.

Furthermore, while the massively parallel interface assemblies 78a-78d provide short electrical paths for the power and input and output signals, between the test electronics modules 92a-92k and the devices under test 44 (thereby reducing round trip transit time), the massively parallel interface assemblies 78a-78d provide thermal isolation between the test electronics 94 and the devices under test 44, while providing a uniform force across all mating spring probe 61/pad 47 pairs over the entire wafer 104, such that the devices under test 44 may be controllably operated over a wide temperature range, while the test electronics modules 92a-92k provide enhanced heat transfer away from heat sensitive components (e.g. such as through buss bars 98a-98h), and while preferably providing enhanced test module temperature control.

As well, while the devices under test 44 may be controllably operated over a wide temperature range, the massively parallel test interface structure 78a-78c preferably provides provide signal and power interconnections between a test system and a large number of devices 44 located on a wafer 104, which are maintained over the temperature range, through the use of suitably sized, coarse pitch 122,124 interconnections between substrate 16 and the system board 82 (which maintains electrical contact between the coarse pitch 122,124 interconnections 64a-64n over the temperature range), and through the specified use of a substrate 16 having a similar coefficient of thermal expansion to the wafer under test 104 (which maintains electrical contact between the fine pitch 20 interconnections 61a-61n over the temperature range).

As described above, the massively parallel test interface assemblies 78 may be used to detect power to ground shorts in any die quickly, and to isolate power from a die having a detected power to ground short before damage is done to the test electronics. In addition, the massively parallel test interface assemblies 78 and related test system may be used to detect that the contacts to many, hundreds, or even hundreds of thousands of pads are reliably made and whether each of the contacts are within the contact resistance specification, and to assure that the self inductance and self capacitance of each signal line are below values that would adversely affect test signal integrity.

Furthermore, the massively parallel test interface assemblies 78 and related test system can be used to detect whether the mutual inductance and mutual capacitance between pairs of signal lines and between signal lines and power or ground lines are below values that would adversely affect test signal integrity.

As well, the massively parallel test interface assemblies 78 provide stimulus and response detection and analysis to many, hundreds, or even thousands, of die under test in parallel, and which preferably provides diagnostic tests to a failed die, in parallel with the continued testing of all other die.

In addition, the massively parallel test interface assemblies 78 can reliably and repeatedly establish contact to many, hundreds, or even hundreds of thousands of pads 47, without the need to periodically stop and inspect and/or clean the probe interface structure 16.

Furthermore, the massively parallel test interface assemblies 78 inherently organize and manage the interconnections between the devices under test 44 and the tester electronics 230, while maintaining signal integrity and power and ground stability, and assures that no two or more adjacent pads 47 are contacted by a single test probe tip.

Although the disclosed massively parallel interface assemblies are described herein in connection with integrated circuit testing, computer networking, and circuit connections, the assemblies and techniques can be implemented with a wide variety devices and circuits, such as interconnections between integrated circuits and substrates within electronic components or devices, burn-in devices and MEMS devices, or any combination thereof, as desired.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

The invention claimed is:

1. A method, comprising the steps of:
providing an interface assembly comprising at least one test electronics module to make electrical connections with a test apparatus;
configuring a first side of a probe card assembly to make electrical connections with said test electronics modules;
configuring a plurality of probes on a second side of said probe card assembly to make electrical connections with at least one semiconductor device; and
configuring test electronics to receive as input signals received from any of said test apparatus and said semiconductor device, process said received signals there within, and output said processed received signals, at least a portion of said test electronics being disposed on said test electronics modules,
wherein said test electronics comprise any of passive components, active components, and combinations thereof.

2. The method of claim 1, wherein said test electronics comprise any of a power control module, a decoupling capacitor, a switching control circuit, a regulator, a controller, a pattern generator, a signal measurement circuit, a response detection circuit, a fail detection circuit, means for storing any of pass/fail information, a relay, a switch, means for determining any of a short circuit and an open circuit, means for testing any of a power pin and an I/O pin of said semiconductor device, and means for functional testing of said semiconductor device.

3. The method of claim 1, wherein at least a portion of said test electronics module is disposed substantially coplanar to said probe card assembly.

4. The method of claim 1, wherein said interface assembly further comprises a system board configured between said at least one test electronics module and a substrate.

5. The method of claim 4, wherein said interface assembly further comprises an interposer configured any of or both of between said system board and said substrate and between said test electronics module and said system board.

6. The method of claim 1, wherein said interface assembly comprises a plurality of said test electronics modules.

7. The method of claim 6, wherein each of said plurality of test electronics modules are disposed parallel to each other.

8. The method of claim 1, wherein said test electronics process at least a portion of said signals for testing of said semiconductor device.

9. The method of claim 1, wherein at least a portion of said signals comprise response signals generated by said semiconductor device, and
wherein said test electronics process at least a portion of said generated response signals.

10. The method of claim 1, wherein at least a portion of said signals are test signals generated by said test apparatus, and
wherein said test electronics process at least a portion of said generated test signals.

11. The method of claim 1, wherein said plurality of probes are configured to contact a plurality of semiconductor devices under test.

12. The method of claim 1, wherein said probe card assembly comprises a probe card substrate and a plurality of electrically conductive vias extending therethrough.

13. A probe card assembly, comprising;
an interface assembly comprising at least one test electronics module for making electrical connections with a test apparatus;
a substrate having a first side and a second side opposite said first side, said substrate further comprising electrical contacts that are electrically connected to said test electronics modules and extend from said first side to probes located on and extending from said second side, said probes configured to electrically contact at least one semiconductor device; and
test electronics configured to receive as input signals received from any of said test apparatus and said semiconductor device, process said received signals there within, and output said processed received signals, at least a portion of said test electronics being located on said test electronics modules
wherein said test electronics comprise any of passive components, active components, and combinations thereof.

14. The probe card assembly of claim 13, wherein said test electronics comprise any of a power control module, a decoupling capacitor, a switching control circuit, a regulator, a controller, a pattern generator, a signal measurement circuit, a response detection circuit, a fail detection circuit, means for storing any of pass/fail information, a relay, a switch, means for determining any of a short circuit and an open circuit, means for testing any of a power pin and an I/O pin of said semiconductor device, and means for functional testing of said semiconductor device.

15. The probe card assembly of claim 13, further comprising:
a system board configured between said at least one test electronics module and said substrate.

16. A probe card assembly, comprising;
an interface assembly comprising at least one test electronics module for making electrical connections with a test apparatus;
a substrate having a first side and a second side opposite said first side, said substrate further comprising electrical contacts that are electrically connected to said test electronics modules and extend from said first side to probes located on and extending from said second side, said probes configured to electrically contact at least one semiconductor device;
test electronics configured to receive as input signals received from any of said test apparatus and said semiconductor device, process said received signals there within, and output said processed received signals, at least a portion of said test electronics being located on said test electronics modules; and
an interposer configured any of or both of between said system board and said substrate and between said test electronics module and said system board.

* * * * *